US012227619B2

(12) United States Patent
Chen et al.

(10) Patent No.: US 12,227,619 B2
(45) Date of Patent: Feb. 18, 2025

(54) POLYIMIDE BASED COPOLYMER AND ELECTRONIC COMPONENT AND FIELD EFFECT TRANSISTOR COMPRISING THE SAME

(71) Applicant: National Taiwan University, Taipei (TW)

(72) Inventors: Wen-Chang Chen, Taipei (TW); Mitsuru Ueda, Taipei (TW); Chun-Kai Chen, Taipei (TW); Yan-Cheng Lin, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 827 days.

(21) Appl. No.: 17/345,687

(22) Filed: Jun. 11, 2021

(65) Prior Publication Data
US 2021/0395457 A1    Dec. 23, 2021

(30) Foreign Application Priority Data
Jun. 11, 2020   (TW) ................................ 109119682

(51) Int. Cl.
*C08G 73/10*    (2006.01)
*H01L 29/786*   (2006.01)

(52) U.S. Cl.
CPC ....... *C08G 73/1007* (2013.01); *C08G 73/105* (2013.01); *C08G 73/1064* (2013.01); *C08G 73/1085* (2013.01); *H01L 29/78603* (2013.01)

(58) Field of Classification Search
None
See application file for complete search history.

(56) References Cited

U.S. PATENT DOCUMENTS

2005/0145995 A1*  7/2005  Kobashi ............... H10K 77/111
                                                          257/642
2021/0395457 A1* 12/2021  Chen .................... C08G 73/105

FOREIGN PATENT DOCUMENTS

DE           19733882      *   2/1999

OTHER PUBLICATIONS

Niume, Thermal and Electrical Properties of Polyimides Containing Tricyclic Fused Rings; Polymer (1981) vol. 22 pp. 649-654. (Year: 1981).*
Hasegawa et al., "Superheat-resistant polymers with low coefficients of thermal expansion," Polymer, 111, (2017) 91-102 (12 pages).
Numata et al., "Re-examination of the relationship between packing coefficient and thermal expansion coefficient for aromatic polyimides," Polymer, 28(13), (1987), 2282-2288 (7 pages).
Ebisawa et al., "Spontaneous molecular orientation of polyimides induced by thermal imidization (5). Effect of ordered structure formation in polyimide precursors on CTE," European Polymer Journal, 46(2), (2010), 283-297 (15 pages).
Lian et al., "Synthesis of Superheat-Resistant Polyimides with High $T_g$ and Low Coefficient of Thermal Expansion by Introduction of Strong Intermolecular Interaction," Macromolecules, 51(24), (2018), 10127-10135 (9 pages).

* cited by examiner

*Primary Examiner* — David J Buttner
(74) *Attorney, Agent, or Firm* — Muncy, Geissler, Olds & Lowe, P.C.

(57) ABSTRACT

The present invention provides a polyimide-based copolymer and electronic component and field effect transistor comprising the same. The polyimide-based copolymer comprises a copolymer of dianhydride and heterocyclic diamine, wherein the heterocyclic diamine has two benzene rings, and there are two ether bonds, two thioether bonds, or one ether bond and one thioether bond between the two benzene rings. The novel polyimide-based copolymer of the invention has excellent thermal-mechanical stability, has potential application prospects, and can be used as a substrate for flexible electronics.

4 Claims, 53 Drawing Sheets

(a)
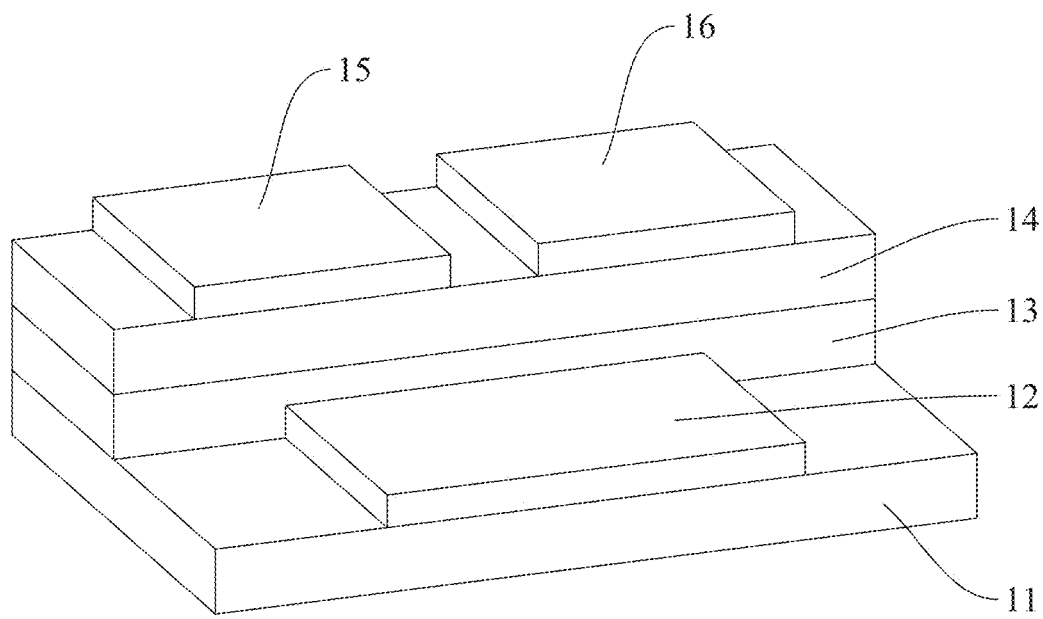
(b)
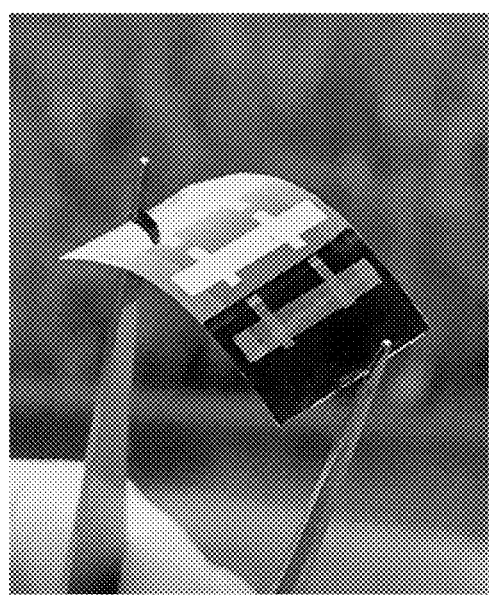
Fig. 1

| Monomeric repeating unit | Dimeric repeating unit | |
|---|---|---|
| (a) | | $1 \times V_{vdW} = 330.2 \text{ cm}^3\text{mol}^{-1}$<br>$2 \times V_{vdW} = 649.3 \text{ cm}^3\text{mol}^{-1}$<br>$\Delta V_{vdW} = 319.1 \text{ cm}^3\text{mol}^{-1}$ |
| (b) | | $1 \times V_{vdW} = 401.6 \text{ cm}^3\text{mol}^{-1}$<br>$2 \times V_{vdW} = 792.2 \text{ cm}^3\text{mol}^{-1}$<br>$\Delta V_{vdW} = 390.6 \text{ cm}^3\text{mol}^{-1}$ |
| (c) | | $1 \times V_{vdW} = 320.0 \text{ cm}^3\text{mol}^{-1}$<br>$2 \times V_{vdW} = 628.9 \text{ cm}^3\text{mol}^{-1}$<br>$\Delta V_{vdW} = 308.9 \text{ cm}^3\text{mol}^{-1}$ |
| (d) | | $1 \times V_{vdW} = 391.4 \text{ cm}^3\text{mol}^{-1}$<br>$2 \times V_{vdW} = 771.8 \text{ cm}^3\text{mol}^{-1}$<br>$\Delta V_{vdW} = 380.4 \text{ cm}^3\text{mol}^{-1}$ |
| (e) | | $1 \times V_{vdW} = 390.9 \text{ cm}^3\text{mol}^{-1}$<br>$2 \times V_{vdW} = 608.8 \text{ cm}^3\text{mol}^{-1}$<br>$\Delta V_{vdW} = 298.9 \text{ cm}^3\text{mol}^{-1}$ |
| (f) | | $1 \times V_{vdW} = 381.4 \text{ cm}^3\text{mol}^{-1}$<br>$2 \times V_{vdW} = 751.6 \text{ cm}^3\text{mol}^{-1}$<br>$\Delta V_{vdW} = 370.3 \text{ cm}^3\text{mol}^{-1}$ |

Fig. 5

(a)
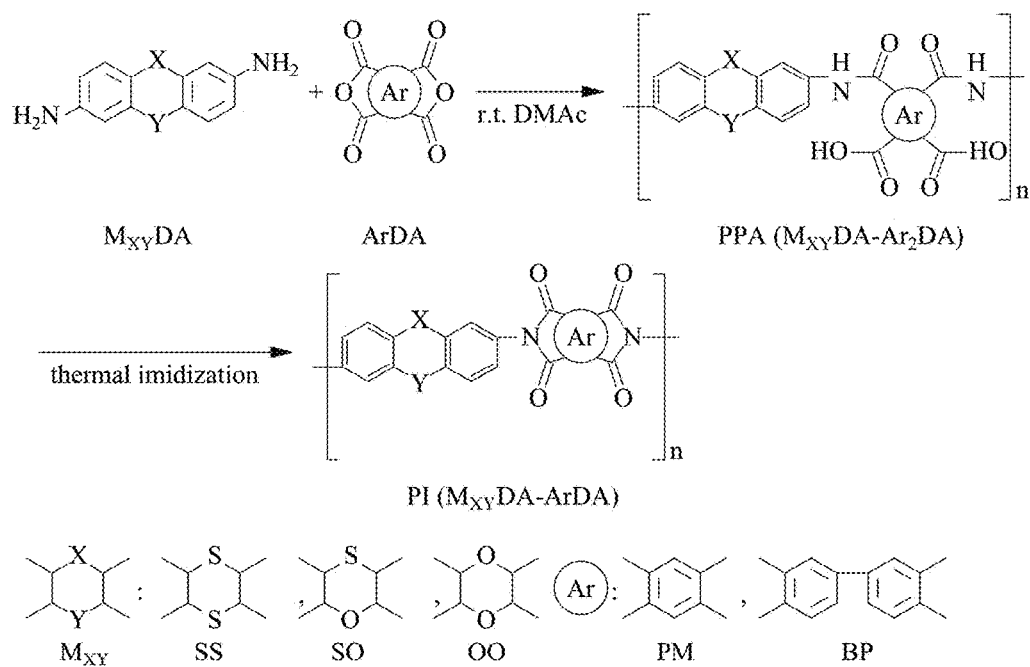
(b)
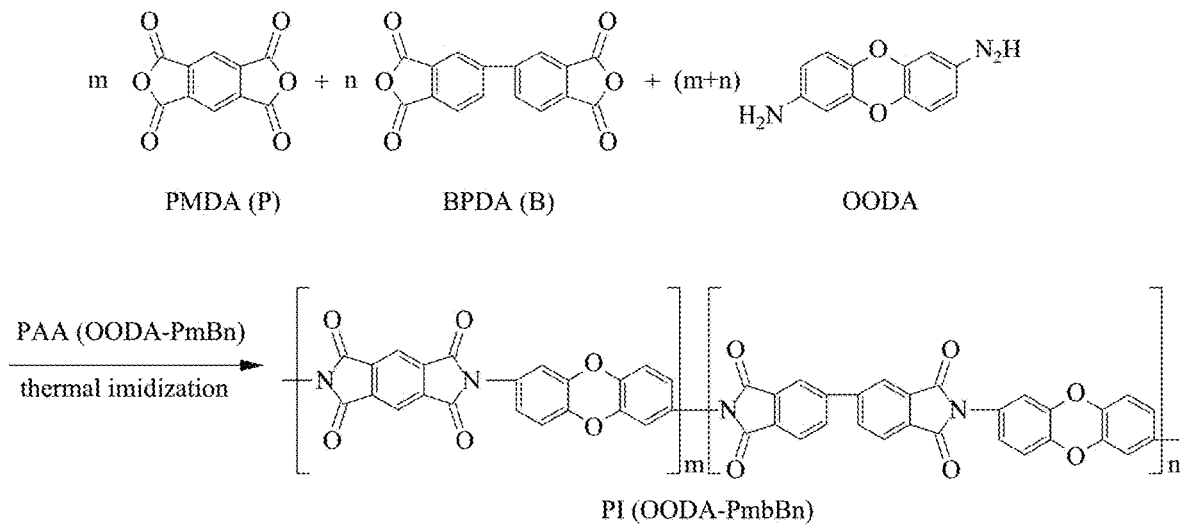
Fig. 6

(a)
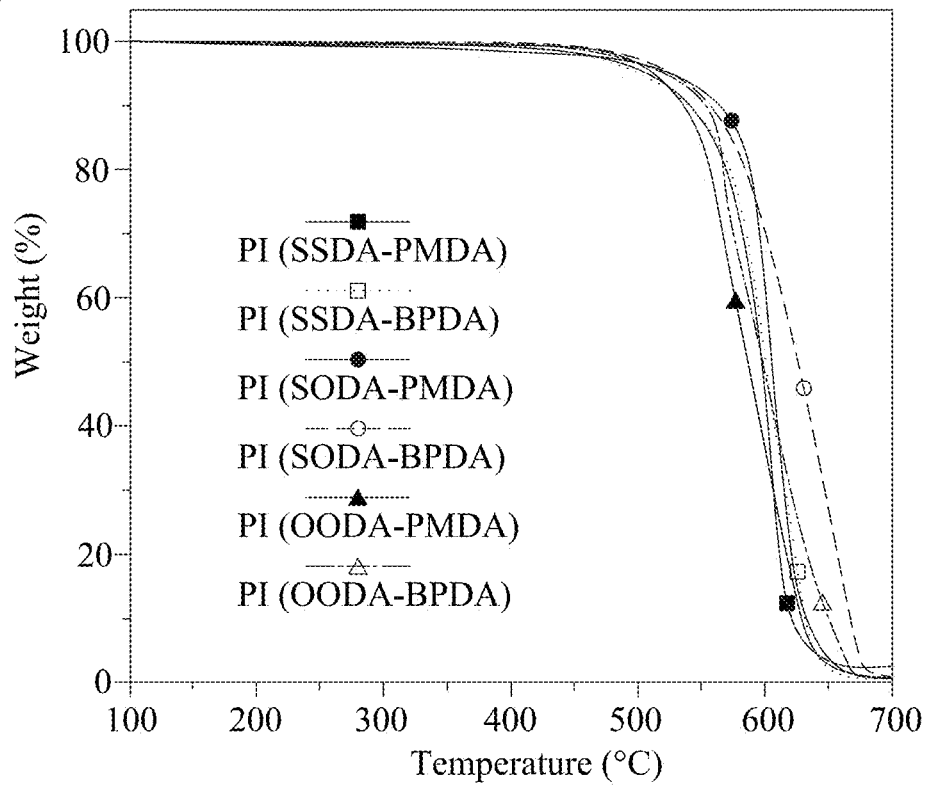
(b)
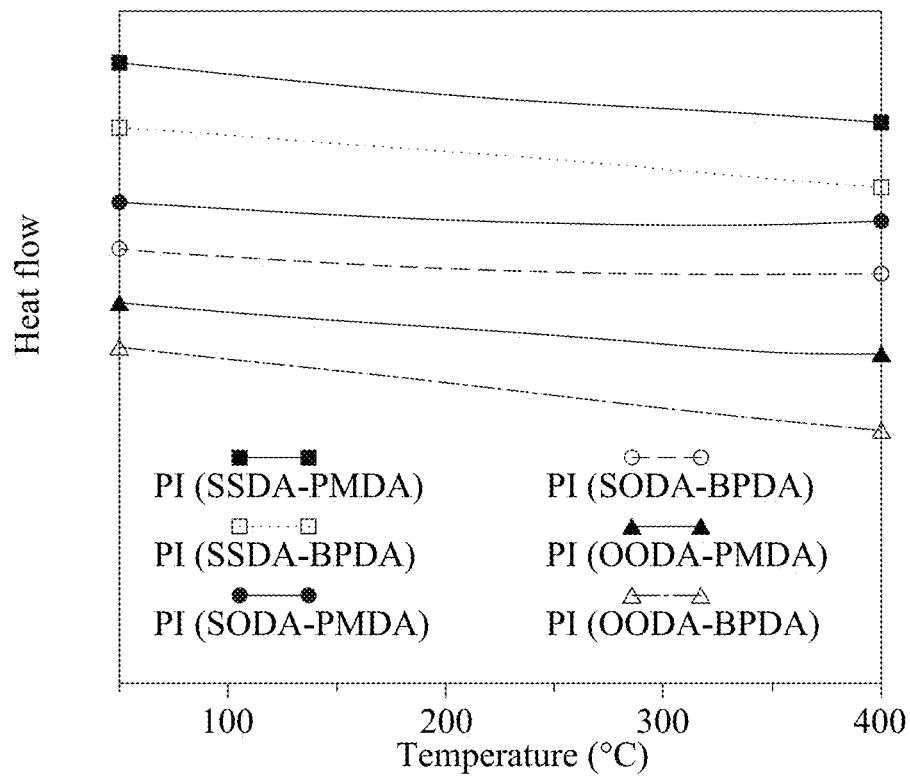
Fig. 11

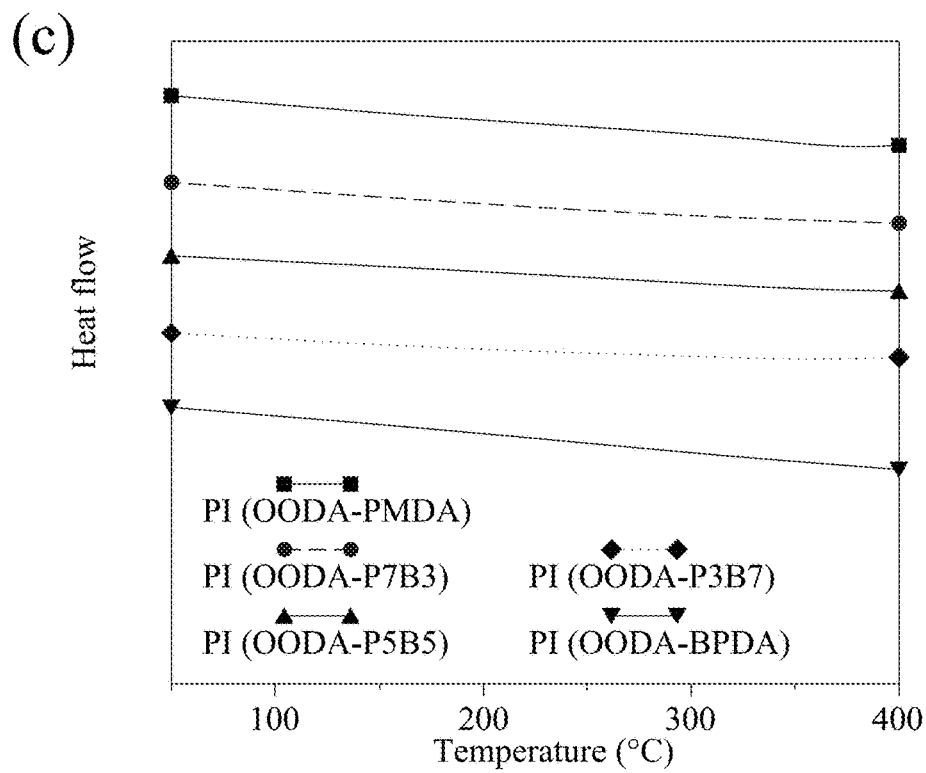
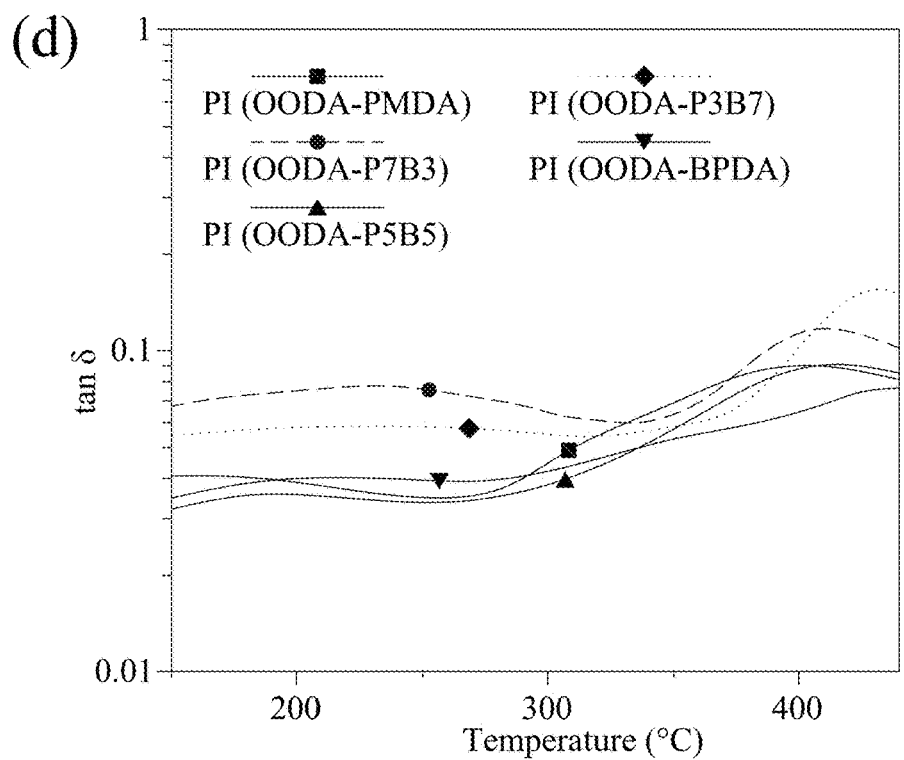
Fig. 12

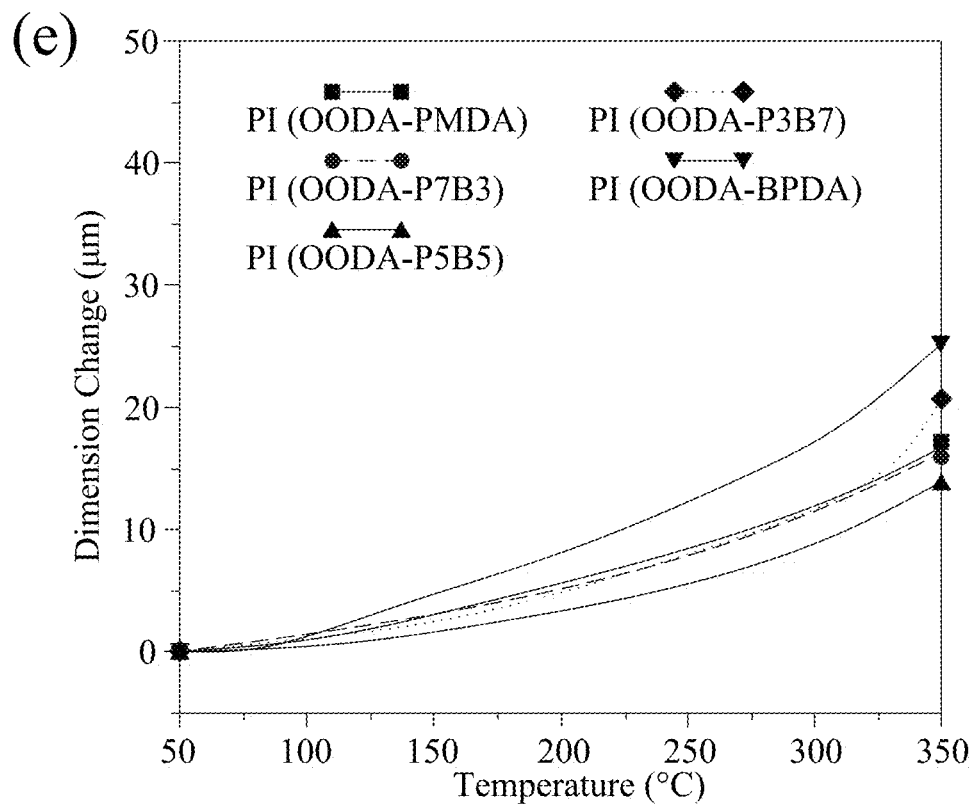
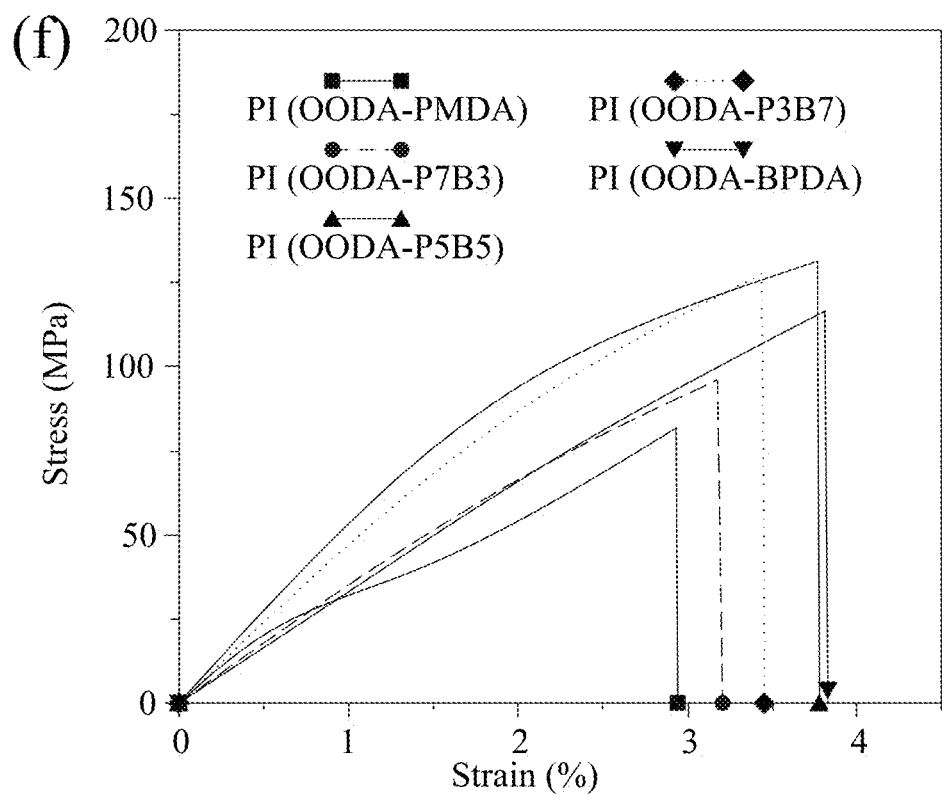
Fig. 12

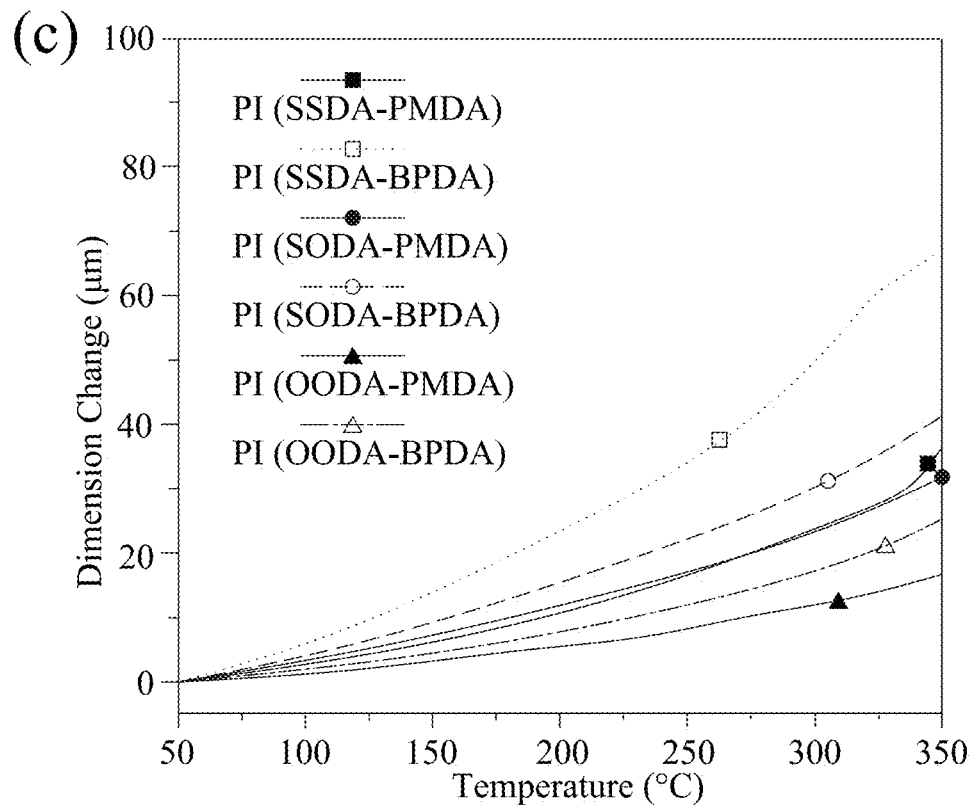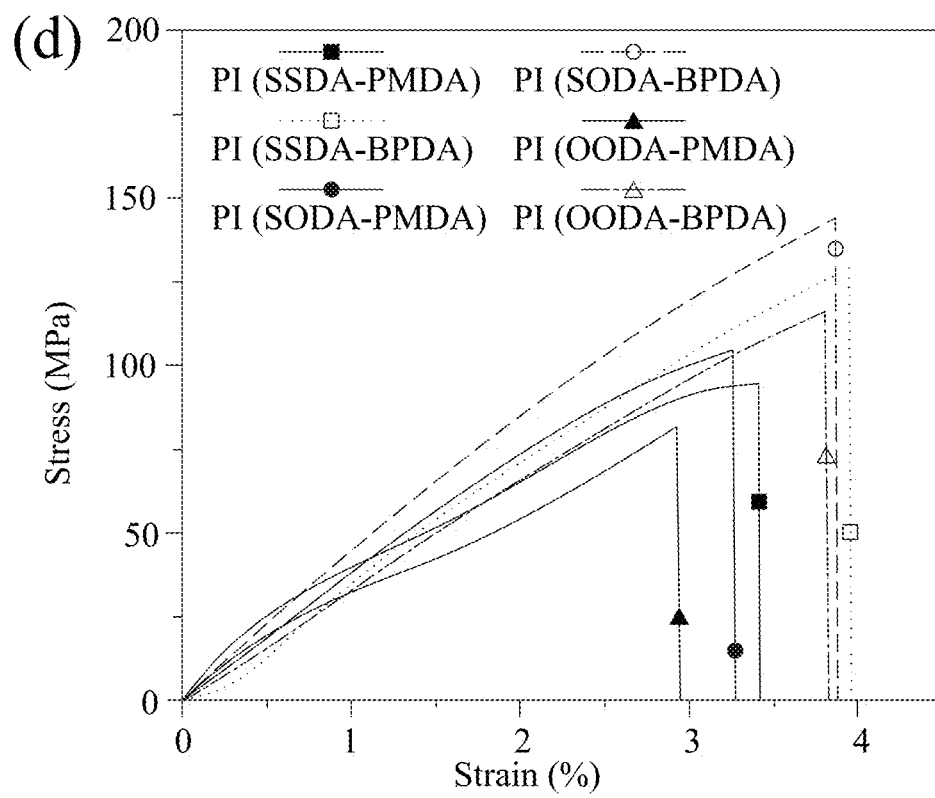
Fig. 13

(a)
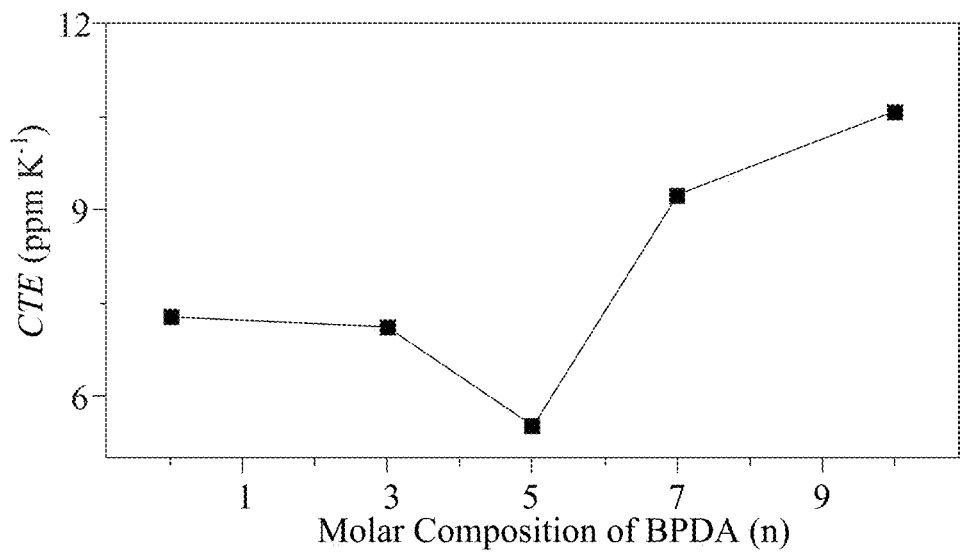
(b)
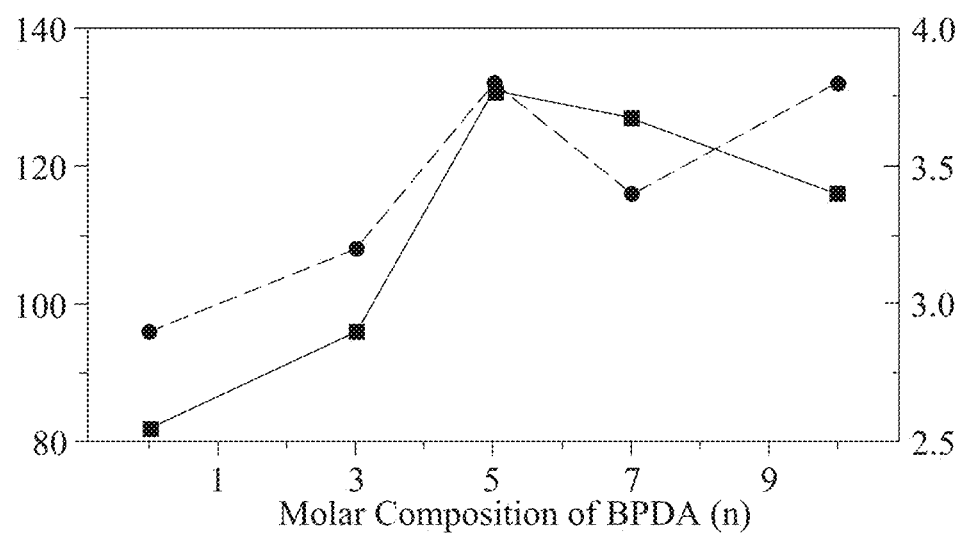
Fig. 15

(a)
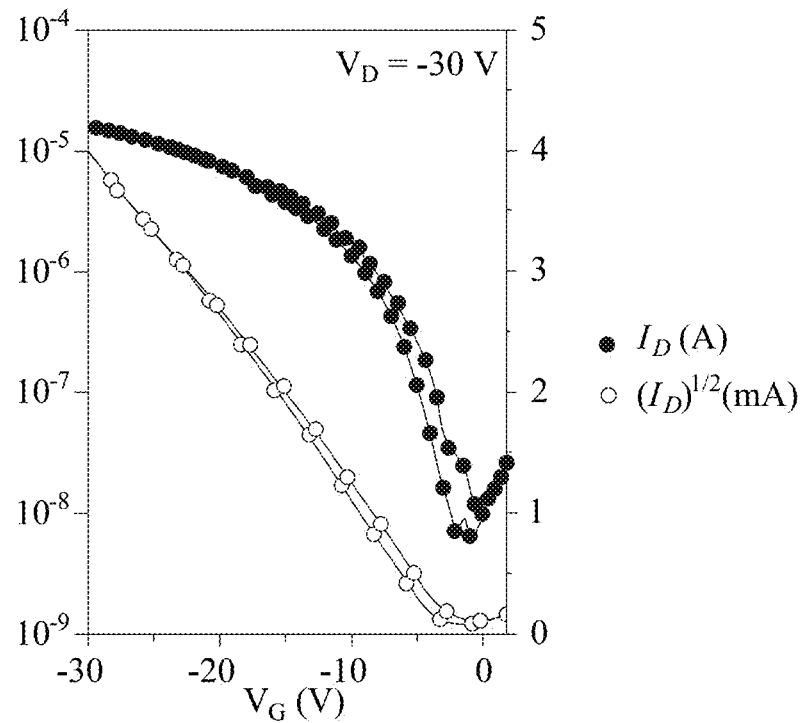
(b)
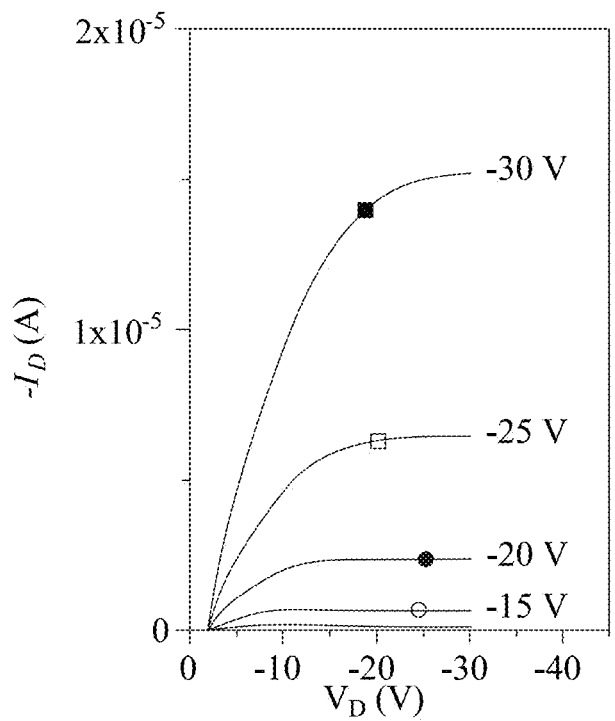
Fig. 16

(a)
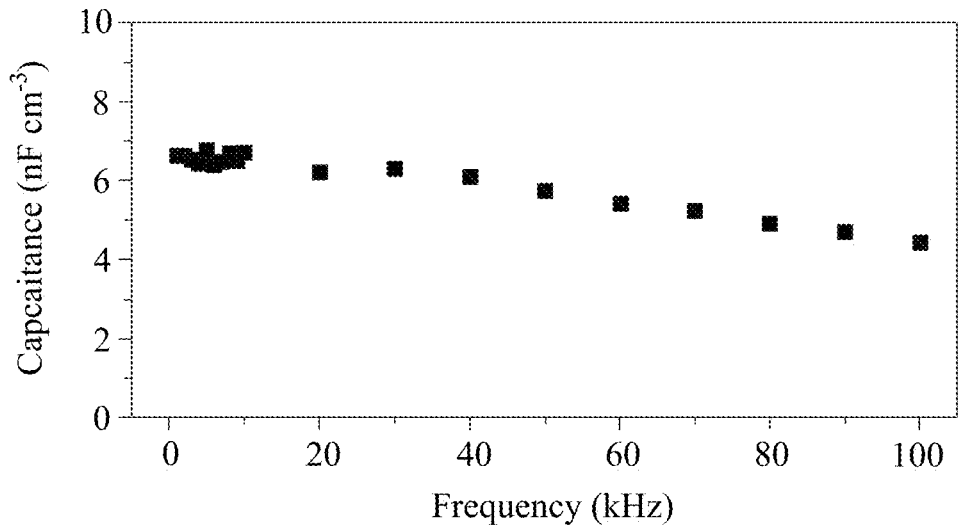
(b)
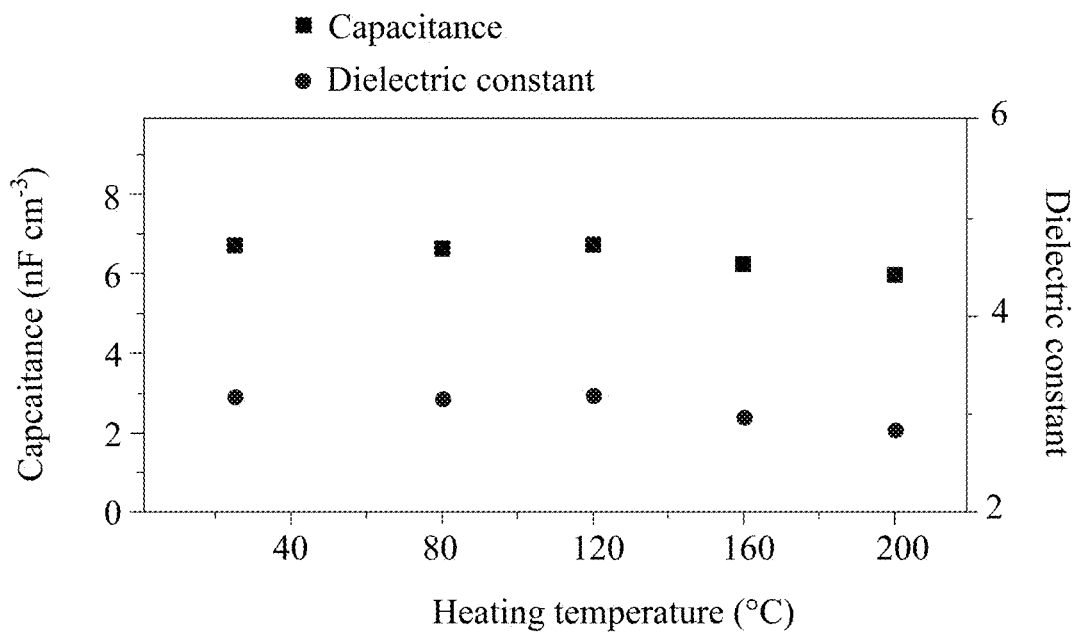
Fig. 17

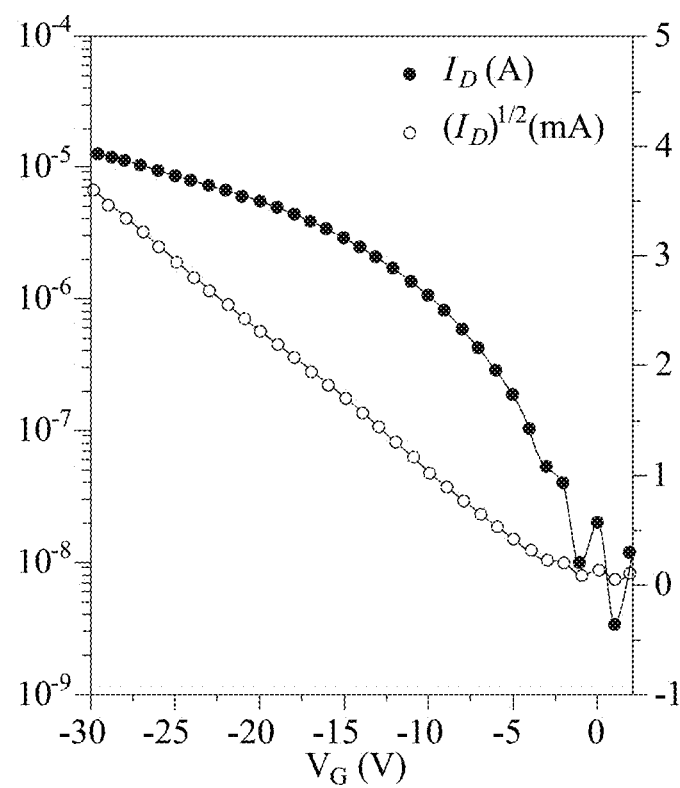
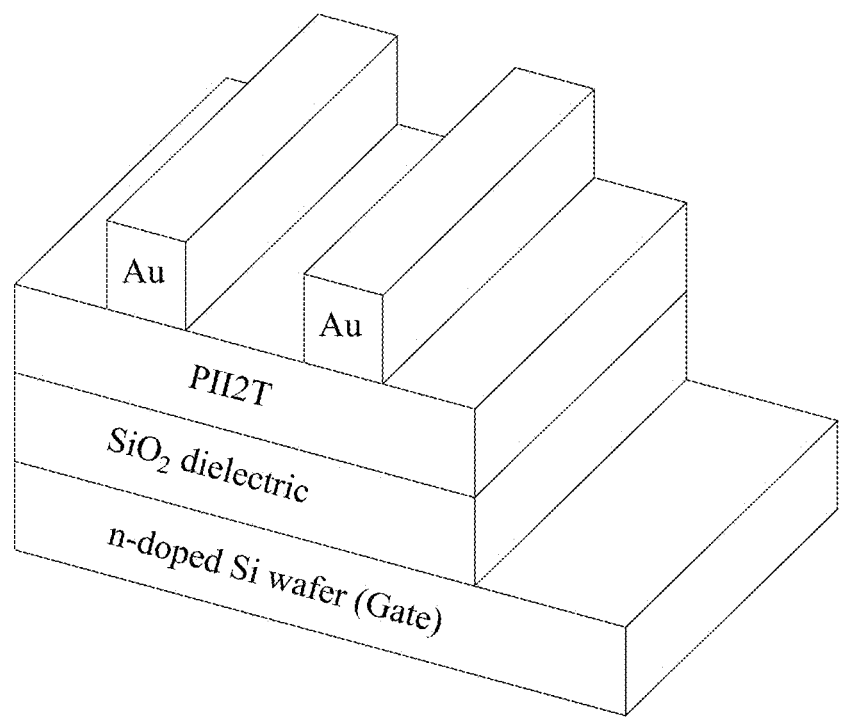
Fig. 18a

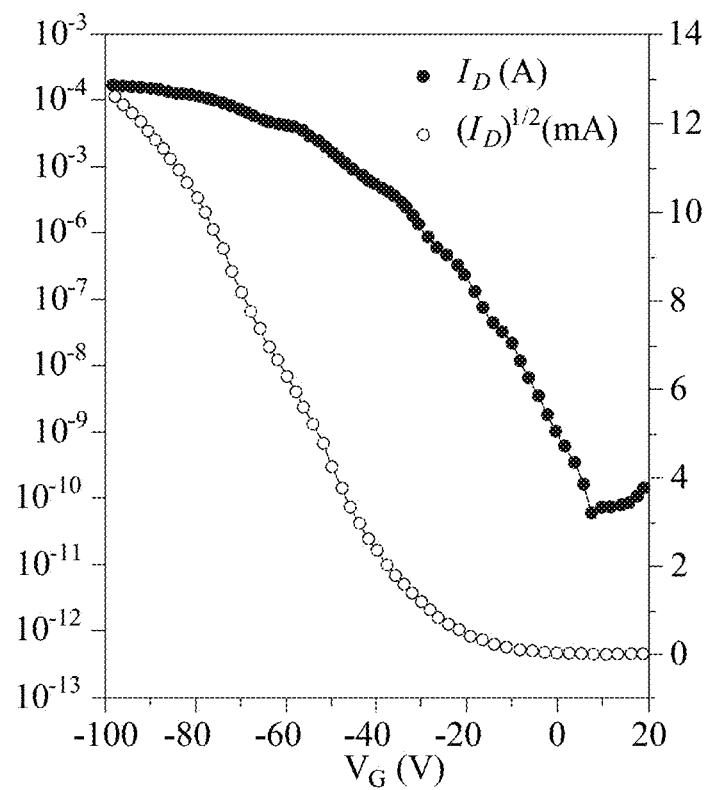
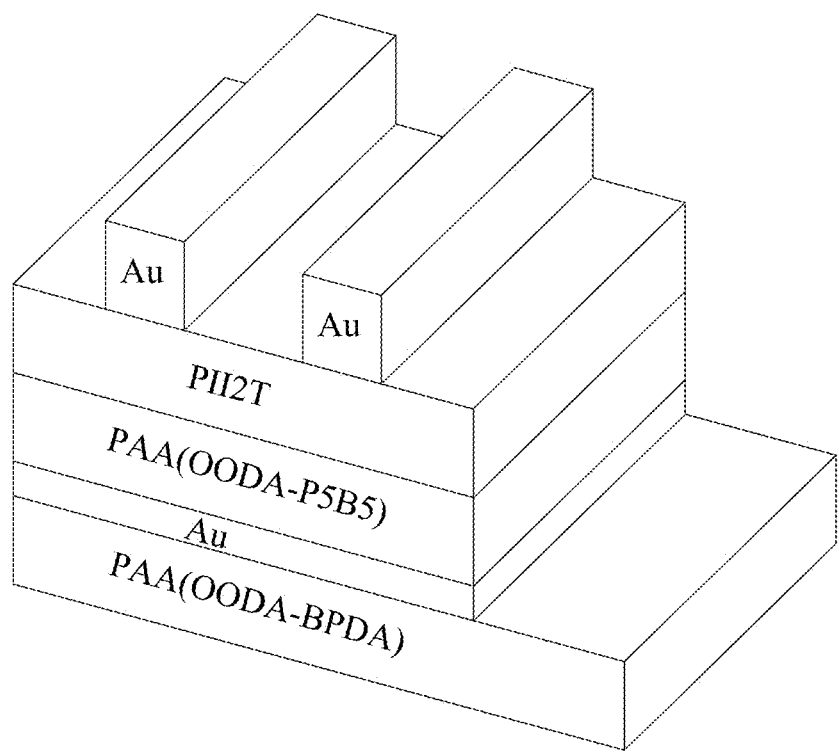
Fig. 18b

POLYIMIDE BASED COPOLYMER AND ELECTRONIC COMPONENT AND FIELD EFFECT TRANSISTOR COMPRISING THE SAME

BACKGROUND OF THE INVENTION

1. Technical Field

The present invention relates to a polyimide-based copolymer and electronic component and field effect transistor comprising the same. In particular, the polyimide-based copolymer comprises a copolymer of dianhydride and heterocyclic diamine, wherein the heterocyclic diamine has two benzene rings, and there are two ether bonds, two thioether bonds, or one ether bond and one thioether bond between the two benzene rings.

2. Description of Related Art

In recent years, the next generation of technologies dedicated to portable or wearable flexible electronic devices has caused extensive research work. Compared with conventional inorganic materials, organic polymer materials have the characteristics of low cost, mechanical flexibility, and light weight. Therefore, organic polymer materials are widely used as substrates, dielectrics or semiconductors in electronic device applications, including organic field effect transistors (OFET), organic photovoltaics (OPV), organic light-emitting diodes (OLED), and memory devices.

There have been many studies to develop high-performance flexible organic field effect transistors with plastic substrates to replace inorganic silicon wafers, and it needs to have the following characteristics: (1) High heat resistance and stability, and can withstand high temperature processes in the manufacturing process; (2) Chemical resistance to the applied solution process; (3) Low surface roughness and high dimensional stability to avoid current leakage; and (4) Low water absorption to ensure the environmental stability of the equipment/device. Currently, various polymer materials such as polyethylene naphthalate (PEN), polyethylene terephthalate (PET) and polyimide (PI) are considered as substrate candidates for applications in flexible organic field effect transistors. Aromatic polyimide is compatible with substrates and has great prospects due to its excellent heat resistance, stability, mechanical properties and chemical resistance. However, the conventional polyimide shows a relatively high linearity to the coefficient of thermal expansion (CTE). For example, the CTE of the commercially available polyimide tape Kapton is 25 ppm/K, which may cause thermal mismatch and delamination with other inorganic components in the device.

BRIEF SUMMARY OF THE INVENTION

Highly thermal-stable PIs (i.e., glass transition temperature $T_g$>400° C., decomposition temperature $T_d$>500° C.) and an outstanding dimensional stability (i.e., CTE<10 ppm $K^{-1}$) have been reported in the literature. Hasegawa and coworkers had summarized the relationship between thermal stability, dimensional stability and chemical structure of PI. They concluded that the CTE of PI became lower with an increase of in-plane orientation. Besides, the linearity/rigidity of polymer backbone, physical interaction between polymer chains, and chain mobility during imidization had a strong correlation with in-plane orientation. (M. Hasegawa, Y. Hoshino, N. Katsura, J. Ishii, *Polymer* 2017, 111, 91-102.; S. Numata, K. Fujisaki, N. Kinjo, *Polymer* 1987, 28, 2282-2288.; S. Ebisawa, J. Ishii, M. Sato, L. Vladimirov, M. Hasegawa, *Eur. Polym. J.* 2010, 46, 283-297.) Lu and coworkers introduced the diamines with bisbenzimidazole units to tune the intermolecular interaction and improved the solid-state packing of the PI for achieving a low CTE (<10 ppm $K^{-1}$). (M. Lian, X. Lu, Q. Lu, *Macromolecules* 2018, 51, 10127-10135.) However, the water absorption of the PIs derived from the benzoxazole or benzimidazole are in a similarly high level due to the possible formation of the hydrogen bonding with the moisture in air. Note that a low water absorption is generally required for the application in OFET devices.

In view of this, the primary objective of the present invention is to provide a novel polyimide material, which is a polymer with high thermal-mechanical stability, which can be used as a flexible substrate for electronic components/products (such as flexible or wearable electronic devices) and organic field effect transistors. The polyimide material is mainly prepared by the polycondensation of dianhydride and heterocyclic diamine.

The primary objective of the present invention is to provide a polyimide-based copolymer, including a copolymer of dianhydride and heterocyclic diamine, wherein the heterocyclic diamine has two benzene rings, and there are two ether bonds, two thioether bonds, or one ether bond and one thioether bond between the two benzene rings.

In a preferred embodiment, the dianhydride is at least one selected from the group consisting of cyclohexanetetracarboxylic dianhydride, cyclopentanetetracarboxylic dianhydride, bicyclohexane-3,4,3',4'-tetracarboxylic dianhydride, cyclobutanetetracarboxylic dianhydride, pyromellitic dianhydride, 3,3',4,4'-biphenyltetracarboxylic dianhydride, 2,2',3,3'-biphenyltetracarboxylic dianhydride, 2,3,3',4'-biphenyltetracarboxylic dianhydride, 4,4'-(hexafluoroisopropylidene) diphthalic acid dianhydride,-3,4'-(hexafluoroisopropylidene) diphthalic acid dianhydride, 3,3'-(hexafluoroisopropylidene) diphthalic acid dianhydride, 4,4'-oxydiphthalic anhydride, 3,4'-oxydiphthalic anhydride, 4,4'-bisphenol A dianhydride, 2,3,6,7-napthalenetetracarboxylic dianhydride, 1,4,5,8-napthalenetetracarboxylic dianhydride, 3,4,9,10-perylenetetracarboxylic dianhydride, bicycle[2.2.2]oct-7-ene-2,3,5,6-tetracarboxylic dianhydride, diethylenetriaminepentaacetic dianhydride, ethylenediamine tetraacetic dianhydride, 3,3',4,4'-benzophenonetetracarboxylic dianhydride, 3,3',4,4'-diphenylsulfonetetracarboxylic dianhydride, 2,2'-bis(3,4-dicarboxyphenyl) hexafluoropropane dianhydride, 4,4'-bisphenol A diphthalic anhydride, 5-(2,5-dioxotetrahydro)-3-methyl-3-cyclohexene-1,2-dicarboxylic anhydride, ethylene glycol bis(trimellitic anhydride) and hydroquinonediphthalic anhydride.

In a preferred embodiment, the dianhydride includes pyromellitic dianhydride (PMDA) and/or 3,3',4,4'-biphenyltetracarboxylic dianhydride (BPDA).

In a preferred embodiment, the heterocyclic diamine includes 2,6-diaminothianthrene (SSDA), 2,6-diaminophenoxathiin (SODA) or 2,6-diaminodibenzo-p-dioxin (OODA).

In a preferred embodiment, the polyimide-based copolymer has a structure of the following formula (I):

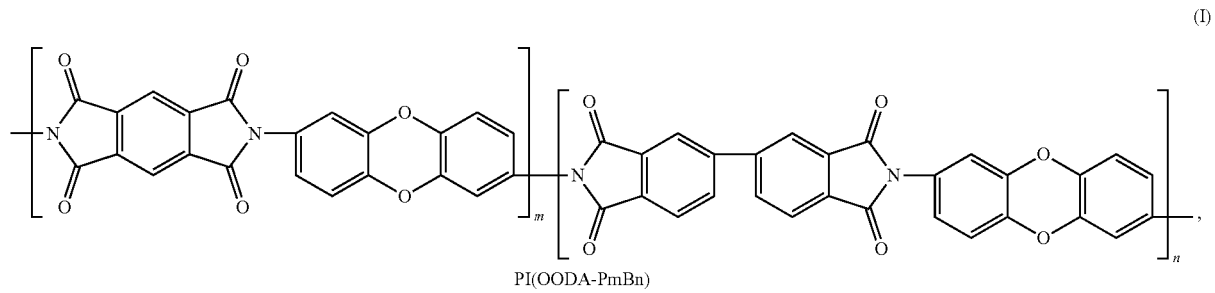

PI(OODA-PmBn)

wherein m and n each independently represent the number of moles, and the molar ratio of m:n is 7:3 to 3:7.

Another objective of the present invention is to provide an electronic device including the aforementioned polyimide-based copolymer as a dielectric and/or flexible substrate.

Another objective of the present invention is to provide a field effect transistor including the aforementioned polyimide-based copolymer as a dielectric and/or flexible substrate.

In a preferred embodiment, the field effect transistor further includes a source, a drain, an active layer, and a gate, and has a bottom-gate-top-contact (BGTC) configuration.

In a preferred embodiment, the flexible substrate has a structure of the following formula (I) or formula (II):

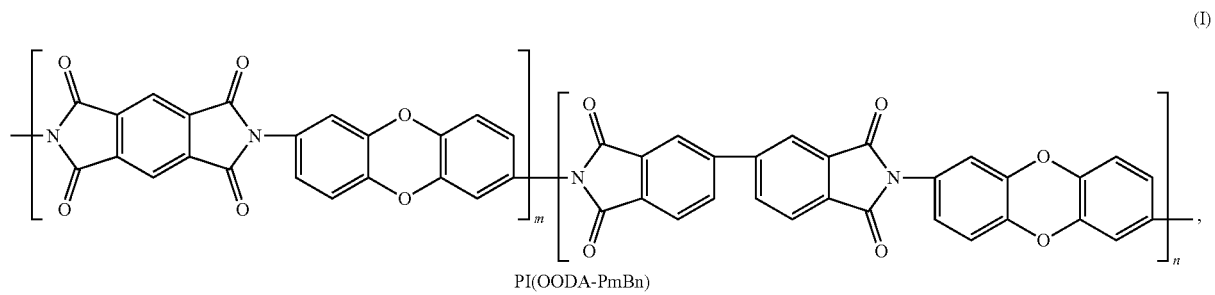

PI(OODA-PmBn)

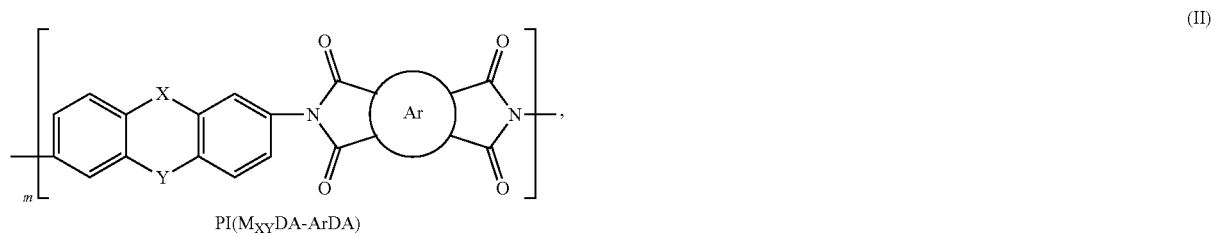

PI(M$_{XY}$DA-ArDA)

wherein m and n in formula (I) each independently represent the number of moles, and the molar ratio of m:n is 5:5; and in the structure of formula (II), $M_{XY}$ represents

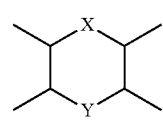

OO

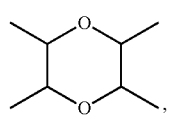

, and

represents

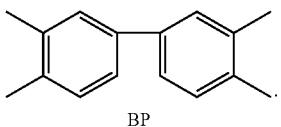

BP

In a preferred embodiment, the dielectric has a structure of the following formula (III):

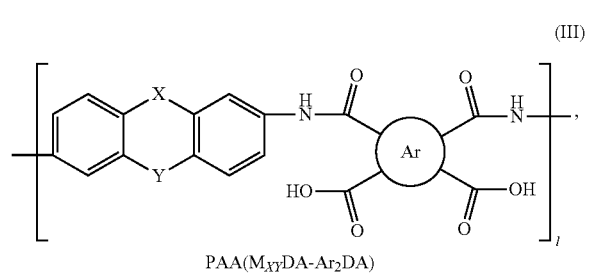

PAA(M$_{XY}$DA-Ar$_2$DA)

wherein

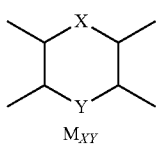

M$_{XY}$ represents

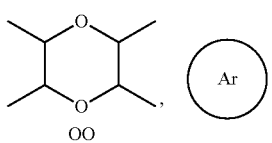

OO represents

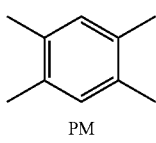

PM and

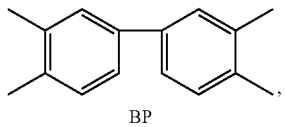

BP and the molar ratio of PM:BP is 5:5.

As mentioned above, the polyimide-based copolymer of the present invention can be made into a flexible and tough polyimide film with a very low coefficient of thermal expansion. In addition, the organic field effect transistor containing the polyimide-based copolymer of the invention exhibits compatible and stable device performance even after being baked at 200° C. for 2 hours or bent for 1000 cycles. It can be seen that the invention has many advantages over conventional technologies. Therefore, the novel polyimide-based copolymer with excellent thermal-mechanical stability of the invention has potential application prospects and can be used as a substrate for flexible electronics.

BRIEF DESCRIPTION OF THE FIGURE

Implementation of the present technology will now be described, by way of example only, with reference to the attached figures, wherein:

FIG. 1 shows (a) a schematic structure of the all polymer-based transistor device and the structure and thickness of the polyimide-based copolymer substrate, dielectrics and semiconducting (active) layer; and (b) a photograph of the flexible and all polymer-based FET device according to a preferred embodiment of the present invention.

FIG. 5 shows the optimized geometries and van der Waals volume of (a) PI(SSDA-PMDA), (b) PI(SSDA-BPDA), (c) PI(SODA-PMDA), (d) PI(SODA-BPDA), (e) PI(OODA-PMDA), and (f) PI(OODA-BPDA) according to a preferred embodiment of the present invention.

FIG. 6 shows the synthetic routes of the polyimide-based copolymers according to a preferred embodiment of the present invention: (a) PI(M$_{XY}$DA-ArDA), where M$_{XY}$ represent the three diamines SSDA, SODA, and OODA of the preferred embodiment. (b) PI(OODA-PmBn), where the molar ratios of PMDA to BPDA (m:n) were set as 7:3, 5:5, and 3:7.

FIG. 11 shows the thermal characterization of the synthesized polyimide-based copolymer PI($M_{XY}$DA-ArDA) according to a preferred embodiment of the present invention: (a) TGA curves measured under air flow, and (b) DSC curves.

FIG. 15 shows the relationship between (a) $\alpha$-$T_g$, CTE and (b) UTS, $\varepsilon_b$ and the composition of BPDA for the synthesized polyimide-based copolymer PI(OODA-PmBn) according to a preferred embodiment of the present invention.

FIG. 16 shows the FET (a) transfer and (b) output characteristics of all polymer-based transistor device according to a preferred embodiment of the present invention.

FIG. 17 shows the capacitance of dielectrics PI(OODA-P5B5) (a) measured at different frequency and (b) measured at $10^4$ kHz under heating temperature according to a preferred embodiment of the present invention.

FIG. 18 shows the FET transfer characteristics of PII2T-based transistor devices fabricated by (a) highly n-doped Si wafer as substrate and 300 nm $SiO_2$ as dielectric and (b) PI(OODA-BPDA) as substrate and 420 nm PI(OODA-P5B5) as dielectric according to a preferred embodiment of the present invention.

DETAILED DESCRIPTION OF THE INVENTION

Figure 2:
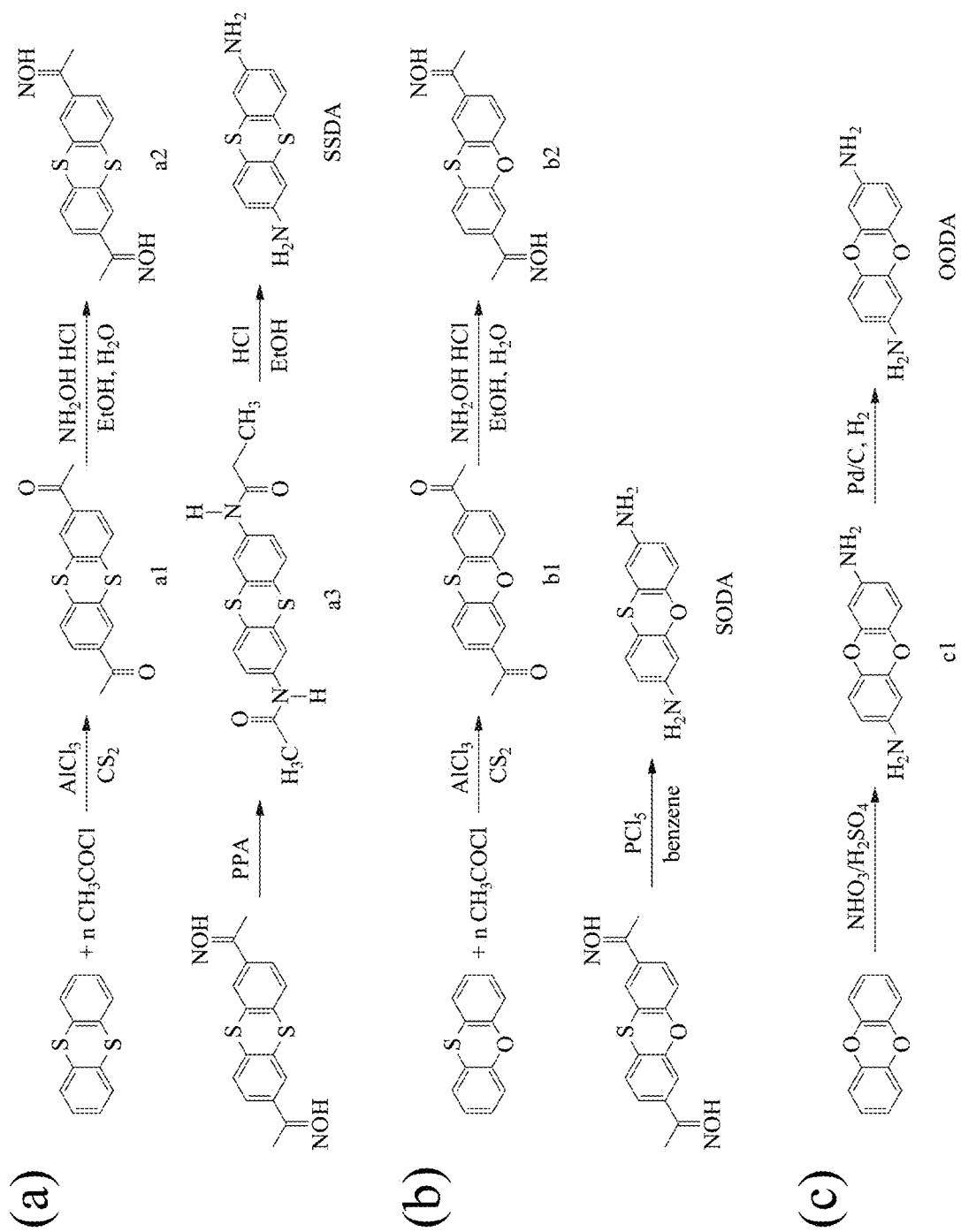
FIG. 2 shows the synthetic routes of the diamine monomers, (a) SSDA, (b) SODA, and (c) OODA, according to a preferred embodiment of the present invention.

The detailed description and technical solution of the present invention are hereunder described with reference to accompanying drawings. For illustrative sake, the accompanying drawings are not drawn to scale. The accompanying drawings and the scale thereof are not restrictive of the invention.

Unless defined otherwise, all technical and scientific terms used herein have the same meaning as commonly understood to one of ordinary skill in the art to which this disclosure belongs. The following terms used throughout this application shall have the following meanings.

The use of "or" means "and/or" unless stated otherwise. The use of "comprise" means not excluding the presence or addition of one or more other components, steps, operations, or elements to the described components, steps, operations, or elements, respectively. Similarly, "comprise," "comprises," "comprising," "include," "includes," and "including" are interchangeable and not intended to be limiting. As used herein and in the appended claims, the singular forms "a," "an," and "the" include plural referents unless the context dictates otherwise. The terms "a", "an", "the," "one or more," and "at least one," for example, can be used interchangeably herein.

The present invention relates to a polyimide-based copolymer, including a copolymer of dianhydride and heterocyclic diamine, wherein the heterocyclic diamine has two benzene rings, and there are two ether bonds, two thioether bonds, or one ether bond and one thioether bond between the two benzene rings. On the other hand, the invention also relates to an electronic device including the aforementioned polyimide-based copolymer as a dielectric and/or flexible substrate. In addition, the invention also relates to a field effect transistor including the aforementioned polyimide-based copolymer as a dielectric and/or flexible substrate.

The "polyimide-based copolymer" as used herein refers to a copolymer of dianhydride and heterocyclic diamine, wherein the heterocyclic diamine has two benzene rings, and there are two ether bonds, two thioether bonds, or one ether bond and one thioether bond between the two benzene rings. The polyimide-based copolymers described herein also include polyimide-related polymers such as derivatives, precursors, substitutes, or copolymers with other monomers of the aforementioned copolymers.

In a preferred embodiment, the polyimide-based copolymer of the present invention includes a polyimide copolymerized with PMDA and/or BPDA with three diamines (SSDA, SODA and OODA) having two ether bonds or thioether bonds between two benzene rings. In a preferred embodiment, the polyimide-based copolymer of the present invention includes the structure of formula (I):

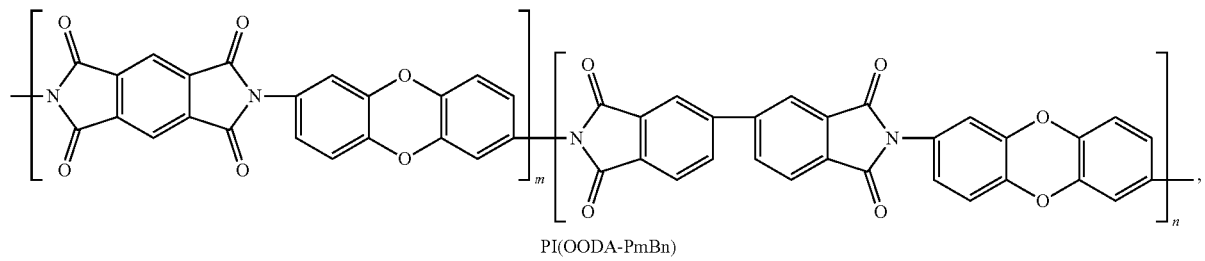

PI(OODA-PmBn)

where m and n in the formula (I) each independently represent the number of moles, and the molar ratio of m:n is, for example, but not limited to 0.5:9.5, 1:9, 1.5:8.5, 2:8, 2.5:7.5, 3:7, 3.5:6.5, 4:6, 4.5:5.5, 5:5, 5.5:4.5, 6:4, 6.5:3.5, 7:3, 7.5:2.5, 8:2, 8.5:1.5, 9:1 or 9.5:0.5. In a preferred embodiment, the polyimide-based copolymer of the present invention includes the structure of formula (I):

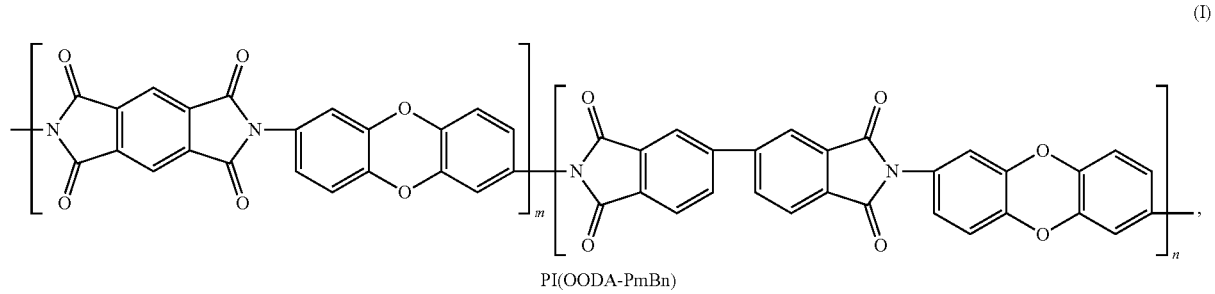

PI(OODA-PmBn)

where m and n in the formula (I) each independently represent the number of moles, and the molar ratio of m:n is preferably 7:3 to 3:7, such as but not limited to 7:3, 6.5:3.5, 6:4, 5.5:4.5, 5:5, 4.5:5.5, 4:6, 3.5:6.5 or 3:7. In a preferred embodiment, the polyimide-based copolymer of the present invention includes the structure of formula (I):

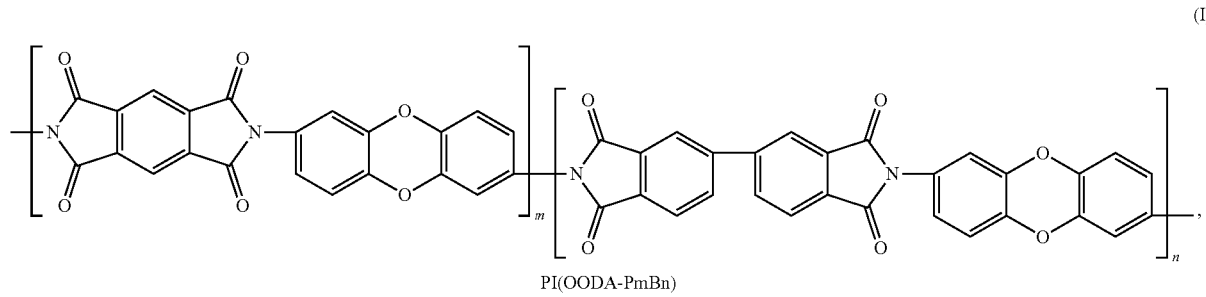

PI(OODA-PmBn)

where m and n in the formula (I) each independently represent the number of moles, and the molar ratio of m:n is 5:5. In a preferred embodiment, the polyimide-based copolymer of the present invention includes the of formula structure (II):

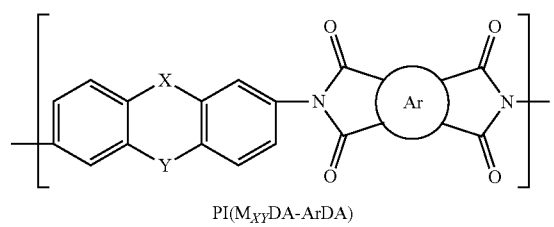

(II)

PI(M$_{XY}$DA-ArDA)

wherein in the structure of the formula (II),

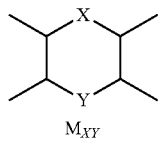

M$_{XY}$ represents one of

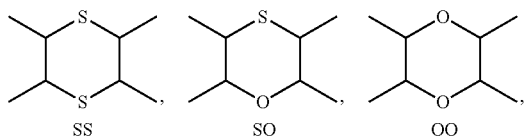

SS   SO   OO and

Ar represents one of

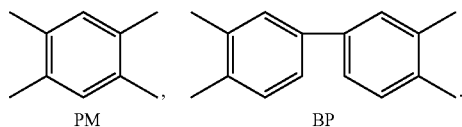

PM   BP

In a preferred embodiment, the polyimide-based copolymer of the present invention includes the structure of formula (II):

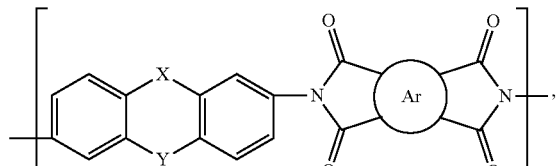

(II)

PI(M$_{XY}$DA-ArDA)

wherein in the structure of the formula (II),

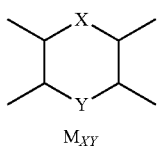

M$_{XY}$ represents

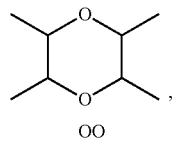

OO and

Ar represents

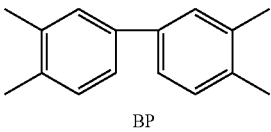

BP

In a preferred embodiment, the polyimide-based copolymer of the present invention includes a polyimide precursor, such as poly(amic acid) (PAA), and the precursor is formed by the nucleophilic reaction between the amine group of the diamine and the carbonyl group of the dianhydride. In a preferred embodiment, the polyimide-based copolymer of the present invention includes the structure of formula (III):

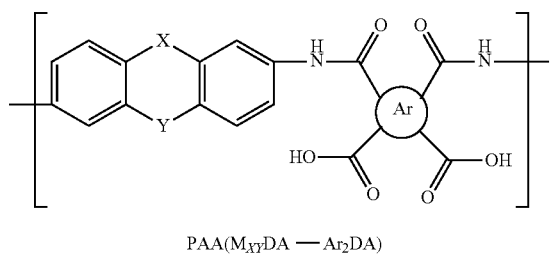

PAA(M$_{XY}$DA — Ar$_2$DA)

wherein

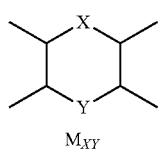

M$_{XY}$ represents one of

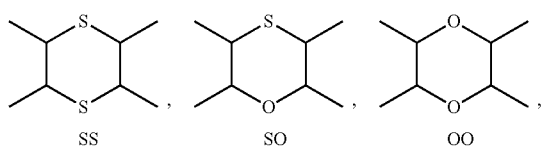

SS          SO          OO and

represents one of

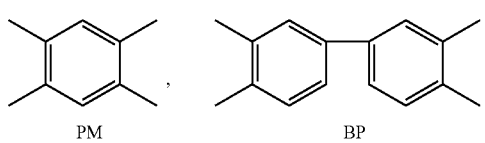

PM          BP and their combination. In a preferred embodiment, the polyimide-based copolymer of the present invention includes the structure of formula (III):

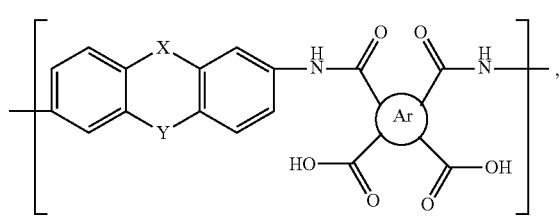

PAA(M$_{XY}$DA — Ar$_2$DA)

wherein

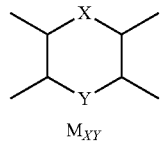

M$_{XY}$ represents one of

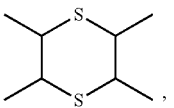 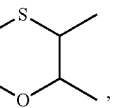 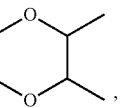

SS          SO          OO and

represents the combination of

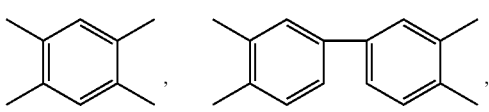

PM          BP and the molar ratio of PM:BP is, for example, but not limited to 0.5:9.5, 1:9, 1.5:8.5, 2:8, 2.5:7.5, 3:7, 3.5:6.5, 4:6, 4.5:5.5, 5:5, 5.5:4.5, 6:4, 6.5:3.5, 7:3, 7.5:2.5, 8:2, 8.5:1.5, 9:1 or 9.5:0.5. In a preferred embodiment, the polyimide-based copolymer of the present invention includes the structure of formula (III):

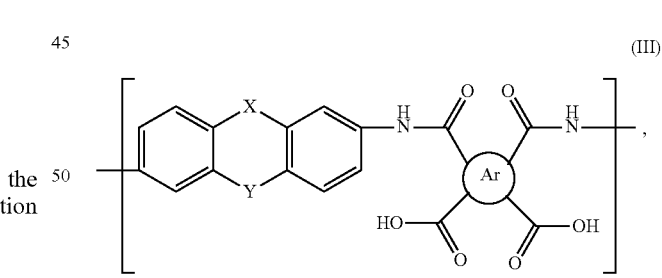

PAA(M$_{XY}$DA — Ar$_2$DA)

wherein

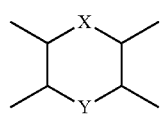

M$_{XY}$ represents

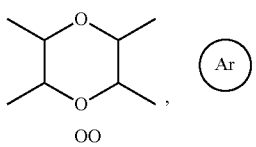

OO represents

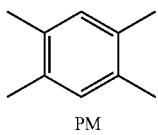

PM and

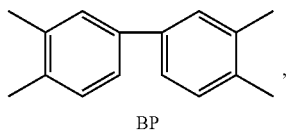

BP and the molar ration of PM:BP is 5:5.

In a preferred embodiment, the polyimide-based copolymer of the present invention includes PAA(SSDA-PMDA), PAA(SSDA-BPDA), PAA(SODA-PMDA), PAA(SODA-BPDA), PAA(OODA-PMDA) and/or PAA(OODA-BPDA).

The "dianhydride" mentioned herein refers to a structure that can be imidized with a diamine to form a polyimide-based copolymer, such as but not limited to at least one selected from the group consisting of cyclohexanetetracarboxylic dianhydride, cyclopentanetetracarboxylic dianhydride, bicyclohexane-3,4,3',4'-tetracarboxylic dianhydride, cyclobutanetetracarboxylic dianhydride, pyromellitic dianhydride, 3,3',4,4'-biphenyltetracarboxylic dianhydride, 2,2',3,3'-biphenyltetracarboxylic dianhydride, 2,3,3',4'-biphenyltetracarboxylic dianhydride, 4,4'-(hexafluoroisopropylidene) diphthalic acid dianhydride,-3, 4'-(hexafluoroisopropylidene) diphthalic acid dianhydride, 3,3'-(hexafluoroisopropylidene) diphthalic acid dianhydride, 4,4'-oxydiphthalic anhydride, 3,4'-oxydiphthalic anhydride, 4,4'-bisphenol A dianhydride, 2,3,6,7-napthalenetetracarboxylic dianhydride, 1,4,5,8-napthalenetetracarboxylic dianhydride, 3,4,9,10-perylenetetracarboxylic dianhydride, bicycle[2.2.2]oct-7-ene-2,3,5,6-tetracarboxylic dianhydride, diethylenetriaminepentaacetic dianhydride, ethylenediamine tetraacetic dianhydride, 3,3',4,4'-benzophenonetetracarboxylic dianhydride, 3,3',4,4'-diphenylsulfonetetracarboxylic dianhydride, 2,2'-bis(3,4-dicarboxyphenyl) hexafluoropropane dianhydride, 4,4'-bisphenol A diphthalic anhydride, 5-(2,5-dioxotetrahydro)-3-methyl-3-cyclohexene-1,2-dicarboxylic anhydride, ethylene glycol bis(trimellitic anhydride) and hydroquinonediphthalic anhydride. In a preferred embodiment, the aforementioned dianhydride includes pyromellitic dianhydride (PMDA) and/or 3,3',4,4'-biphenyltetracarboxylic dianhydride (BPDA).

The "heterocyclic diamine" described herein has two benzene rings, and there are two ether bonds, two thioether bonds, or one ether bond and one thioether bond between the two benzene rings. The heterocyclic diamine is for example but not limited to 2,6-diaminothianthrene (SSDA), 2,6-diaminophenoxathiin (SODA) or 2,6-diaminodibenzo-p-dioxin (OODA).

The polyimide-based copolymer of the present invention has excellent thermal-mechanical stability, flexibility, and low water absorption, and can be applied to various electronic components and electronic devices, such as but not limited to laminates, display components, touch panel components, liquid crystal display devices, and organic electroluminescent display devices, specifically for the manufacture of flexible devices in electronic equipment such as OLED or LCD, electronic paper, solar cells, etc., especially as a substrate for flexible devices. In particular, the polyimide-based copolymer is preferably applicable to OFET, OPV, OLED and memory devices, for example. In a preferred embodiment, the present invention provides an electronic component or electronic device, including the aforementioned polyimide-based copolymer. In a preferred embodiment, the present invention provides an electronic device including the aforementioned polyimide-based copolymer as a dielectric and/or flexible substrate.

In a preferred embodiment, the present invention provides an electronic device, which is a field effect transistor (FET), such as but not limited to metal oxide semiconductor field effect transistor and junction field effect transistor. In a preferred embodiment, the present invention provides a field effect transistor including the aforementioned polyimide-based copolymer as a dielectric and/or a flexible substrate. In a preferred embodiment, the present invention provides a field effect transistor, which can be configured in a top-gate, bottom-gate, top-contact or bottom-contact manner; and it has a dielectric including the aforementioned polyimide-based copolymer. In a preferred embodiment, the present invention provides a field effect transistor, including a source, a drain, an active layer, a dielectric, a gate, and a substrate, and has a bottom-gate-top-contact (BGTC) configuration; wherein the substrate includes the aforementioned polyimide-based copolymer.

The following non-limiting examples of aspects of the present invention are provided primary for the purpose of elucidating aspects of the invention and the benefits derived therefrom.

[Embodiment]—Manufacturing of Flexible Organic Field Effect Transistor

The flexible transistor device of this embodiment is based on a bottom-gate-top-contact (BGTC) configuration (as shown in FIG. 1a), in which the polyimide-based copolymer of the present invention is used as a substrate, such as a structure of formula (II), preferably, for example, PI(OODA-BPDA) or PI(OODA-P5B5) as the substrate, PAA(OODA-P5B5) as the dielectric, and isoindigo-bithiophene conjugated polymer PII2T (whose structural formula is shown in the following formula (IV)) as the semiconductor active layer.

(IV)

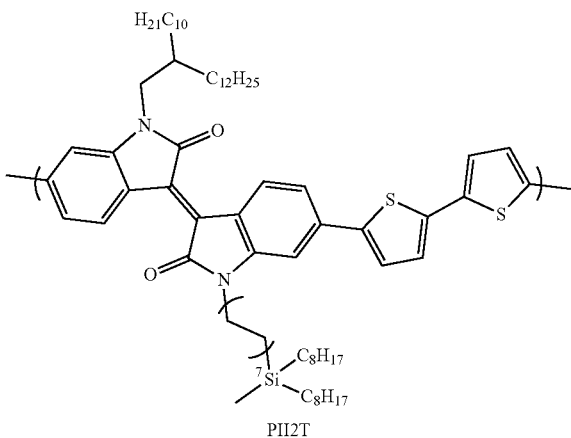

PII2T

A. Experimental Section

Materials: All of the reagents and solvent for preparing the diamines were used as received from commercial sources. The aromatic dianhydrides, PMDA and BPDA were purchased from TCI (Japan) and purified by vacuum sublimation at 160° C. and 200° C. for 24 h and 12 h respectively. Dry N,N-dimethylacetamide (DMAc) with a trace of water<50 ppm was purchased from Sigma-Aldrich (USA). The semiconducting isoindigo-bithiophene conjugated copolymer (PII2T) with the asymmetric side chain decyltetradecane branched alkyl side-chain and carbosilane side-chain was used as the active layer of the fabricated OFET.

Synthesis of diamine monomers: The diamine monomers, SSDA, SODA and OODA of this embodiment were prepared similarly to those reported in the literature. (J. F. Nobis, A. J. Blardinelli, D. J. Blaney, *J. Am. Chem. Soc.* 1953, 75, 3384-3387.; K. Niume, K. Nakamichi, R. Takatuka, F. Toda, K. Uno, Y. Iwakura, *J Polym. Sci. Polym. Chem. Ed.* 1979, 17, 2371-2385.; C. A. Ramsden, *J Chem. Soc., Perkin Trans.* 1 1981, 2456-2463.) The synthetic scheme and structural characterization (including $^1$H and $^{13}$C NMR) of the above diamines are described in FIG. 2 to 4.

Synthesis of PIs: A diamine (2.50 mmol) such as SSDA, SODA, or OODA was dissolved in anhydrous DMAc and then a dianhydride (2.50 mmol) such as PMDA or BPDA was added. The viscous PAA solution was formed after slow stirring for 8 h at room temperature under nitrogen. Note that the viscosity of PAA solution increased rapidly in the first 30 min and thus additional anhydrous DMAc was added into the solution to make sure well-stirring (the solid content of PAA solution was maintained around 10 wt % to 15 wt %). After that, phthalic anhydride (7.4 mg, 5×10$^{-5}$ mol) was added to this solution as the end-capping reagent and the resulting solution was stirred at room temperature for 30 min. For preparing the PI films, the PAA solution was cast on the clean and dry glass substrate by a blade with a gap of 600 μm. To make the better alignments of polymer chain and alleviate film deformation, the solvent in the cast PAA film was removed under vacuum at 30° C. and 100° C. for 15 h and 2 h respectively. After that, the successive thermal program in the following process was then conducted under nitrogen to obtain the fully imidized PI(M$_{xy}$DA-ArDA): 200° C. for 2 h, 300° C. for 2 h, 350° C. for 1 h, and finally 400° C. for 1 h.

PAA(SSDA-PMDA): The amounts of the used reactant and solvent were as the following: SSDA (615 mg, 2.50 mmol), PMDA (545 mg, 2.50 mmol), DMAc (6.57 g). Molecular weight estimated from Size-Exclusion Chromatography (SEC): M$_n$=30.2 kDa, M$w$=57.4 kDa, Đ=1.90. IR (KBr, n, cm$^{-1}$): 3200-3600 (O—H stretching), 1554, 1662 (N—H bending). $^1$H NMR (400 Hz, DMSO-d$_6$, 25° C.): δ (ppm)=10.76 (d, J=12 Hz, N—H), 8.38 (s, Ar—H), 8.08 (d, J=8 Hz, Ar—H), 8.03 (s, Ar—H), 7.80 (s, Ar—H), 7.60 (s, Ar—H), 7.56 (s, Ar—H).

PAA(SSDA-BPDA): The amounts of the used reactant and solvent were as the following: SSDA (615 mg, 2.50 mmol), BPDA (735 mg, 2.50 mmol), DMAc (7.65 g). Molecular weight estimated from SEC: M$n$=35.7 kDa, M$_w$=65.3 kDa, Đ=1.83. IR (KBr, n, cm$^{-1}$): 3200-3600 (O—H stretching), 1584, 1660 (N—H bending). $^1$H NMR (400 Hz, DMSO-d$_6$, 25° C.): δ (ppm)=10.63 (s, N—H), 8.26 (d, J=20 Hz, Ar—H), 8.12 (s, Ar—H), 8.07 (s, Ar—H), 8.02 (s, Ar—H), 7.97 (s, Ar—H), 7.72 (s, Ar—H), 7.59 (s, Ar—H), 7.59 (s, Ar—H).

PAA(SODA-PMDA): The amounts of the used reactant and solvent were as the following: SODA (575 mg, 2.50 mmol), PMDA (545 mg, 2.50 mmol), DMAc (6.35 g). Molecular weight estimated from SEC: M$_n$=33.9 kDa, M$_w$=70.8 kDa, Đ=2.09. IR (KBr, n, cm$^{-1}$): 3200-3600 (O—H stretching), 1602, 1660 (N—H bending). $^1$H NMR (400 Hz, DMSO-d$_6$, 25° C.): δ (ppm)=10.68 (q, J=16 Hz, N—H), 8.37 (d, J=4 Hz, Ar—H), 8.02 (d, J=4 Hz, Ar—H), 7.79 (d, J=4 Hz, Ar—H), 7.68 (q, J=16 Hz, Ar—H), 7.36 (m, Ar—H), 7.19 (m, Ar—H).

PAA(SODA-BPDA): The amounts of the used reactant and solvent were as the following: SODA (575 mg, 2.50 mmol), BPDA (735 mg, 2.50 mmol), DMAc (7.42 g). Molecular weight estimated from SEC: M$_n$=35.8 kDa, M$_w$=66.9 kDa, Đ=1.87. IR (KBr, n, cm$^{-1}$): 3200-3600 (O—H stretching), 1602, 1656 (N—H bending). $^1$H NMR (400 Hz, DMSO-d$_6$, 25° C.): δ (ppm)=10.66 (d, J=36 Hz, N—H), 8.28 (d, J=24 Hz, Ar—H), 8.14 (s, Ar—H), 8.05 (s, Ar—H), 8.00 (s, Ar—H), 7.99 (s, Ar—H), 7.71 (d, J=16 Hz, Ar—H), 7.48 (d, J=40 Hz, Ar—H), 7.19 (d, J=44 Hz, Ar—H).

PAA(OODA-PMDA): The amounts of the used reactant and solvent were as the following: OODA (603 mg, 2.50 mmol), PMDA (545 mg, 2.50 mmol), DMAc (6.50 g). Molecular weight estimated from SEC: M$_n$=34.2 kDa, M$_w$=57.4 kDa, Đ=1.68. IR (KBr, n, cm$^{-1}$): 3200-3600 (O—H stretching), 1546, 1660 (N—H bending). $^1$H NMR (400 Hz, DMSO-d$_6$, 25° C.): δ (ppm)=10.60 (d, J=12 Hz, N—H), 8.36 (s, Ar—H), 8.00 (s, Ar—H), 7.76 (s, Ar—H), 7.48 (s, Ar—H), 7.25 (s, Ar—H), 7.06 (s, Ar—H).

PAA(OODA-BPDA): The amounts of the used reactant and solvent were as the following: OODA (603 mg, 2.50 mmol), BPDA (735 mg, 2.50 mmol), DMAc (7.58 g). Molecular weight estimated from SEC: M$_n$=36.4 kDa, M$_w$=62.9 kDa, Đ=1.73. IR (KBr, n, cm$^{-1}$): 3200-3600 (O—H stretching), 1550, 1602 (N—H bending). $^1$H NMR (400 Hz, DMSO-d$_6$, 25° C.): δ (ppm)=10.55 (s, N—H), 8.27 (d, J=20 Hz, Ar—H), 8.14 (s, Ar—H), 8.04 (s, Ar—H), 7.98 (s, Ar—H), 7.75 (s, Ar—H), 7.51 (s, Ar—H), 7.26 (s, Ar—H), 7.05 (s, Ar—H).

Synthesis of co-PI PI(OODA-PmBn): PAAs and PI films were prepared similarly to the above-mentioned procedure. For the copolymerization, the diamine OODA were dissolved in DMAc followed by the equimolar amounts of dianhydrides, PMDA and BPDA, with the feed ratio (m:n) as 10:0, 7:3, 5:5, 3:7, and 0:10. The co-PIs are named as PI(OODA-PmBn) based on the molar ratio between PMDA and BPDA.

PAA(OODA-P7B3): The amounts of the used reactant and solvent were as the following: OODA (603 mg, 2.50 mmol), PMDA (382 mg, 1.75 mmol), BPDA (221 mg, 0.750 mmol), DMAc (6.83 g). Molecular weight estimated from SEC: $M_n$=34.3 kDa, $M_w$=63.1 kDa, D=1.84. IR (KBr, n, cm$^{-1}$): 3200-3600 (O—H stretching), 1552, 1604 (N—H bending). $^1$H NMR (400 Hz, DMSO-d$_6$, 25° C.): δ (ppm)= 10.60 (d, J=12 Hz, N—H), 10.50 (s, N—H), 8.37 (s, Ar—H), 8.29 (d, J=24 Hz, Ar—H), 8.15 (s, Ar—H), 8.05 (s, Ar—H), 8.01 (s, Ar—H), 7.77 (s, Ar—H), 7.75 (s, Ar—H), 7.52 (s, Ar—H), 7.48 (s, Ar—H), 7.26 (s, Ar—H), 7.24 (s, Ar—H), 7.06 (s, Ar—H), 7.04 (s, Ar—H).

PAA(OODA-P5B5): The amounts of the used reactant and solvent were as the following: OODA (603 mg, 2.50 mmol), PMDA (273 mg, 1.50 mmol), BPDA(367 mg, 1.50 mmol), DMAc (7.04 g). Molecular weight estimated from SEC: $M_n$=35.8 kDa, $M_w$=69.8 kDa, D=1.95. IR (KBr, n, cm$^{-1}$): 3200-3600 (O—H stretching), 1551, 1604 (N—H bending). $^1$H NMR (400 Hz, DMSO-d$_6$, 25° C.): δ (ppm)= 10.61 (d, J=24 Hz, N—H), 10.51 (s, N—H), 8.37 (s, Ar—H), 8.29 (d, J=20 Hz, Ar—H), 8.13 (s, Ar—H), 8.05 (s, Ar—H), 8.02 (s, Ar—H), 7.77 (s, Ar—H), 7.76 (s, Ar—H), 7.51 (s, Ar—H), 7.49 (s, Ar—H), 7.27 (s, Ar—H), 7.24 (s, Ar—H), 7.06 (s, Ar—H), 7.04 (s, Ar—H).

PAA(OODA-P3B7): The amounts of the used reactant and solvent were as the following: OODA (603 mg, 2.50 mmol), PMDA (164 mg, 0.750 mmol), BPDA (514.5 mg, 1.75 mmol), DMAc (7.26 g). Molecular weight estimated from SEC: M.=35.7 kDa, $M_w$=63.9 kDa, D=1.79. IR (KBr, n, cm$^{-1}$): 3200-3600 (O—H stretching), 1578, 1634 (N—H bending). $^1$H NMR (400 Hz, DMSO-d$_6$, 25° C.): δ (ppm)= 10.61 (d, J=12 Hz, N—H), 10.51 (s, N—H), 8.39 (s, Ar—H), 8.30 (d, J=20 Hz, Ar—H), 8.14 (s, Ar—H), 8.06 (s, Ar—H), 8.03 (s, Ar—H), 7.78 (s, Ar—H), 7.76 (s, Ar—H), 7.53 (s, Ar—H), 7.52 (s, Ar—H), 7.29 (s, Ar—H), 7.25 (s, Ar—H), 7.07 (s, Ar—H), 7.05 (s, Ar—H).

Characterization: For the structural characterization of the synthesized materials, $^1$H NMR and $^{13}$C NMR spectra were recorded on a Bruker DPX-300S spectrometer at the resonant frequencies at 400 MHz using deuterated dimethylsulfoxide (DMSO-d$_6$) as the solvent. FT-IR spectra were obtained by the Horiba FT-120 Fourier-transform spectrophotometer. The melting point were measured by melting point measuring apparatus (MPA-100). The molecular weight, i.e., the number average molecular weight ($M_n$) and weight average molecular weight ($M_w$) values, of the synthesized polymers were evaluated by size exclusion chromatography (SEC) using Viscotek TDL 302. Dimethylformamide contained 0.06$_M$ LiBr and 0.06$_M$ H$_3$PO$_4$ was used as an eluent at a flow rate of 1.0 ml min$^{-1}$. The inherent viscosity ([η]) of synthesized polymers was measured by an Ostwald viscometer at 30° C., and the value of intrinsic viscosity was calculated as the formula: [η]=$η_{rel}$/c, where $η_{rel}$=η/η$_0$, the relative viscosity, and c is the concentration of polymer solution (0.5 wt % in DMAc), and η and η$_0$ are the measured viscosity of polymer solution and DMAc at 30° C. respectively.

For the characterization of thermal properties, the $T_d$ was obtained by TA Q50 themogravimetric analyzer with a heating rate of 10° C. min$^{-1}$ under the nitrogen flow. The $T_g$ was measured by TA Q20 differential scanning calorimeter, heating from 50° C. to 400° C. at a heating rate of 10° C. min$^{-1}$ under nitrogen. Besides, the $T_g$ of polymer films was estimated by dynamic mechanical analysis, heating from 50° C. to 450° C. at a heating rate of 5° C. min$^{-1}$ under nitrogen, with a sinusoidal load frequency of 0.1 Hz and amplitude of 10 gf. The α-$T_g$ values were determined from the peak point of tan delta curves, which were calculated from the measured storage modulus (E') and the loss energy (E"). The CTE of PI films was measured by TA Q400 thermomechanical analysis, heating from 50° C. to 350° C. at a heating rate of 5° C. min$^{-1}$ under nitrogen. The measurement was conducted with static fixed load set as 0.05 N. The CTE values were evaluated in the range from 50° C. to 300° C. from the second heating scan.

The mechanical properties of the E, UTS, and eb were measured by mechanical testing machine (Universal testing machine) with the crosshead speed of 5 mm min-. The size of the testing film is about 20 mm for length, 3 mm for width, and 20-30 μm for thickness. The thickness of PI films was measured by a micrometer. For estimation of molecular packing coefficient ($K_P$) of PIs, densities (ρ) of PI film were measured with a solid densimeter (TWS-214E, MatsuHaku Corp.) with DI water at room temperature. The weight of testing films was about 100 mg. $K_P$ values of PI films were calculated based on the formula: $K_P$=$N_A$×$V_{vdw}$× ρ/M, where $N_A$ is the Avogadro's number, $V_{vdw}$ is the van der Waals volume of the repeating unit, and M is the molecular weight of the repeating unit. The $V_{vdw}$ values of PI models consisting of monomeric and dimeric repeating units (FIG. 5) were calculated based on the Slominski's method using the van der Waals radii reported by Bondi. The molecular geometries of the models were optimized using the density functional theory calculations at the B3LYP/6-311G(d,p) level of theory.

For the water absorption test, the film specimens were first baked at 100° C. under vacuum for 8 h. The film specimens were weighed for dried weight $W_1$. The weight of the testing film was about 100 mg. After that, the film specimens were immersed into the water bath at room temperature for 24 h, and then wiped out the droplet and weighed for wet weight $W_2$. The water absorption ratio (A %) was calculated as the formula: A %=($W_2$-$W_1$)/$W_1$×100%.

For the dielectric properties, the dielectric constant ($D_k$) and dissipation factor ($D_f$) were measured by R&S® ZVB vector network analyzer (VNA) at 10 GHz analyzed frequency. The size of film specimens is about 25 cm$^2$ for area, and 25 μm for thickness.

Fabrication of flexible organic field effect transistors: The flexible transistor devices of this embodiment based on bottom-gate-top-contact (BGTC) configuration (FIG. 1a) using PI(OODA-BPDA) or PI(OODA-P5B5) as the substrate, PAA(OODA-P5B5) as the dielectric and isoindigobithiophene based conjugated polymer (PII2T) as the semiconducting active layer.

The prepared PI films were served as the substrate for the fabrication of flexible FET with 5 cm×5 cm in dimension and carefully cleaned with water, isopropyl alcohol, and acetone, in an ultrasonic bath for 30 mins. The cleaned substrate was then dried in vacuum for 8 h before use. After that, the gold gate electrodes were deposited through the regular shadow mask with a deposition rate of 0.3-0.4 nm s$^{-1}$ at 10$^{-7}$ torr. To prepare the dielectric, the PAA(OODA-P5B5) was prepared as we mentioned previously. The diluted PAA solution (7.5 wt % in anhydrous DMAc as solvent) was then filtered through a PTFE membrane syringe filter, and spin-coated at 8000 rpm for 60 s on the substrate with gate electrodes. Thereafter, the PAA thin film was cast under vacuum at 100° C. for 2 h and cured at 200° C., 300° C., and 400° C. for 1 h, respectively, to complete full imidization. The thickness of prepared polymer dielectrics was estimated to be 420 nm. The active layer was prepared by double-printed polymer films. First, the isoindigo-based polymer solution (5 mg mL$^{-1}$ in anhydrous chloroform) was spin-coated at 2000 rpm for 30 s on the ODTS-modified silicon wafer, followed by thermal annealing under vacuum at 160° C. for 30 mins. The prepared films were then transferred and printed onto the elastomeric poly(dimethylsiloxane) (PDMS) (base/cross-linker=15:1 w/w) slabs. Afterward, the polymer/PDMS matrix was double-printed on the dielectric layer. The thickness of the active layer was determined around 50 nm. Finally, the gold top-contact source and drain electrode was deposited through the mask with a channel length and width of 50 and 1000 μm by the same deposition condition as deposition of gate electrode.

The OFET characteristics were examined through a Keithly 4200-SCS semiconductor parameter analyzer (Keithly Instruments Inc., Cleveland, OH), with a Remote PreAmp (4200-PA) in a N$_2$-filled glove box at room temperature. The charge mobility ($\mu_h$) and threshold voltage ($V_{TH}$) were estimated, respectively, from the slope and intercept of the linear plot of square root of drain-to-source current ($I_{DS}^{1/2}$) to the gate voltage ($V_G$) as shown in the following equation in the saturation regime: $I_{DS}=(W \times C_s \times \mu_h)\times(V_G-V_{TH})^2/2L$, where W and L are the channel width and length. $C_s$ is the areal capacitance of polymeric dielectrics, which can be measured in metal-insulator-metal (MIM) configuration at 10$^4$ Hz through a Keithly 4200-SCS semiconductor parameter analyzer.

B. Results and Discussions a). Synthesis of Polyimide

Figure 3:
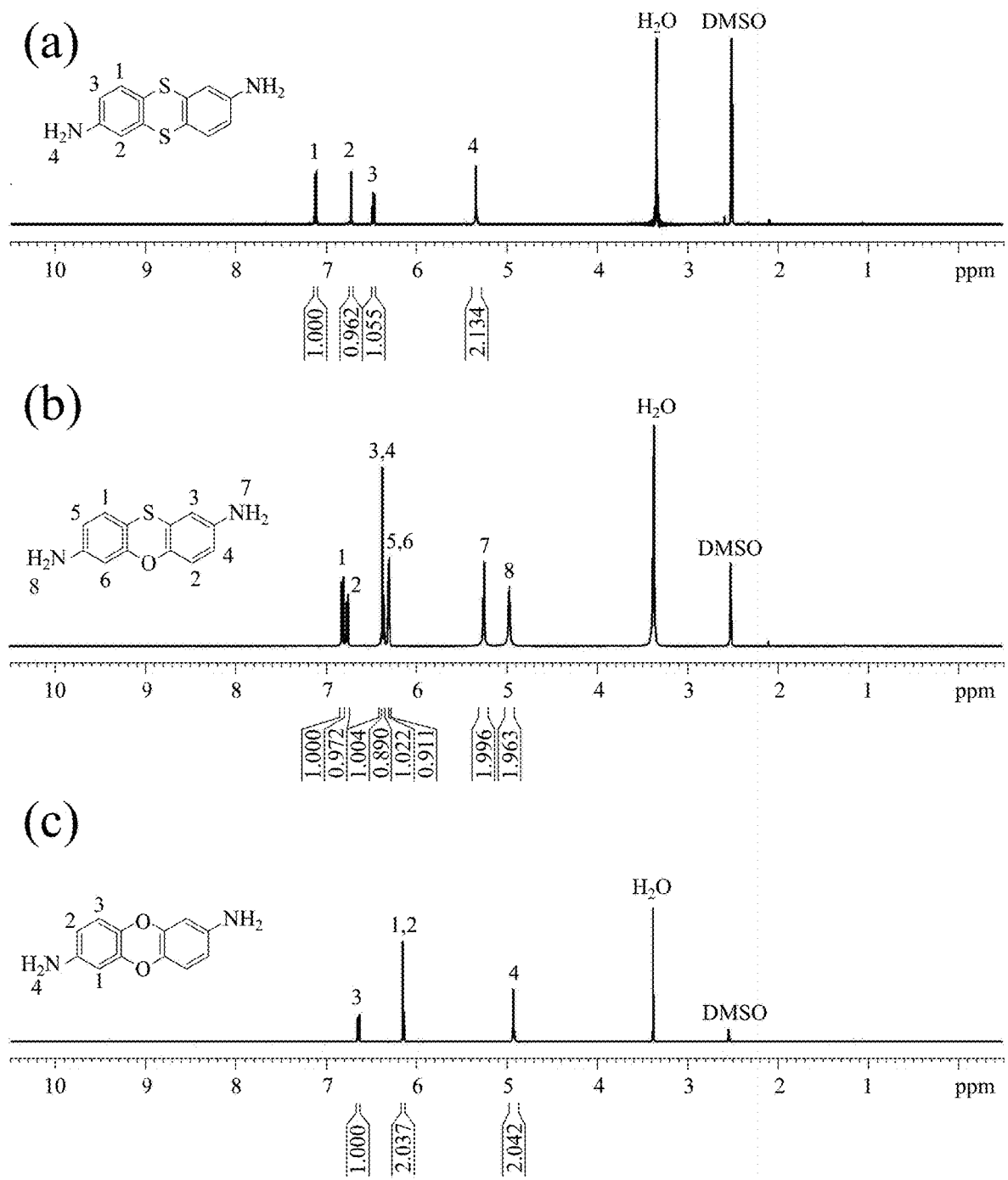
FIG. 3 shows the $^1$H NMR spectrum of (a) SSDA, (b) SODA, and (c) OODA in DMSO-d$_6$ according to a preferred embodiment of the present invention.
Figure 4:
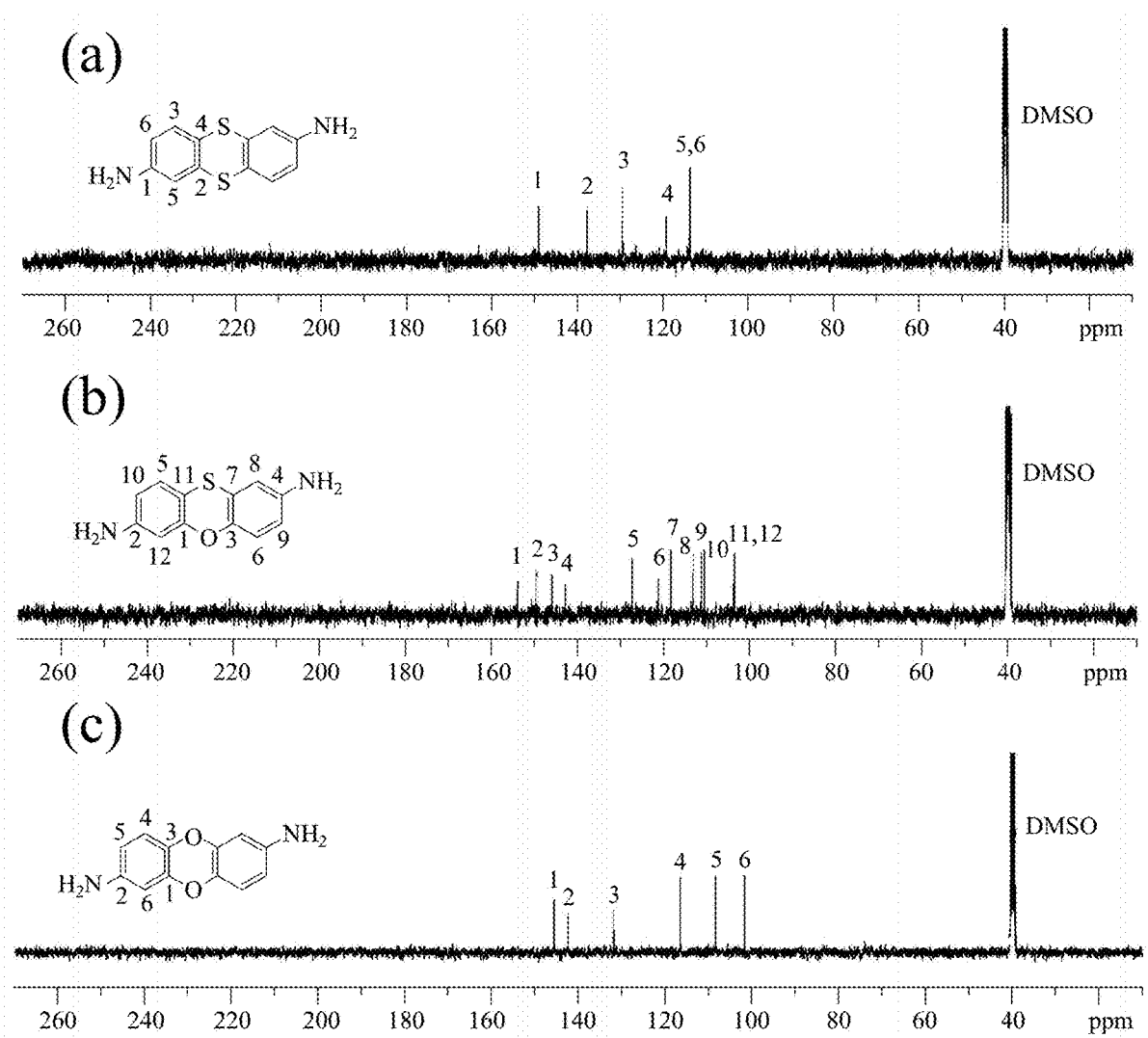
FIG. 4 shows the $^{13}$C NMR spectrum of (a) SSDA, (b) SODA, and (c) OODA in DMSO-d$_6$ according to a preferred embodiment of the present invention.
Figure 7A:
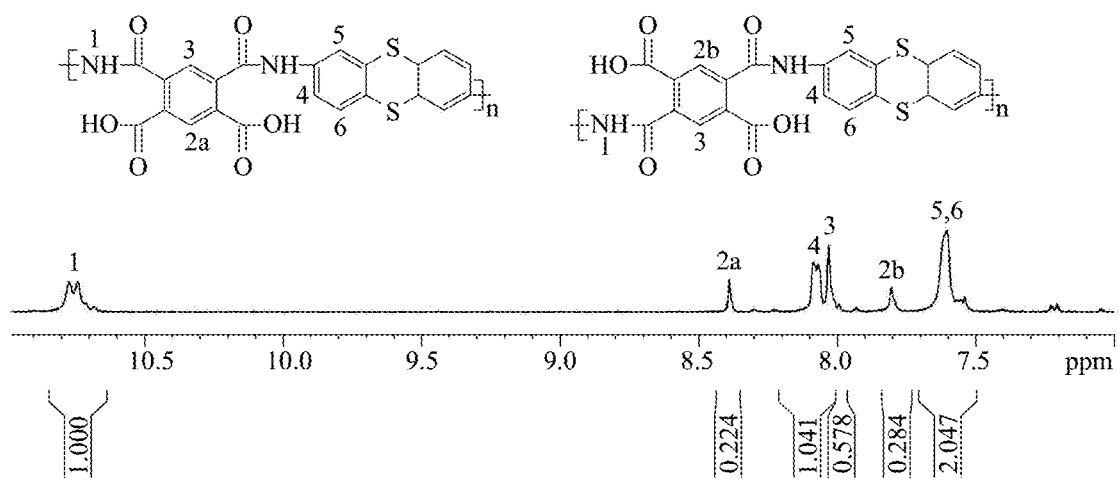
FIG. 7 shows the $^1$H NMR spectrum of the synthesized polyimide-based copolymers (precursors of polyimide), (a) PAA(SSDA-PMDA), (b) PAA(SSDA-BPDA), (c) PAA(SODA-PMDA), (d) PAA(SODA-BPDA), (e) PAA(OODA-PMDA) and (f) PAA(OODA-BPDA) in DMSO-d$_6$ according to a preferred embodiment of the present invention.
Figure 7B:
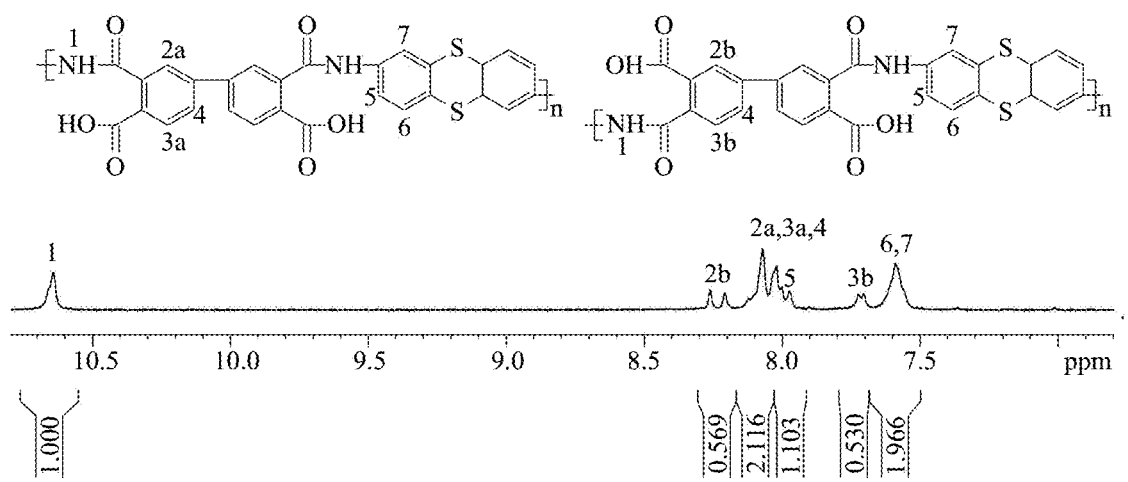
Figure 7C:
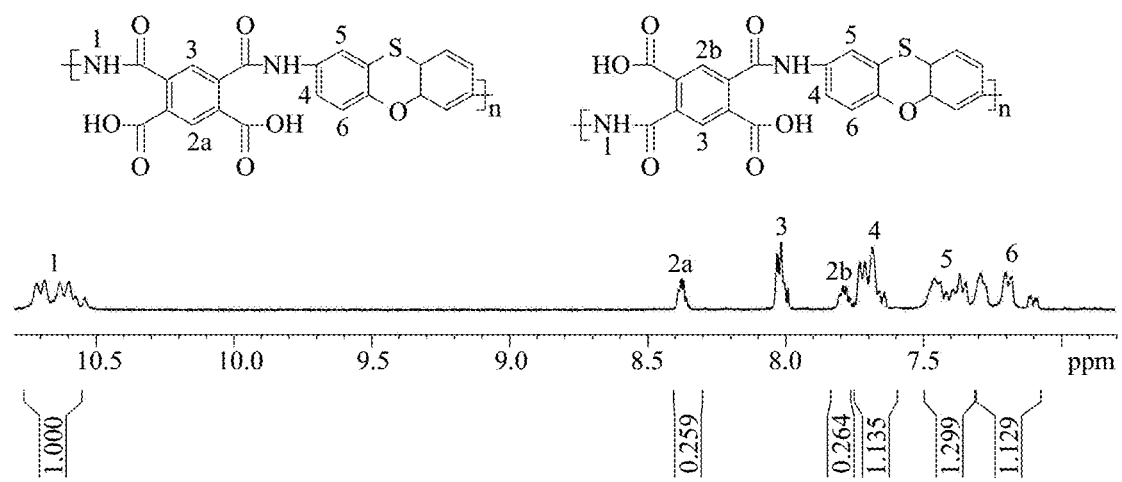
Figure 7D:
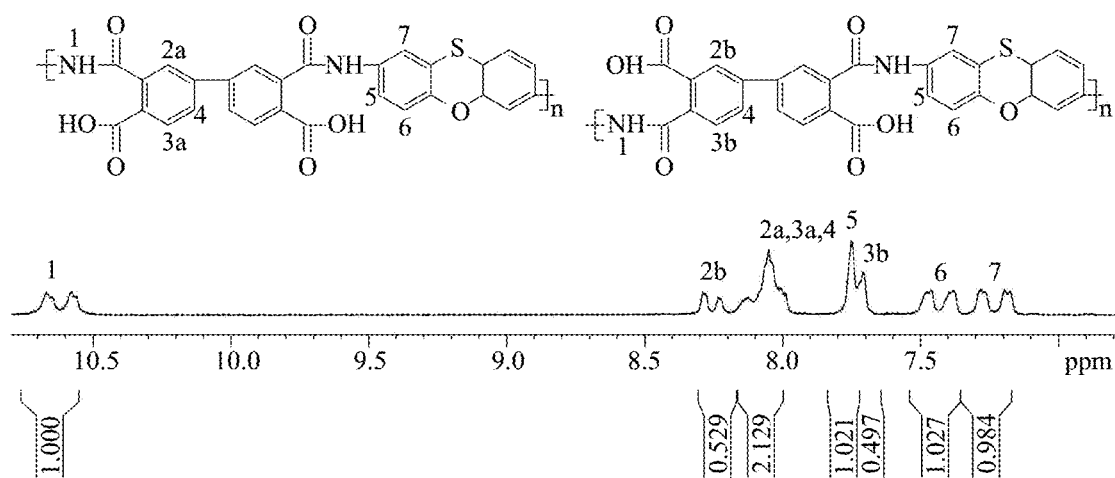
Figure 7E:
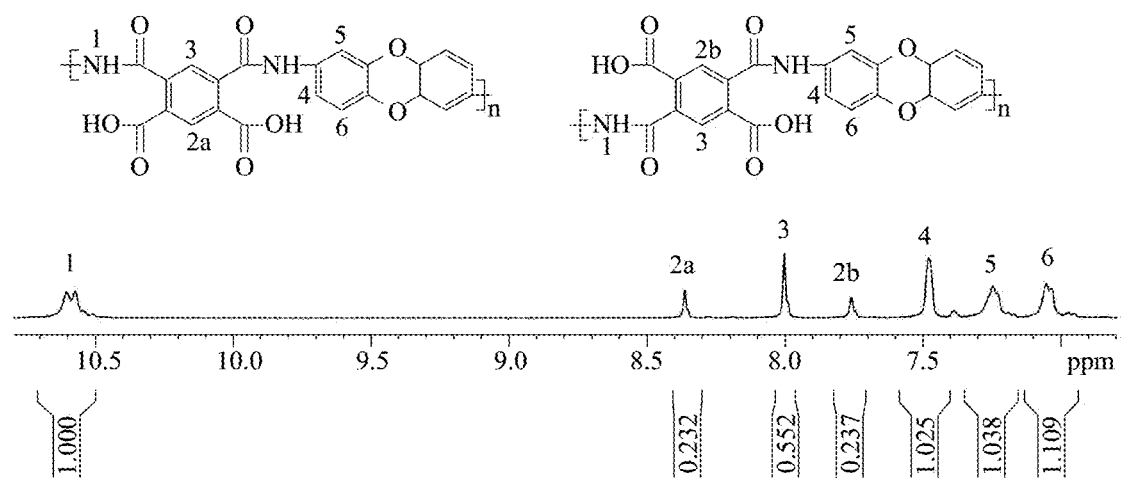
Figure 7F:
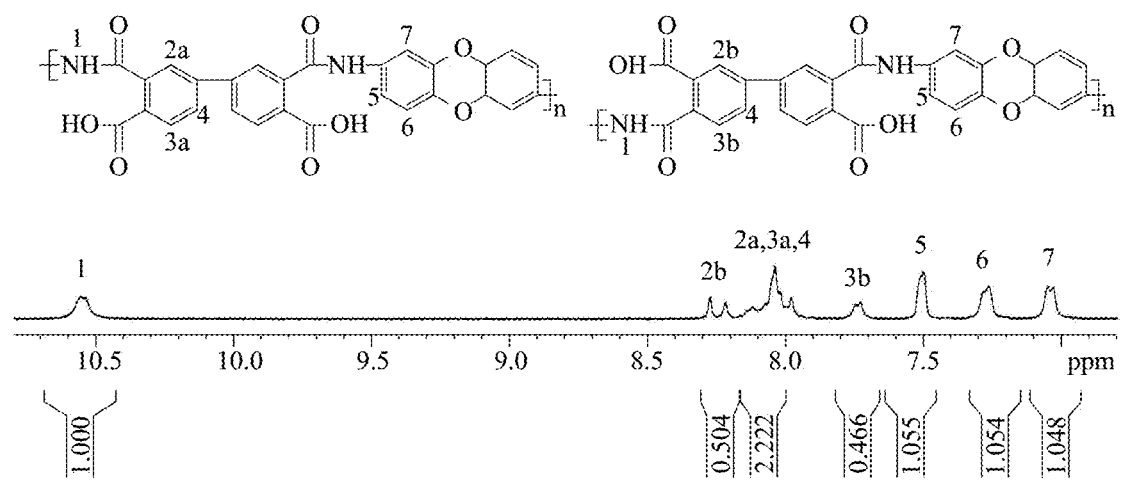
Figure 8A:
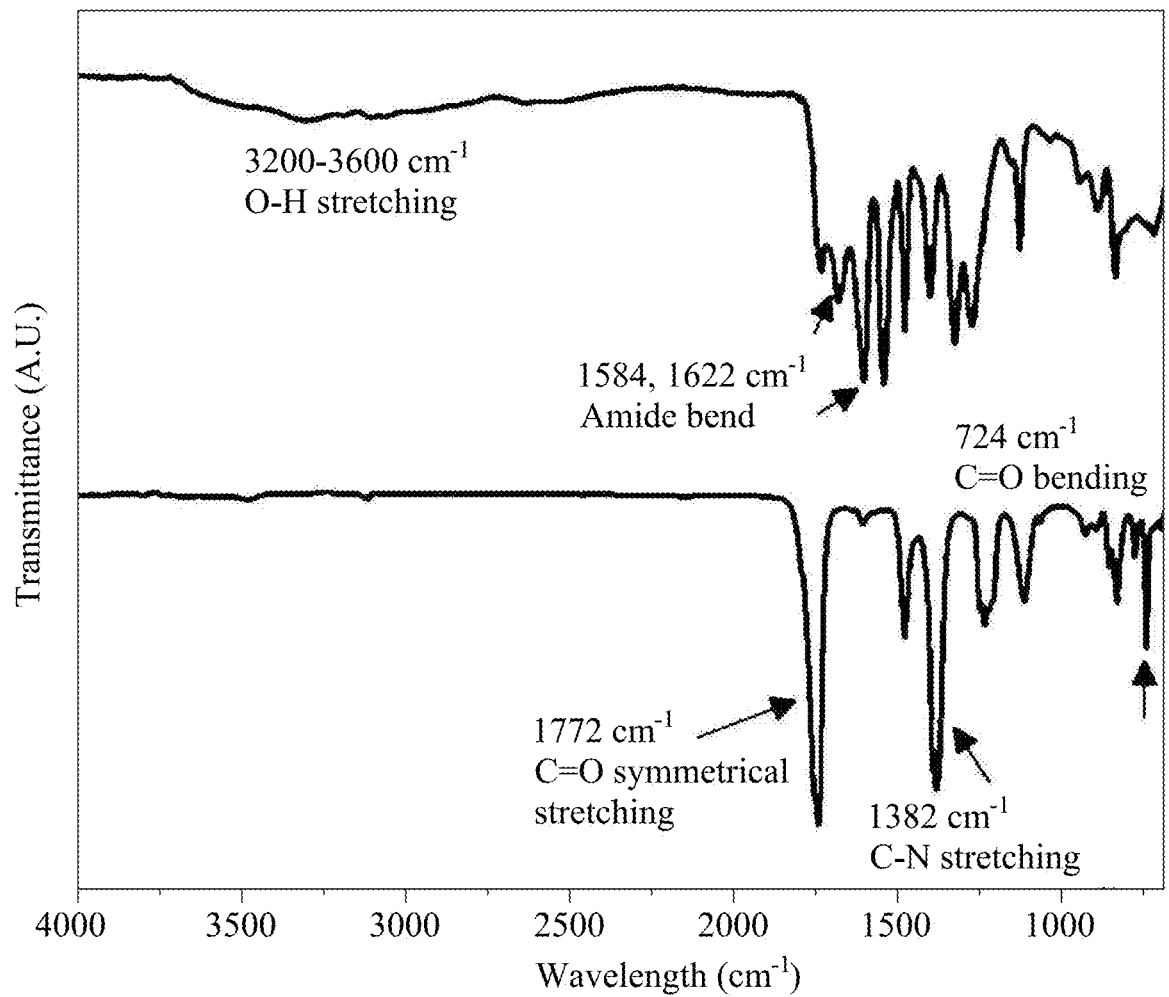
FIG. 8 shows the FT-IR spectrum of the synthesized polyimide-based copolymers, (a) PI(SSDA-PMDA), (b) PI(SSDA-BPDA), (c) PI(SODA-PMDA), (d) PI(SODA-BPDA), (e) PI(OODA-PMDA), (f) PI(OODA-BPDA), (g) PI(OODA-P7B3), (h) PI(OODA-P5B5), and (i) PI(OODA-P3B7), according to a preferred embodiment of the present invention.
Figure 8B:
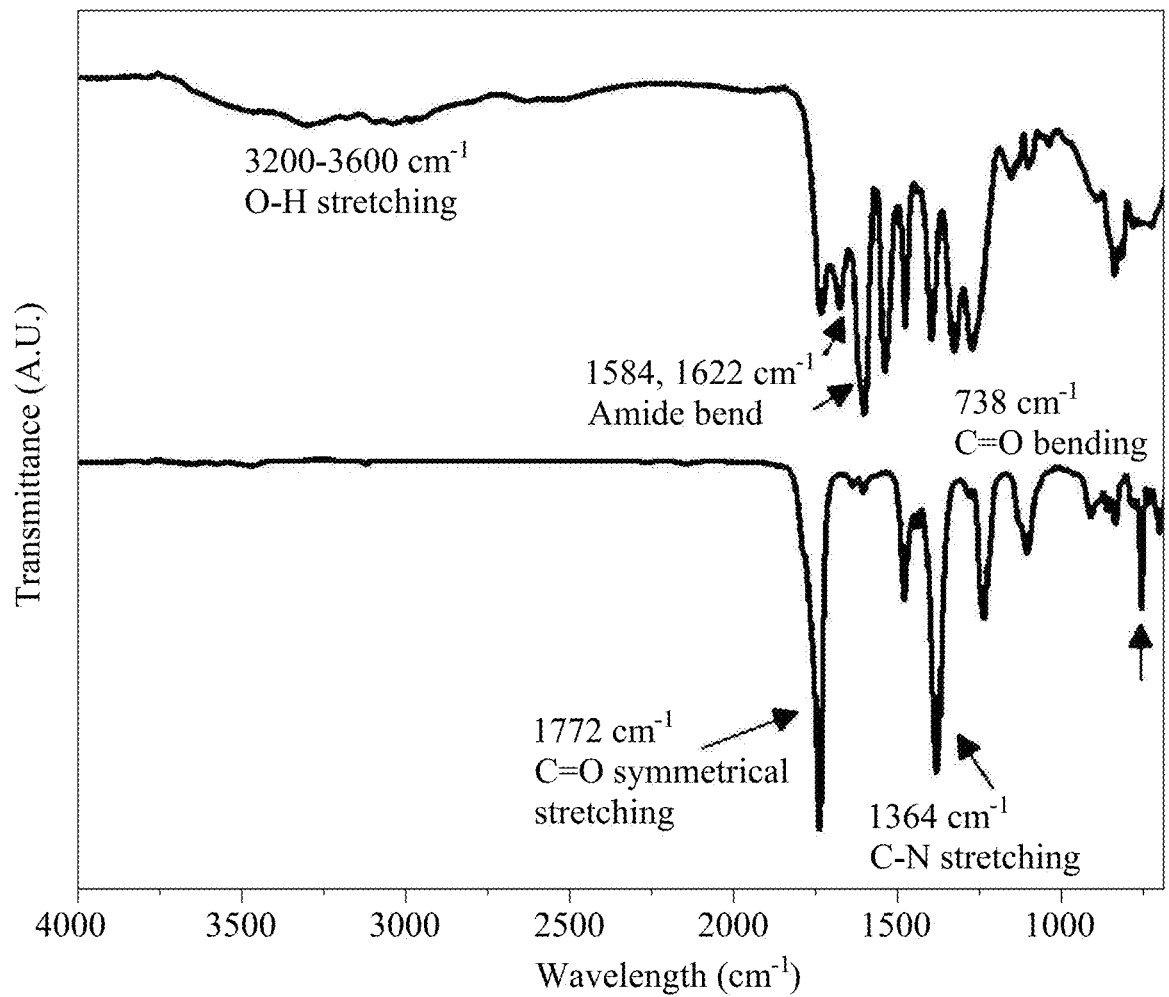
Figure 8C:
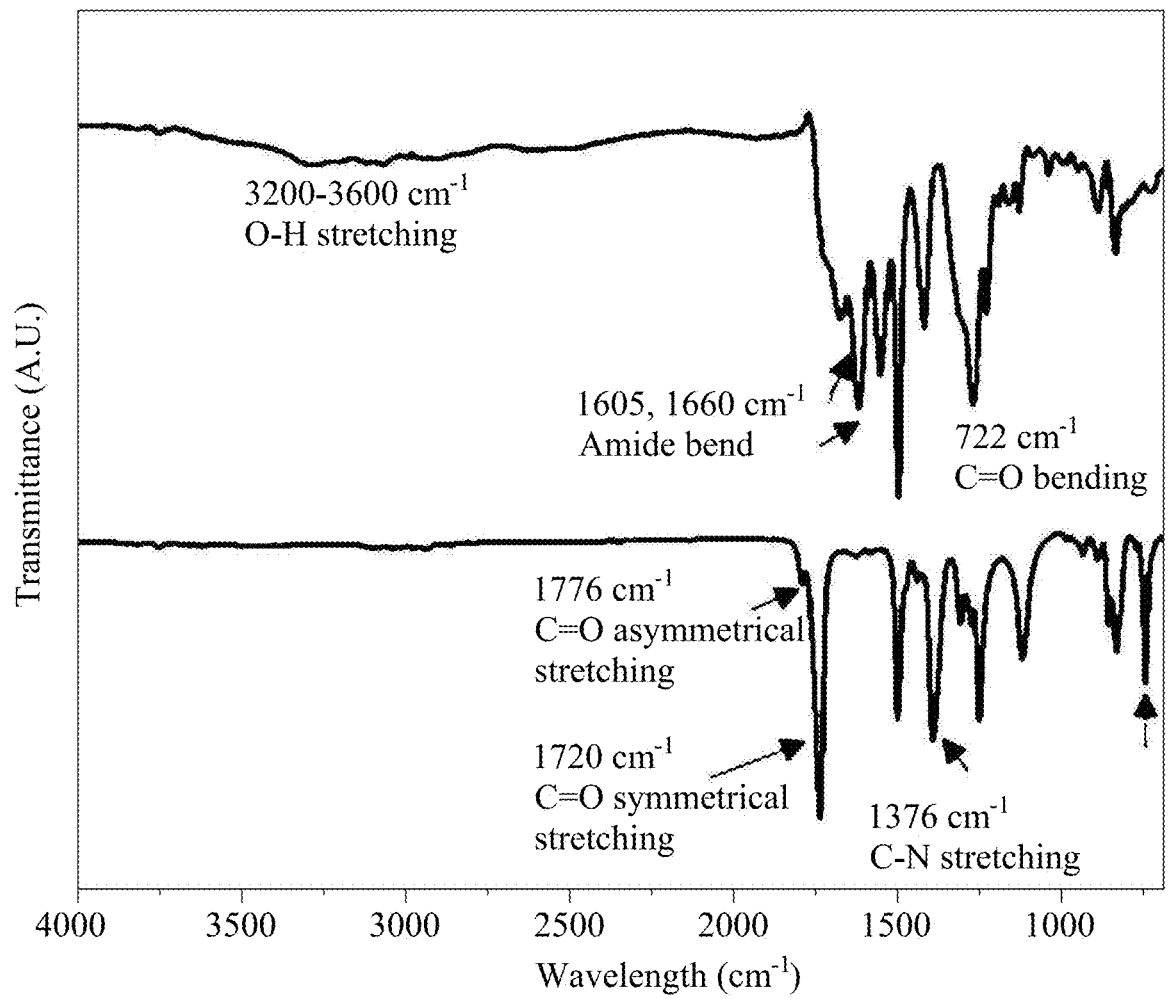
Figure 8D:
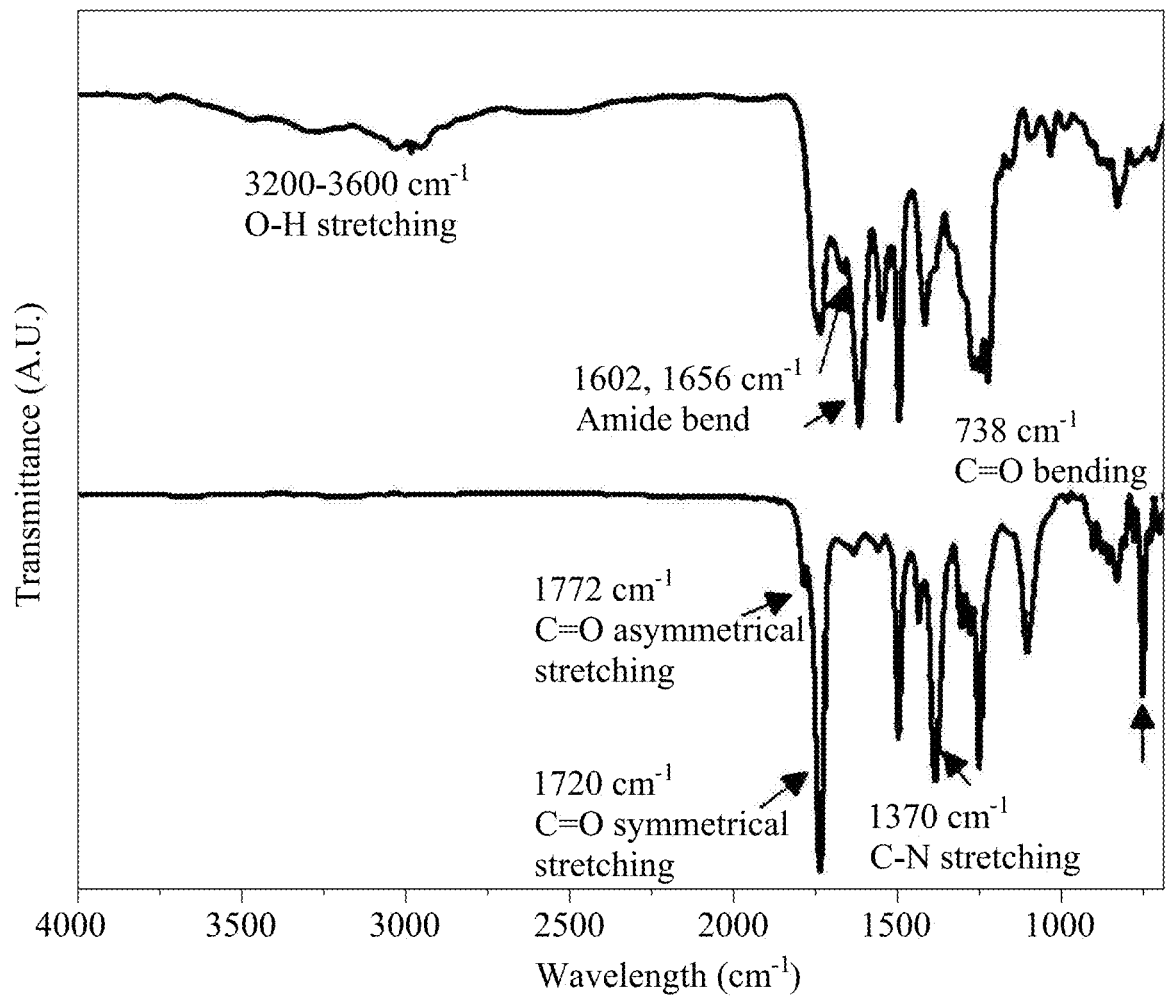
Figure 8E:
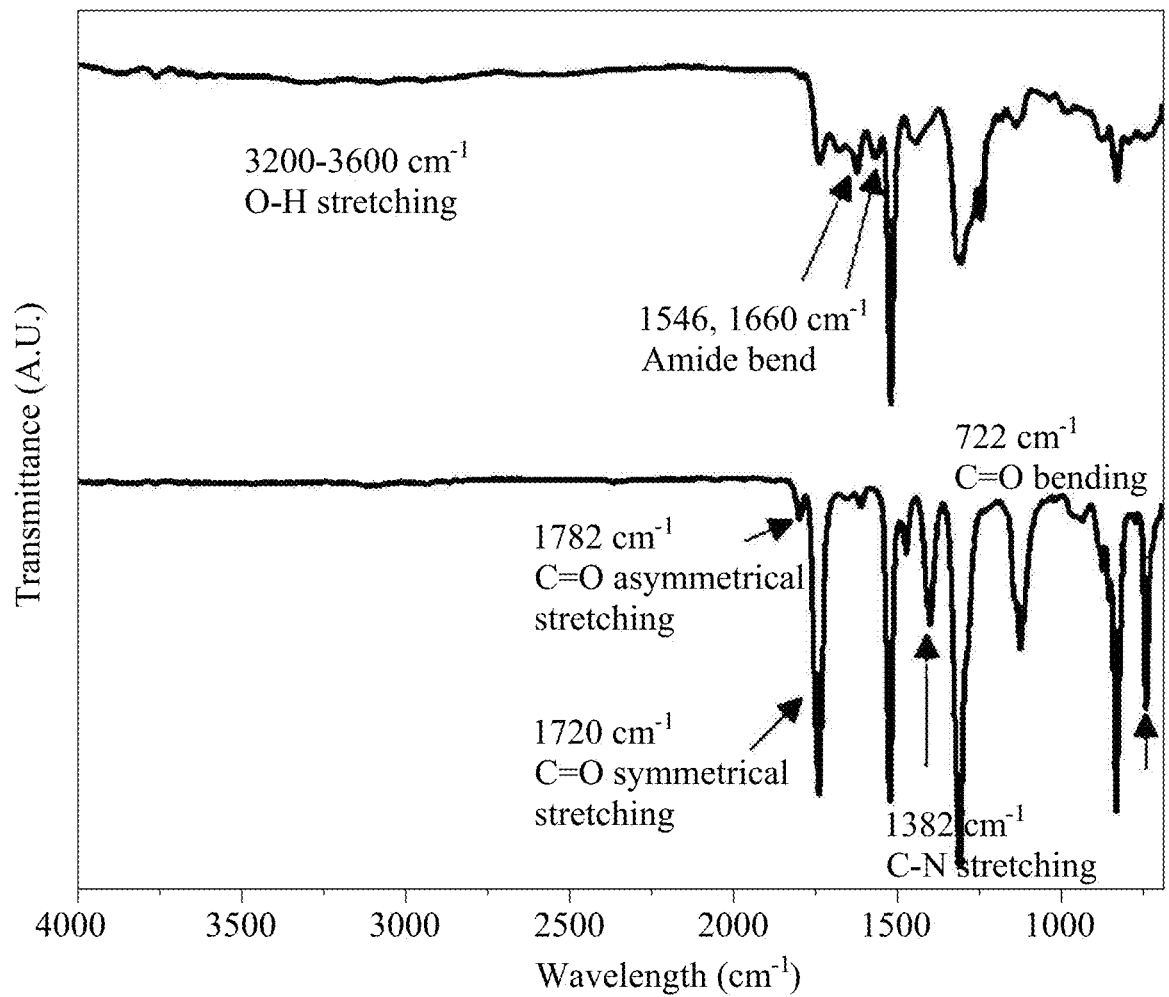
Figure 8F:
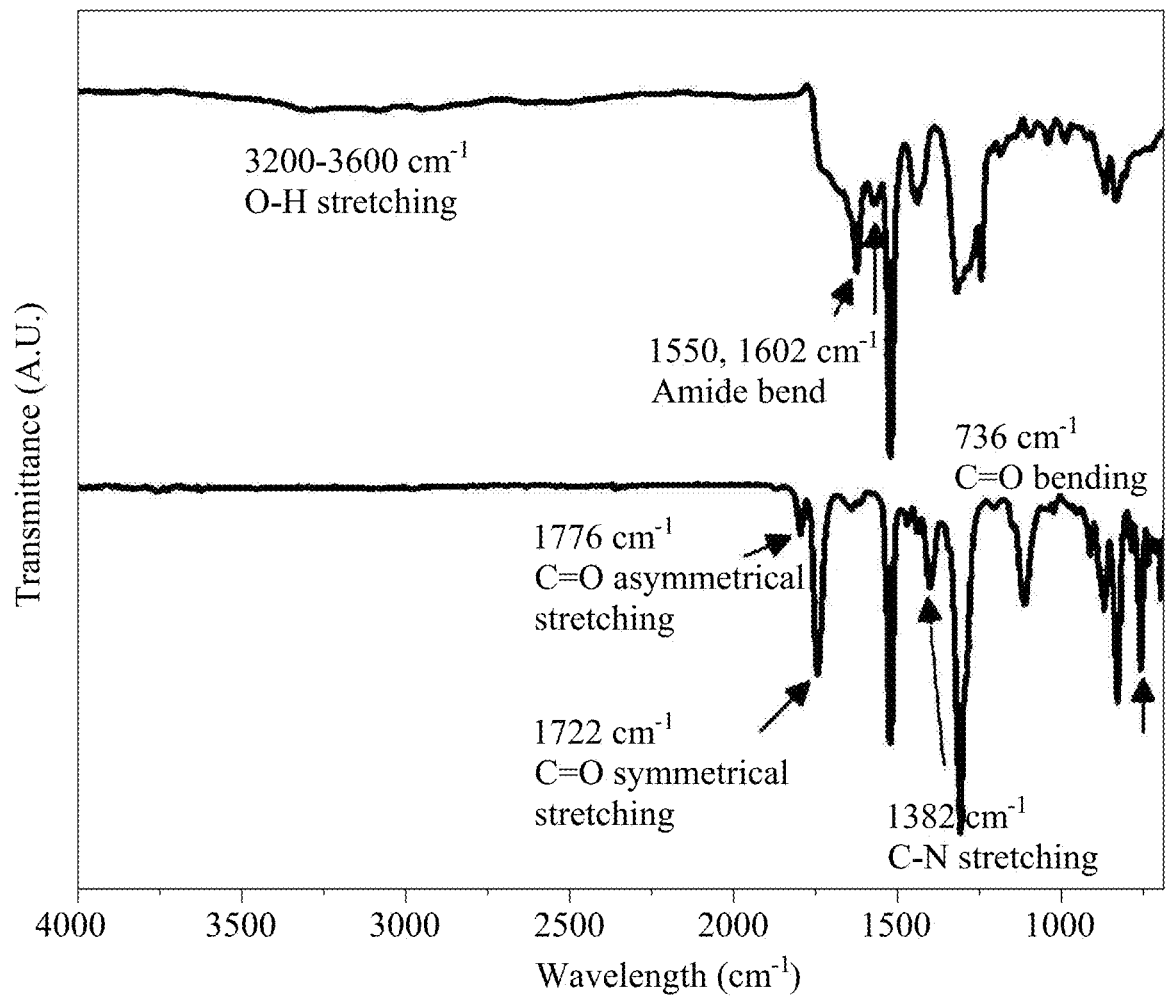
Figure 8G:
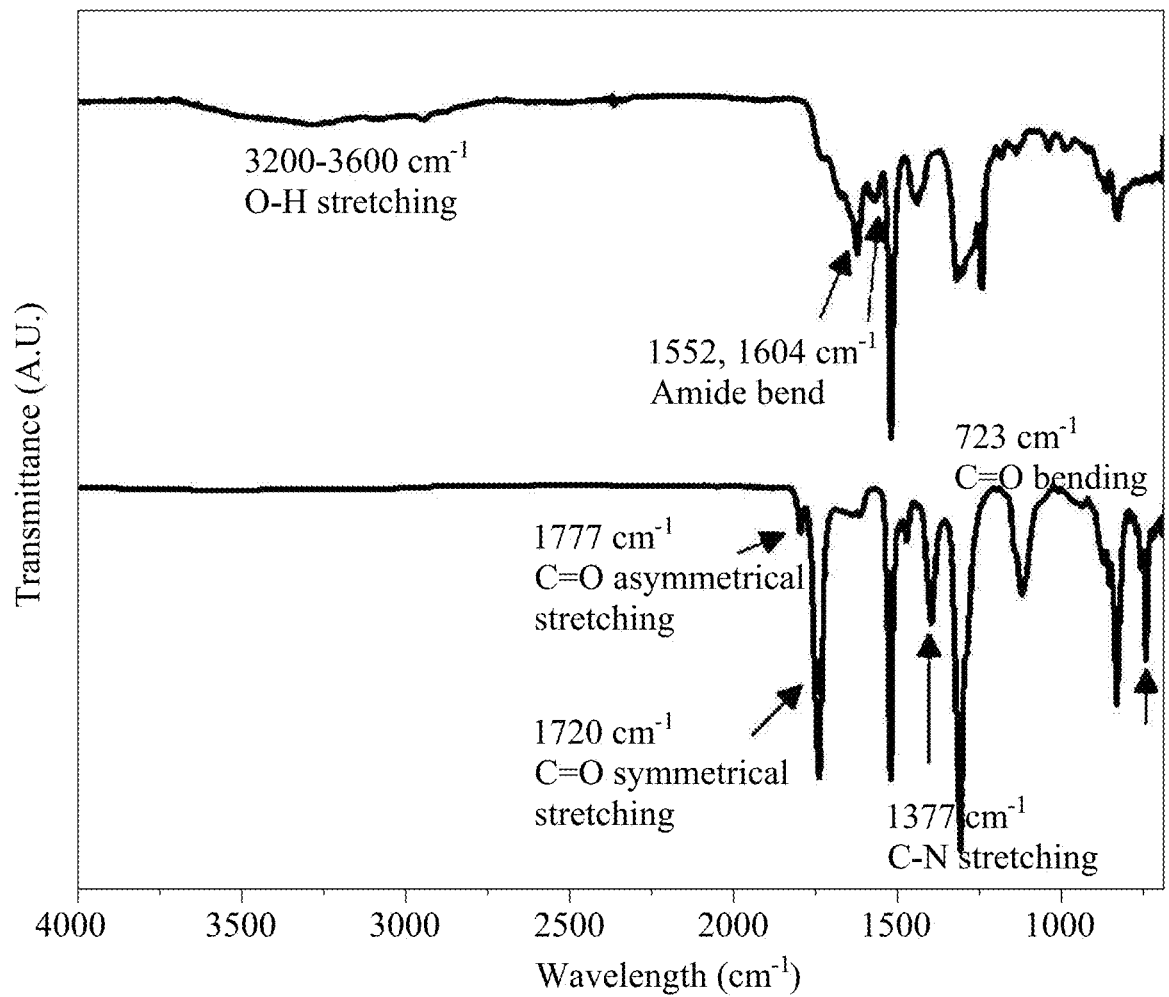
Figure 8H:
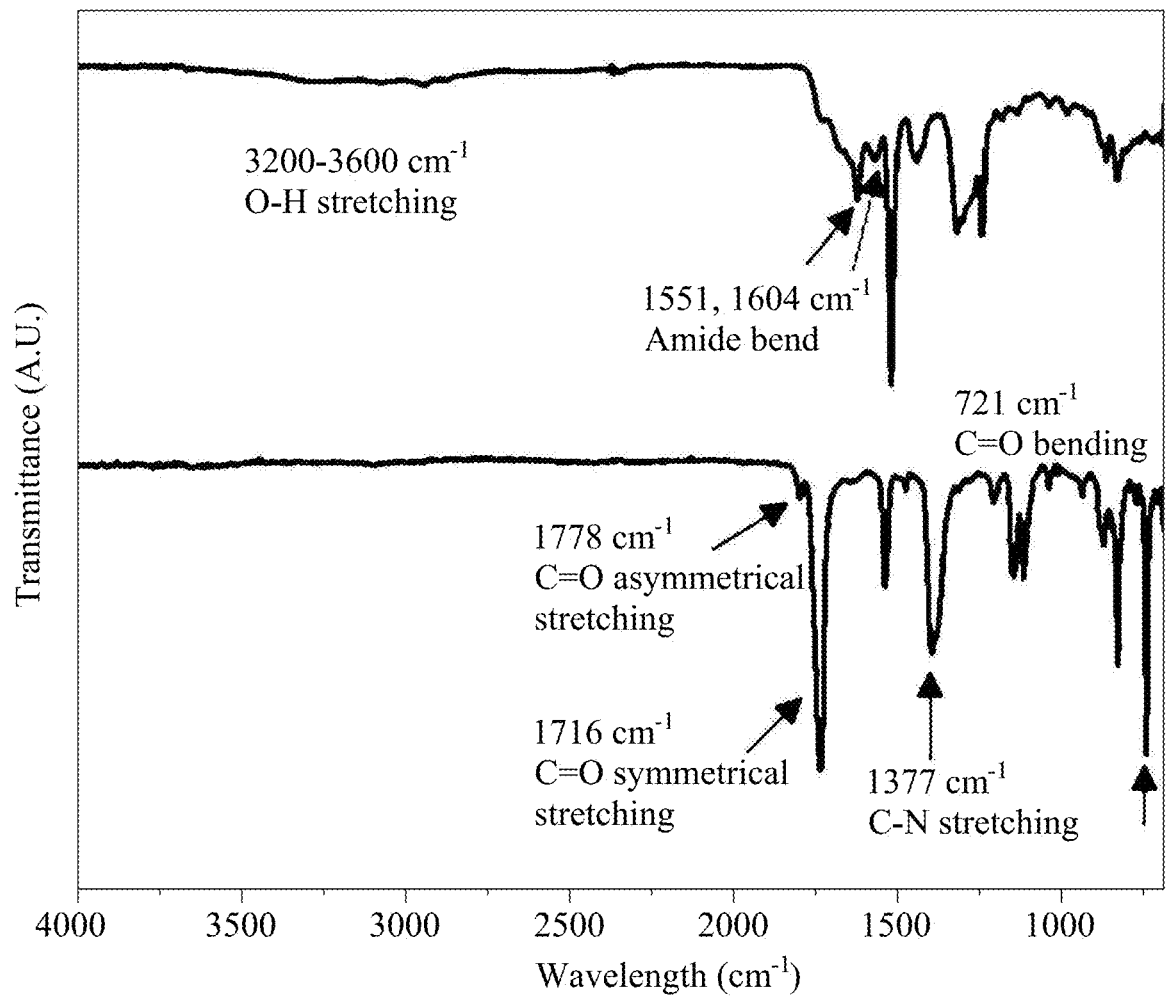
Figure 8I:
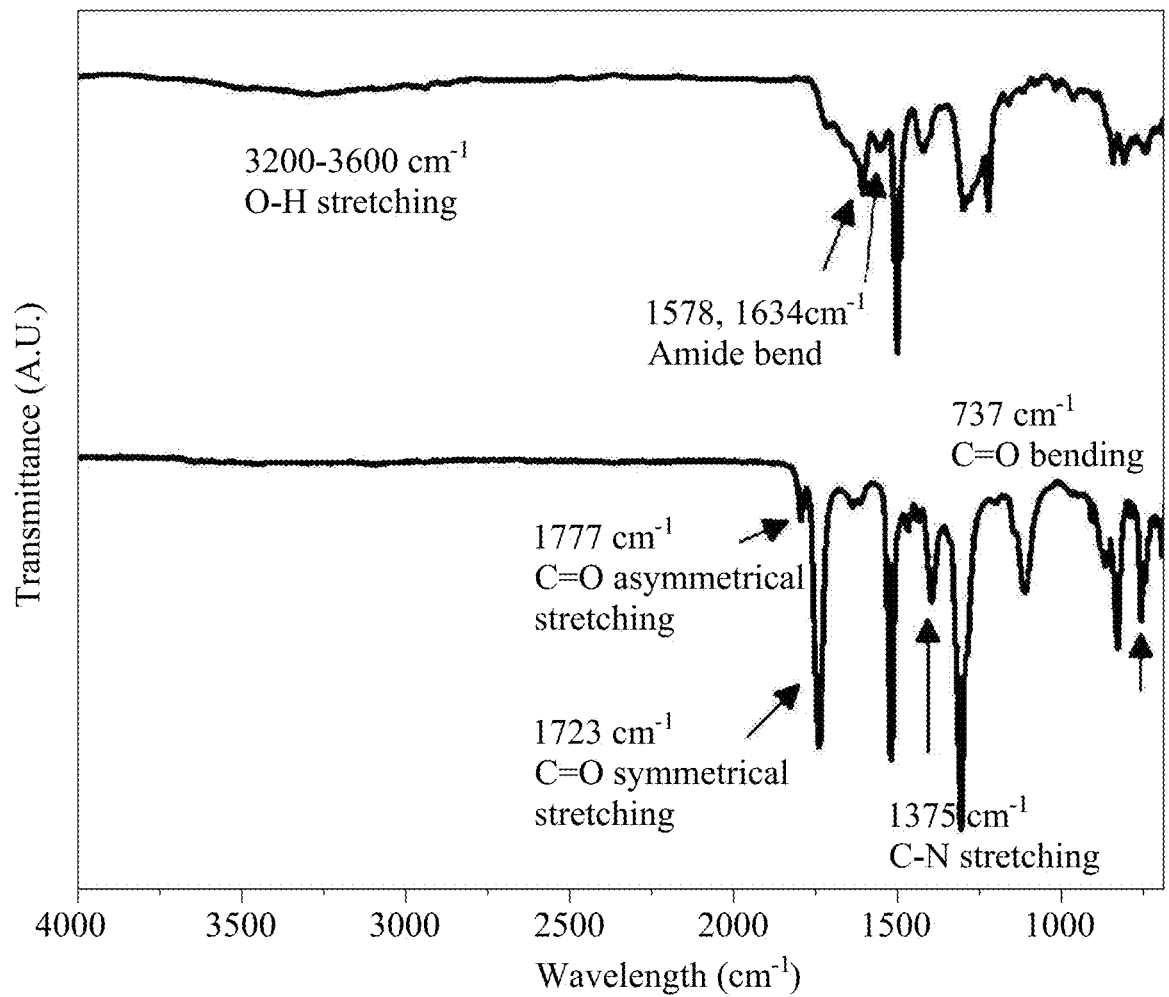
Figure 9:
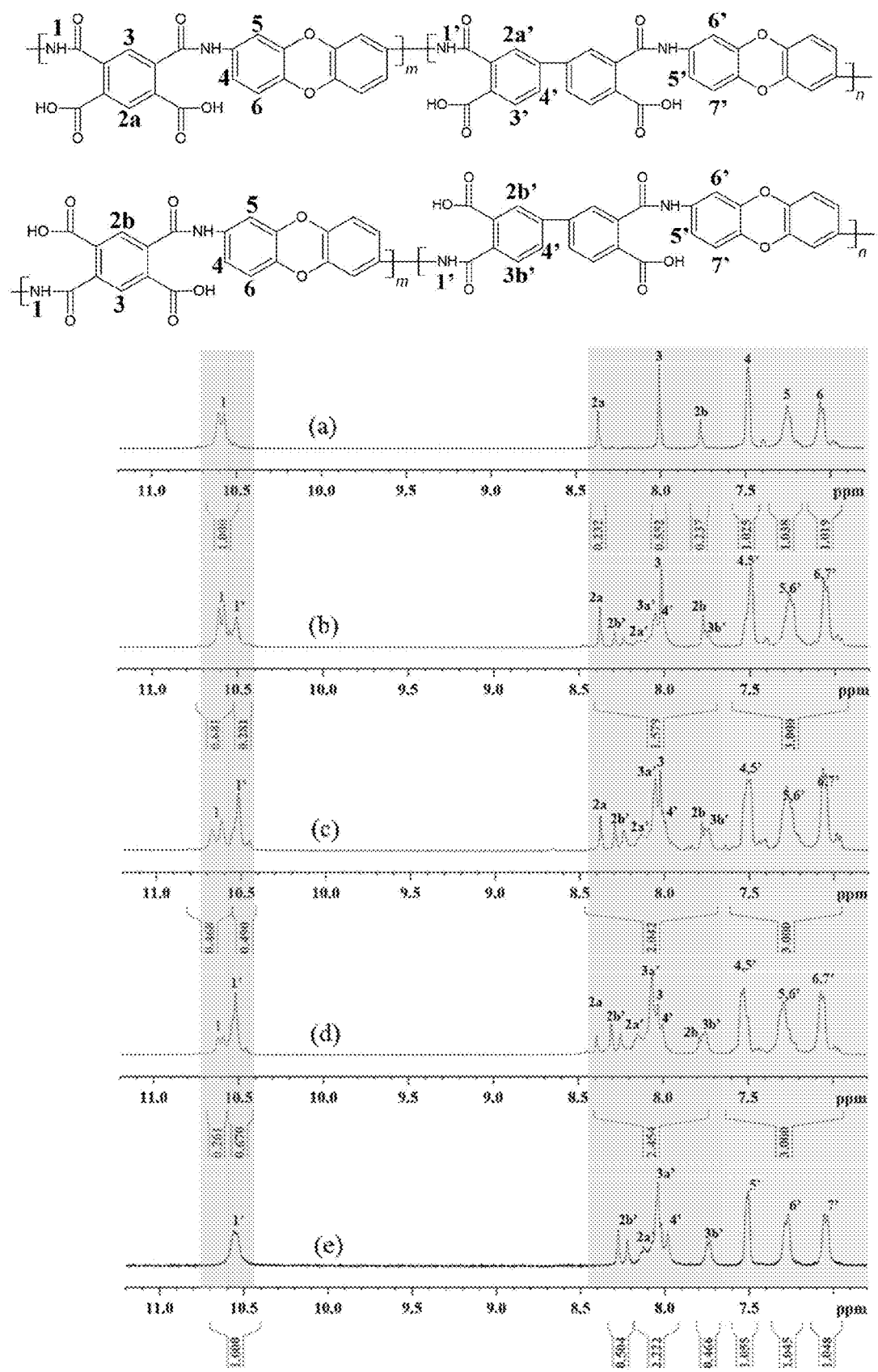
FIG. 9 shows the $^1$H NMR spectrum of the synthesized polyimide-based copolymer PAA(OODA-PmBn) in DMSO-$d_6$ according to a preferred embodiment of the present invention, where the feed ratios of PMDA to BPDA were set as m:n=(a) 10:0, (b) 7:3, (c) 5:5, (d) 3:7, (e) 0:10.

In this embodiment, three kinds of diamines (SSDA, SODA, and OODA) having two ether or thioether linkages between two benzene rings were prepared and copolymerized with PMDA or BPDA for PIs as shown in FIGS. 6a and 6b. The formation of poly(amic acid) (PAA) precursors is due to the nucleophilic reaction between the amino group of diamines and the carbonyl group of dianhydrides. The structural characterizations of the synthesized diamines (SSDA, SODA, and OODA), PAA and PI were well characterized by $^1$H NMR and FTIR as shown in FIGS. 7, 3 and 4. The prepared PAAs have two form of isomers with different steric structures due to the ring opening of anhydride via the addition reaction. For example, the characteristic signals for the amide group of PAAs derived from PMDA and BPDA in FIG. 7 are observed in the range of 10.4-10.6 and 10.6-10.9 ppm respectively. The molar composition of PMDA and BPDA in the PIs is calculated from the integral values of signals<10.6 ppm with signals>10.6 ppm for the amide group, which is consistent with the theoretical feeding ratio. The transformation of PAA to PI was confirmed with FT-IR spectroscopy (FIG. 8). The disappearance of the broad band at 3,200-3,600 cm$^{-1}$ of stretching O—H bond indicates that the imidization was completed. The intrinsic properties of synthesized PIs such as molecular weight and inherent viscosity are summarized in Table 1. The sufficiently high molecular weight (about 30 to 40 kDa) and inherent viscosity (above 1 dL g$^{-1}$) of the synthesized PAAs ensure the formation of tough and flexible PI films. All of the above characterization results suggest the successful preparation of the target polyimides. The structural characterizations of the synthesized copolyimides, PI(OODA-PmBn), from the PMDA and BPDA dianhydrides with the OODA diamine are also illustrated in FIG. 9.

TABLE 1

Molecular weight, dielectric properties and water absorption of polyimides of the embodiment.

| Nomenclature of the synthesized PI | $M_n^a$ (kDa) | $M_w^a$ (kDa) | $Đ^a$ | $[\eta]^b$ (dL/g) | $D_k^c$ | $D_f^c$ | $\rho^d$ (g/cm$^3$) | $K_P^e$ | A%$^f$ |
|---|---|---|---|---|---|---|---|---|---|
| PI(SSDA-PMDA) | 30.2 | 57.5 | 1.90 | 1.12 | 3.66 | 0.007 | 1.46 | 0.675 | 0.83 |
| PI(SSDA-BPDA) | 35.7 | 65.3 | 1.83 | 1.15 | 3.51 | 0.006 | 1.42 | 0.679 | 0.84 |
| PI(SODA-PMDA) | 33.9 | 70.8 | 2.09 | 1.14 | 3.49 | 0.008 | 1.48 | 0.688 | 0.90 |
| PI(SODA-BPDA) | 35.8 | 66.9 | 1.87 | 1.17 | 3.43 | 0.006 | 1.45 | 0.697 | 0.95 |
| PI(OODA-PMDA) | 34.2 | 57.4 | 1.68 | 1.15 | 3.28 | 0.008 | 1.46 | 0.684 | 0.89 |
| PI(OODA-BPDA) | 36.4 | 62.9 | 1.73 | 1.23 | 3.19 | 0.007 | 1.45 | 0.702 | 0.94 |
| PI(OODA-P7B3) | 34.3 | 63.1 | 1.84 | 1.15 | 3.22 | 0.008 | 1.47 | 0.697 | 0.84 |
| PI(OODA-P5B5) | 35.8 | 69.8 | 1.95 | 1.19 | 3.19 | 0.008 | 1.48 | 0.706 | 0.95 |
| PI(OODA-P3B7) | 35.7 | 63.9 | 1.79 | 1.19 | 3.20 | 0.008 | 1.48 | 0.710 | 0.90 |

$^a$Determined by SEC. Đ = $M_w/M_n$.
$^b$Determined by Ostwald viscometer.
$^c$Determined by VNA at 10 GHz.
$^d$Determined by solid densimeter.
$^e$Calculated from $K_P = N_A \times \Sigma \Delta V_i \times \rho/M$
$^f$Determined by water absorption test. The detailed procedure is listed in experimental part.

Figure 10:
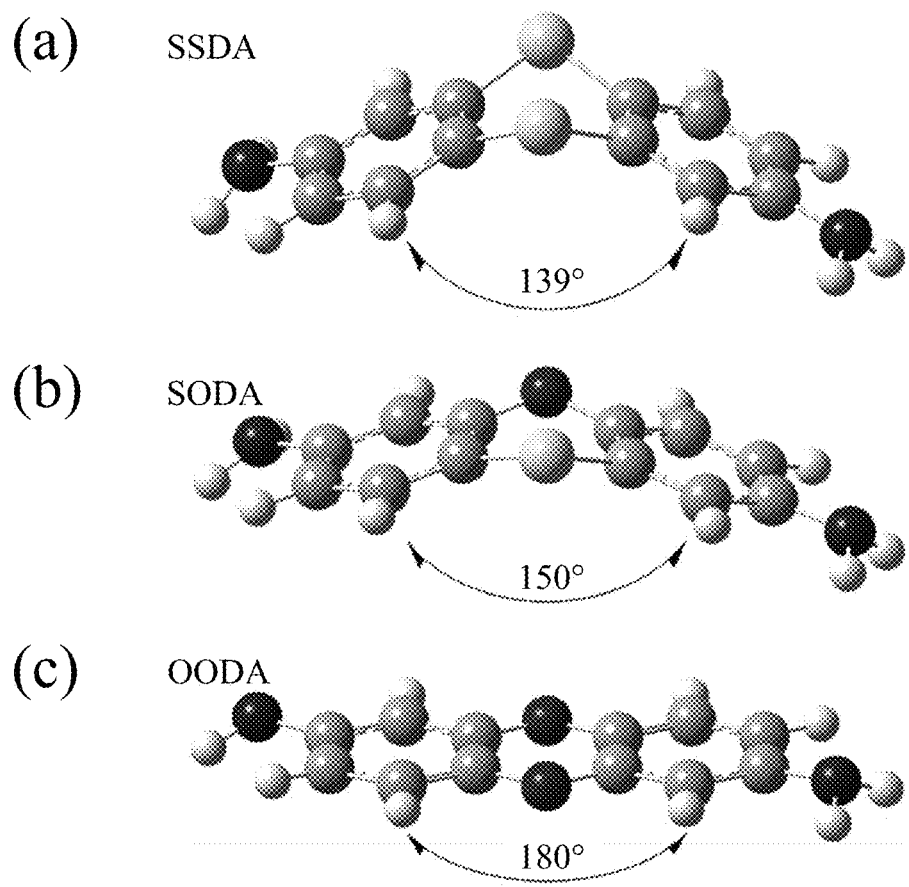
FIG. 10 shows the optimized geometries of (a) SSDA, (b) SODA, and (c) OODA diamines by DFT calculation and the dihedral angles between two benzene rings according to a preferred embodiment of the present invention.

The film densities (p), packing coefficients ($K_p$), and water absorption ratios (A %) of the PIs of the embodiment are listed in Table 1. To investigate the polymer chain packing and arrangement, the optimized geometries of the three diamines were studied and shown in FIG. 10. The dihedral angle of the diamines of the embodiment increases in the following order: SSDA (139°)<SODA (150°)<OODA (180°). Furthermore, the $K_p$ values of the PIs were estimated from the measured film densities and the calculated van der Waals volumes for the repeating unit of PIs (FIG. 5). The comparatively high film densities (about 1.5 g cm$^{-3}$) and $K_p$ values (about 0.7) indicate the molecular packing in these PI films is much denser than the conventional PI. The $K_p$ value was mainly determined by the film density. The PIs derived from BPDA exhibits increasing $K_p$ values with increasing the dihedral angles of diamines, i.e., PI(SSDA-BPDA)<PI(SODA-BPDA)<PI(OODA-BPDA). In contrast, the $K_p$ of PIs with PMDA are observed in the following order: PI(SSDA-PMDA)<PI(OODA-PMDA)<PI(SODA-PMDA). The OODA based PIs should exhibit higher $K_p$ values, however, the relatively lower film density of PI(OODA-PMDA) contributes to the lower $K_p$. This result could be due to the highly stiff backbone of PI(OODA-PMDA), which leads to a poor chain stacking and arrangement. On the other hand, the higher film densities and $K_p$ values of the prepared co-PIs (i.e., PI(OODA-PmBn)) are observed. It can be ascribed to two aspects. First, by introducing the BPDA unit, which has a rotatable biphenyl structure into the PI, the chain flexibility is improved for a better solid-state stacking. Second, the stiffness of the PI still can be maintained with PMDA and BPDA units. The above result suggests that polymer chain arrangement can be improved with the balance between structural stiffness and conformational flexibility.

Meanwhile, the water absorption of the PIs of the present invention (0.9%) is much lower than the reported value for the low CTE PI from the benzoxazole (1.3%) or benzimidazole moiety (5.0%). The PI containing the polar functional group (e.g., N—H group in benzimidazole) could form the hydrogen bonding with water molecules, leading to the increased A %. The PIs of the invention, in contrast, only contain the rigid polymer backbone to maintain A % at a low level for the request as the flexible substrate in electronic devices.

c). Thermal-Mechanical Properties

Figure 12:
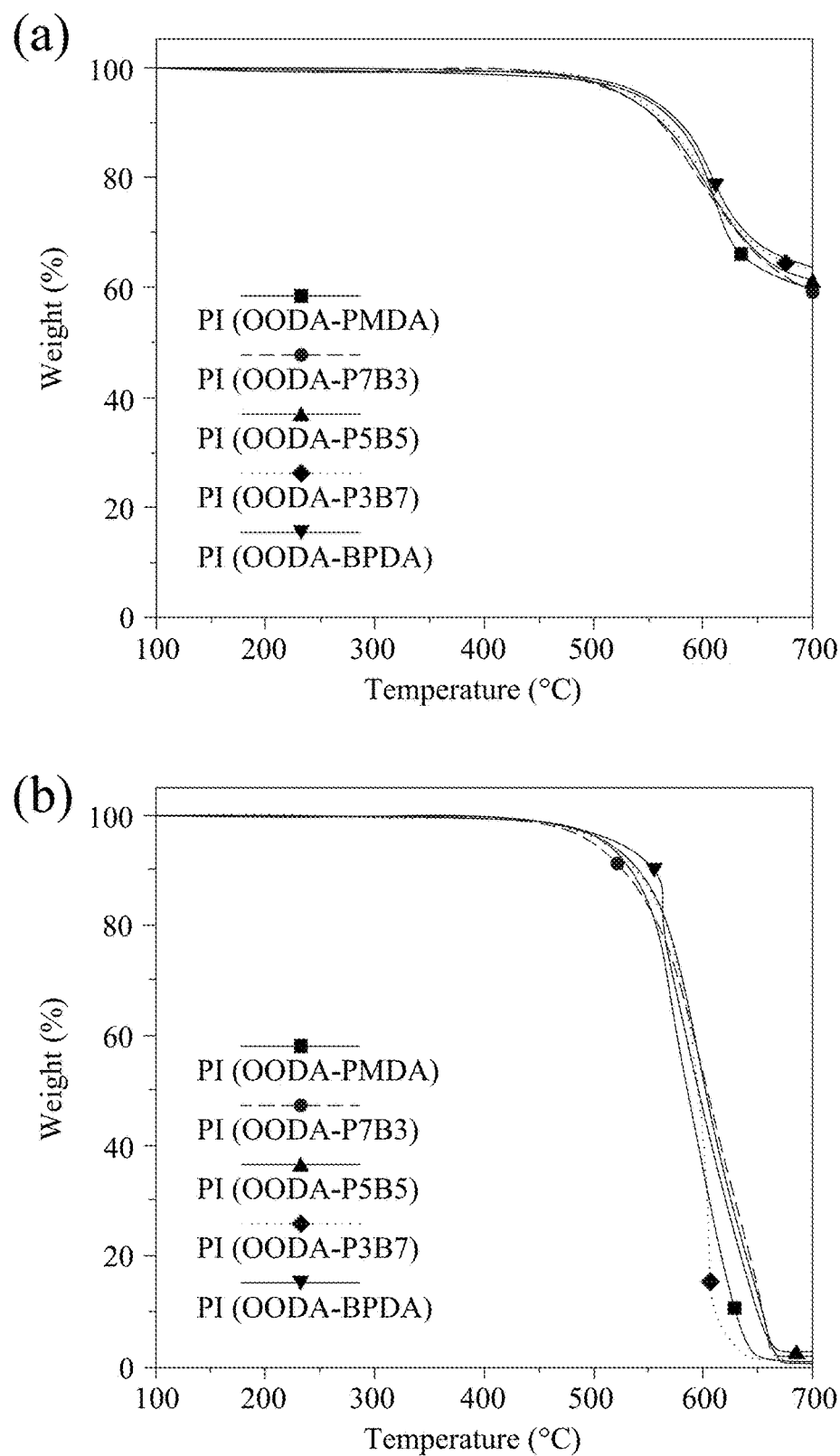
FIG. 12 shows the thermal and mechanical characterization of the synthesized polyimide-based copolymer PI(OODA-PmBn) according to a preferred embodiment of the present invention: TGA curves measured under (a) nitrogen flow and (b) air flow; and (c) DSC curves, (d) DMA curves, (e) TMA curves, and (f) stress-strain curves.

The thermal properties, including the thermal resistance (i.e., $T_d$ and $T_g$) and dimensional thermal stability (i.e., CTE), of the PIs of the embodiment are summarized in Table 2, and the experimental data of TGA, DMA and TMA can be referred to FIGS. 1, 11, and 12. All of the PIs of the embodiment exhibit an excellent thermal resistance ($T_d$>500° C. and $T_g$>400° C.) and a high dimensional stability (CTE<30 ppm K$^{-1}$).

bonding energy of the C—O bond (358 kJ mol-) is higher than that of the C—S bond (259 kJ mol$^{-1}$). The higher polymer chain packing and bonding energy give rise to the highest $T_d$ value of PI(OODA-BPDA). In contrast, PI(SODA-PMDA), instead of PI(OODA-PMDA) as we expected, exhibits the highest $T_d$ among the PIs derived from PMDA. This can be ascribed to the lower packing density of PI(OODA-PMDA) resulted from the higher stiffness in the backbone. For the PI(OODA-PmBn) series, as shown in Table 2 and FIG. 12a, the co-PIs show similar $T_d$ values of 532° C., 538° C. and 536° C. for PI(OODA-P3B7), PI(OODA-P5B5) and PI(OODA-P7B3). This result can be ascribed to the similar values of film density and $K_p$ among these co-PIs. Compared to the $T_d$ of PIs in a nitrogen flow, the $T_{d,air}$, measured under air flow (FIGS. 11a and 12b for co-PIs), decrease by 15-20° C. for each. These results exhibit the similar effect of oxidation to each PI.

Figure 13:
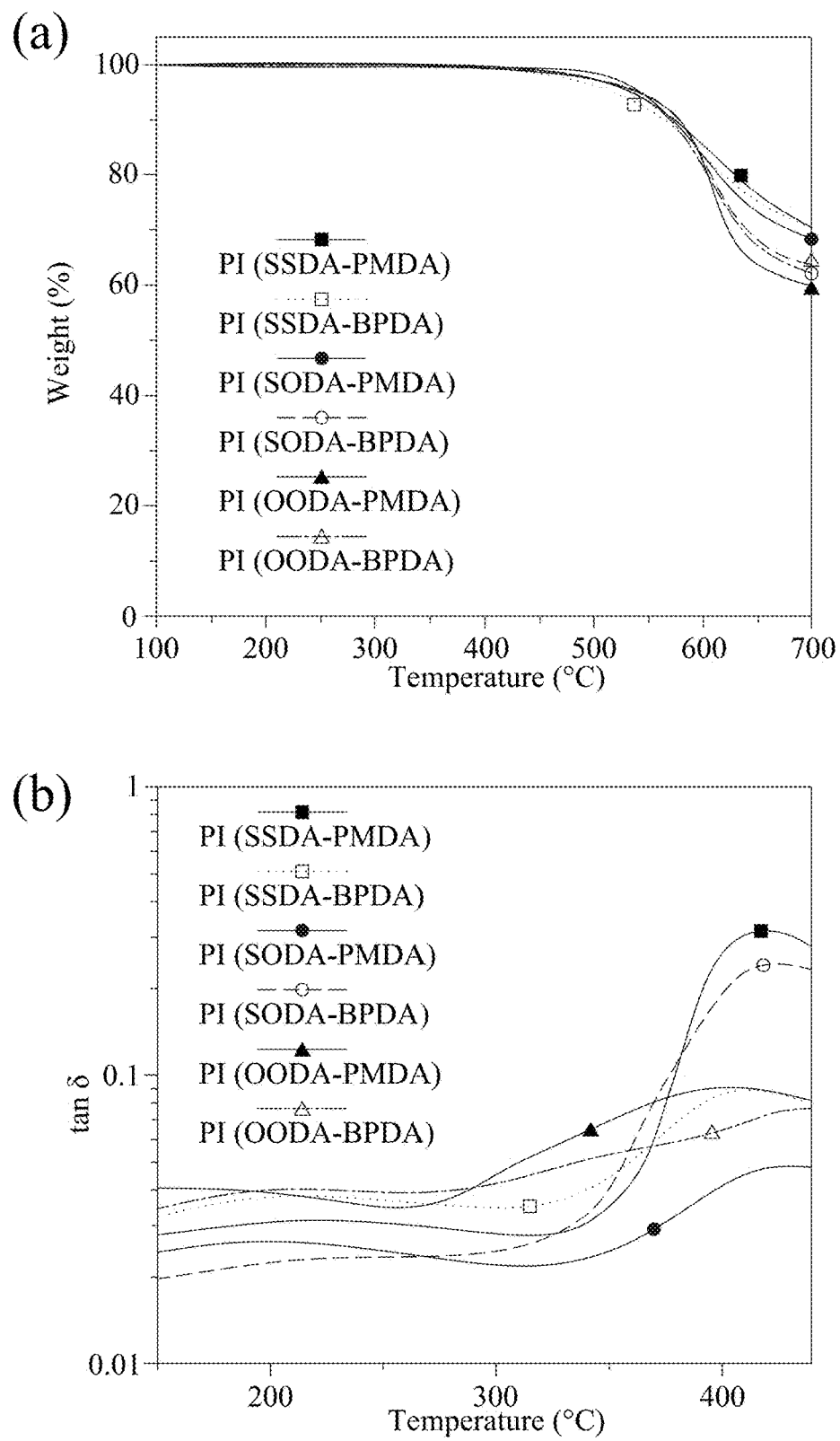
FIG. 13 shows the thermal and mechanical characterization of the synthesized polyimide-based copolymer PI($M_{XY}$DA-ArDA) according to a preferred embodiment of the present invention: (a) TGA curves, (b) TMA curves, (c) DMA curves, and (d) stress-strain curves.
Figure 14A:
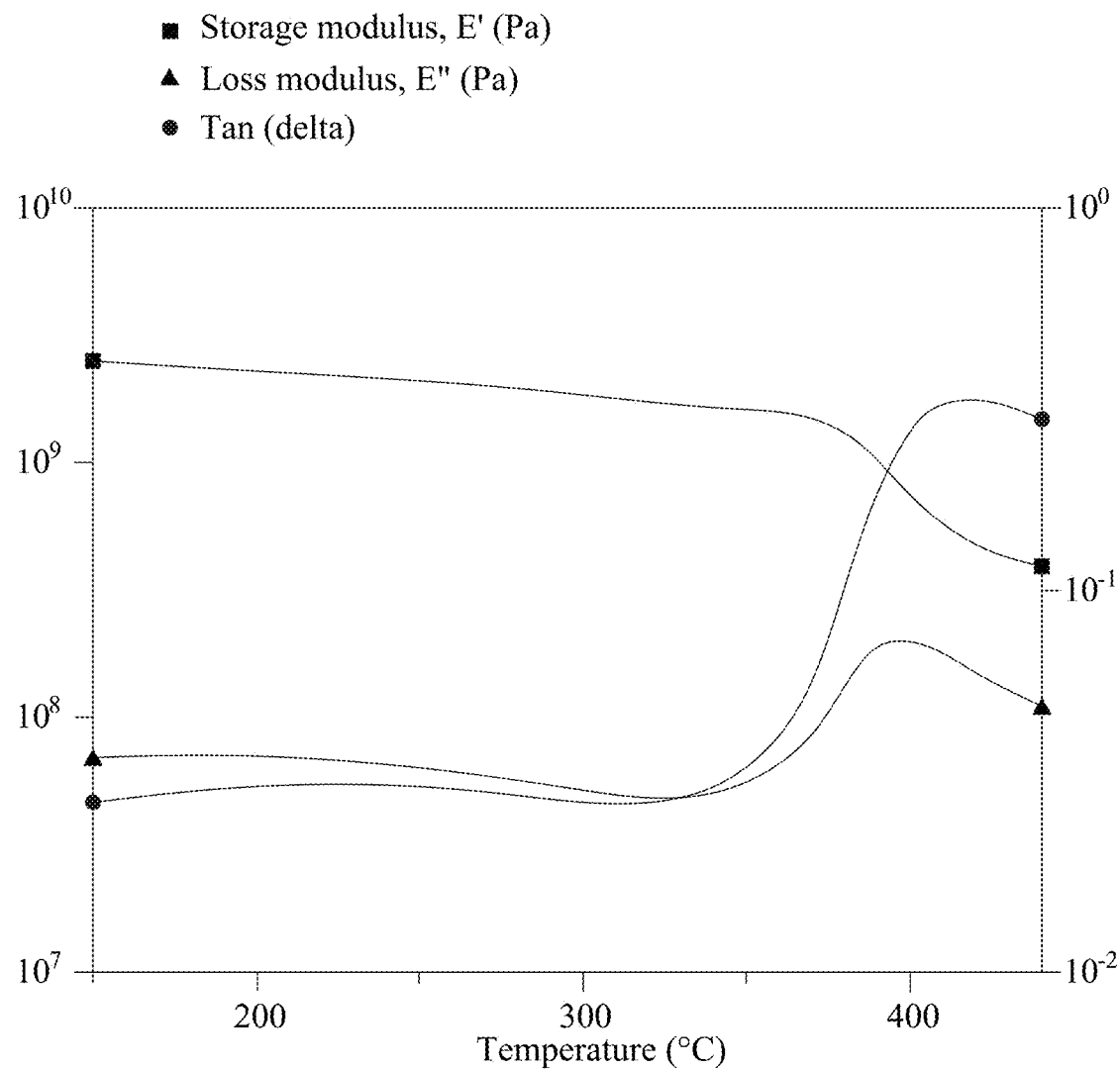
FIG. 14 shows the DMA curves of (a) PI(SSDA-PMDA), (b) PI(SSDA-BPDA), (c) PI(SODA-PMDA), (d) PI(SODA-BPDA), (e) PI(OODA-PMDA), (f) PI(OODA-BPDA), (g) PI(OODA-P7B3), (h) PI(OODA-P5B5), and (i) PI(OODA-P3B7) according to a preferred embodiment of the present invention.
Figure 14B:
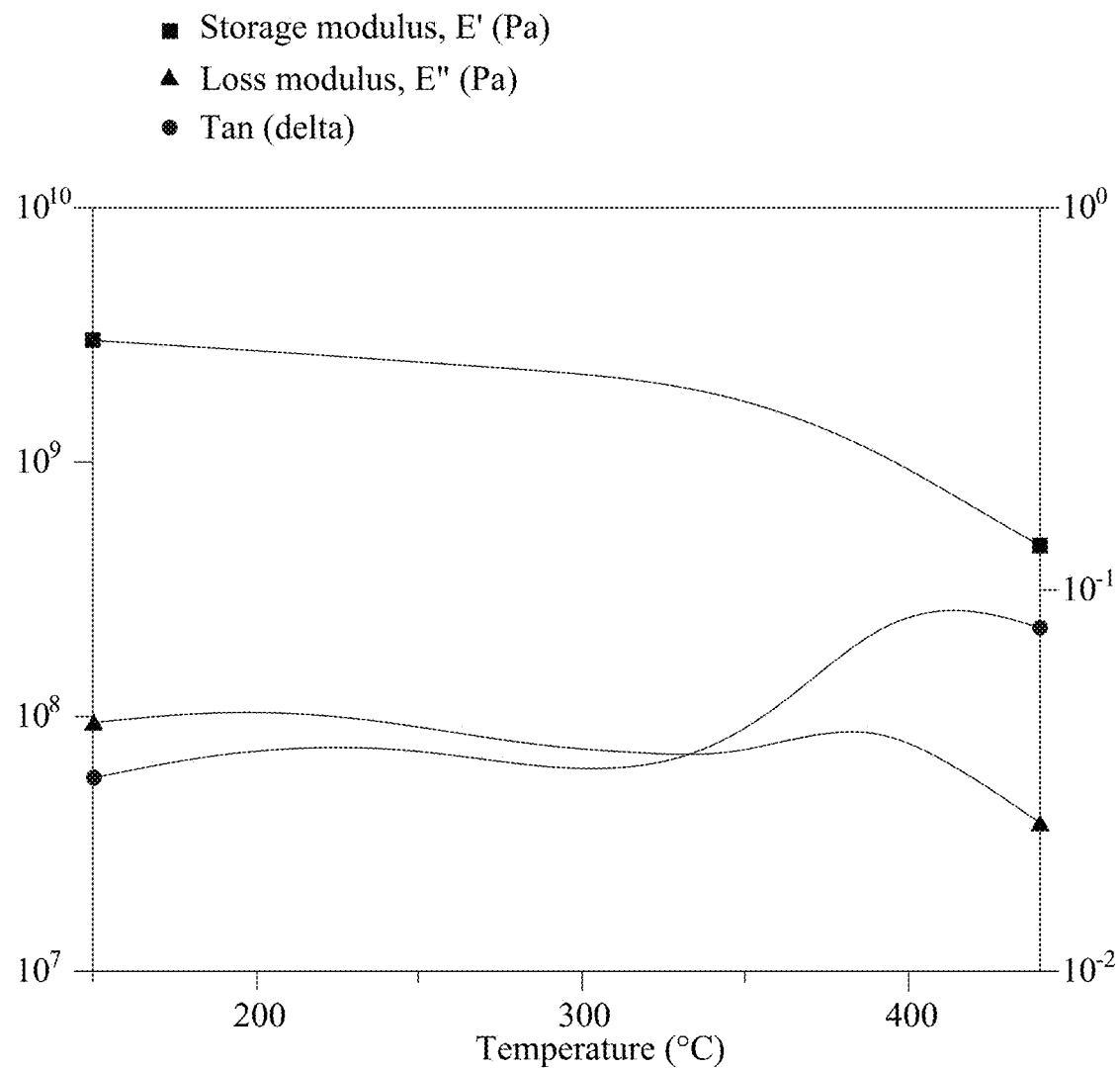
Figure 14C:
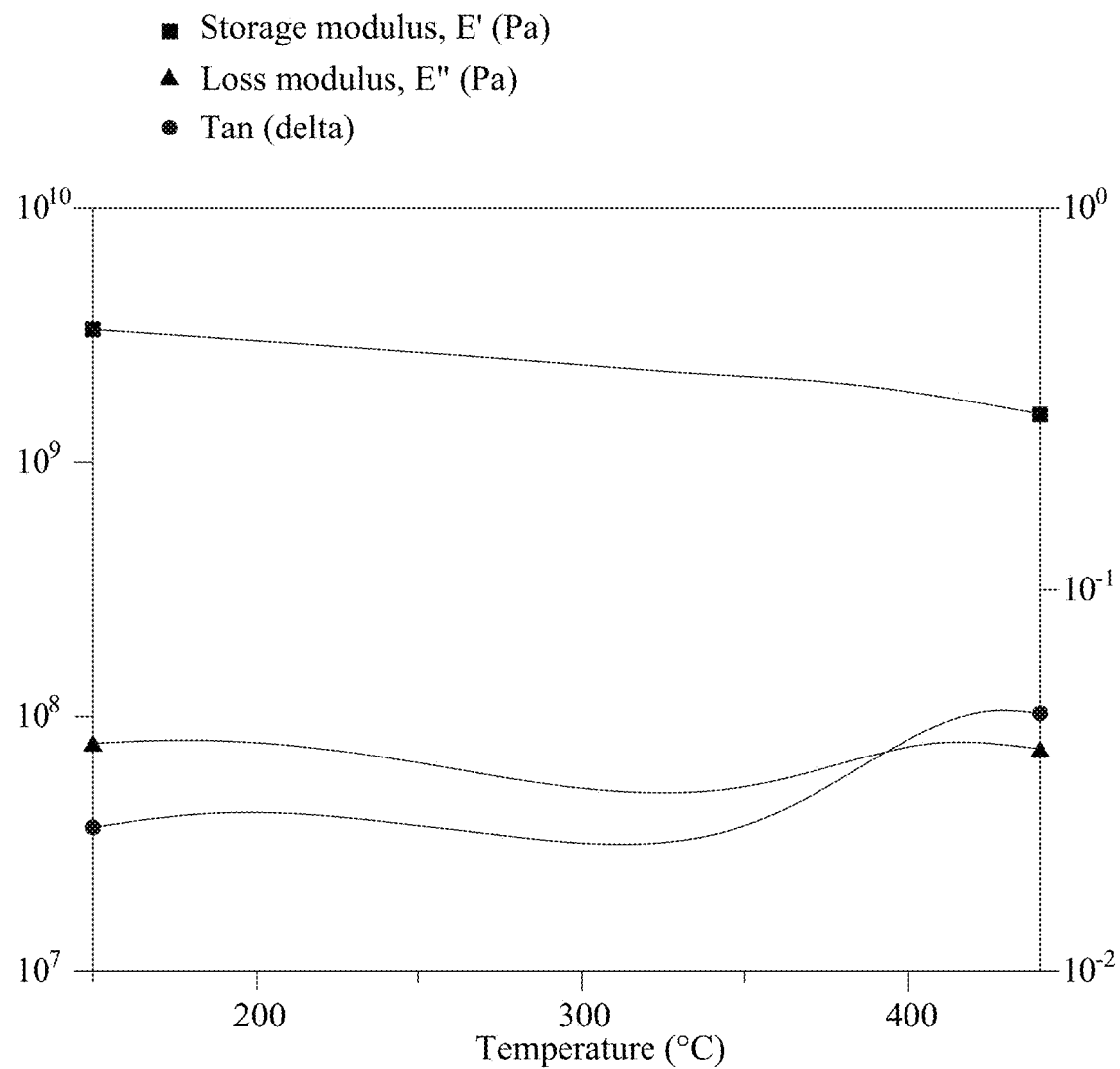
Figure 14D:
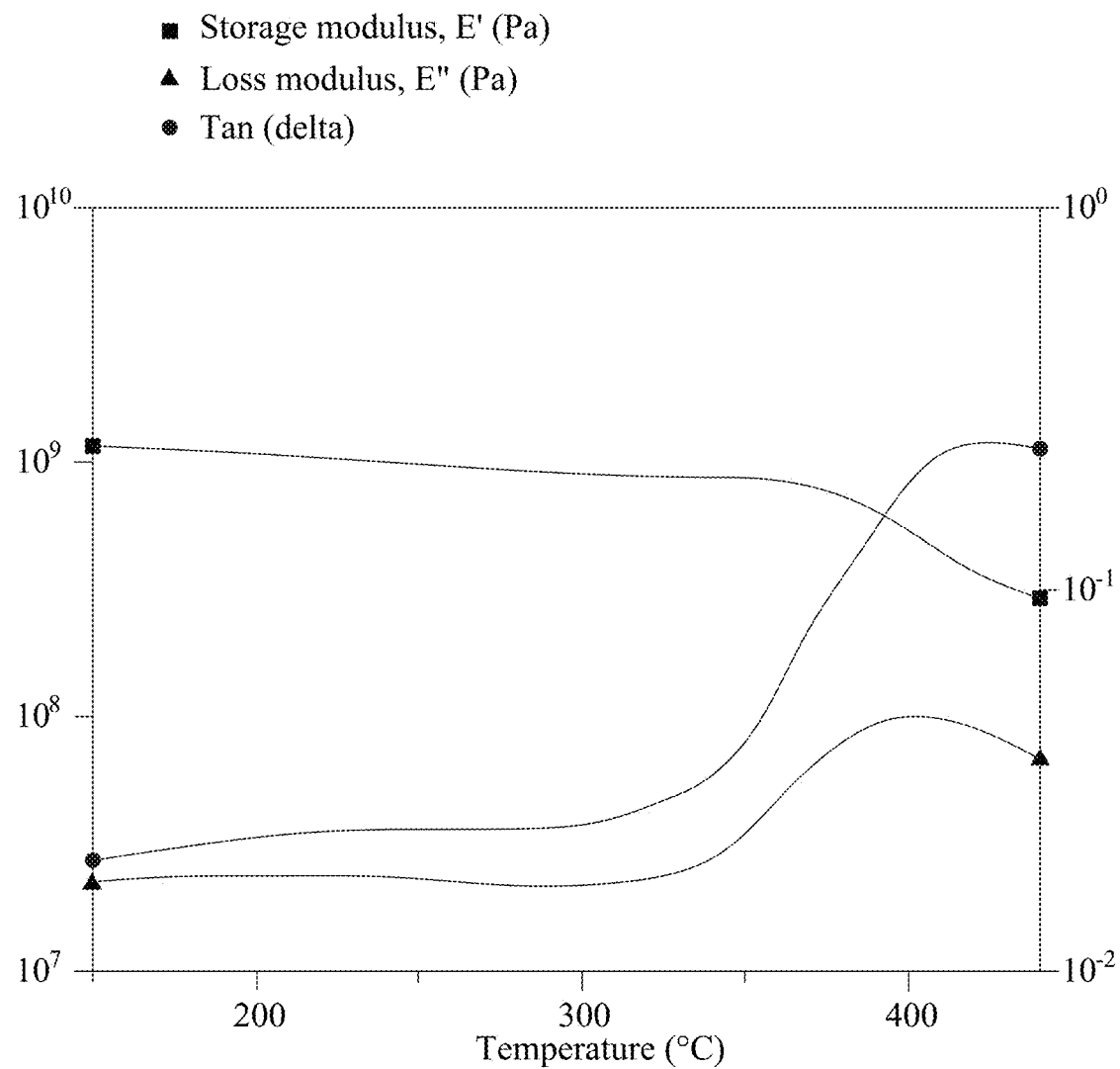
Figure 14E:
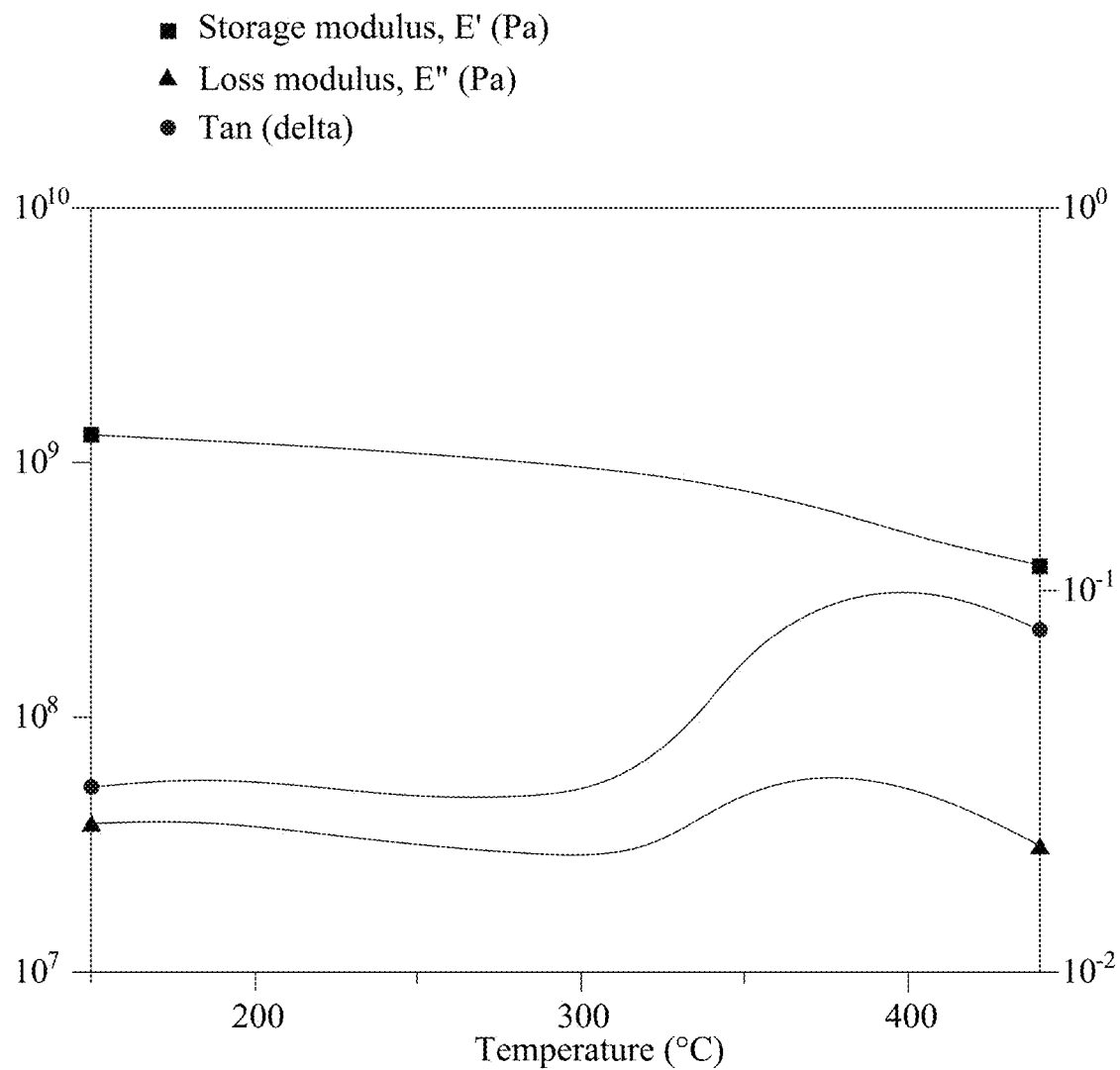
Figure 14F:
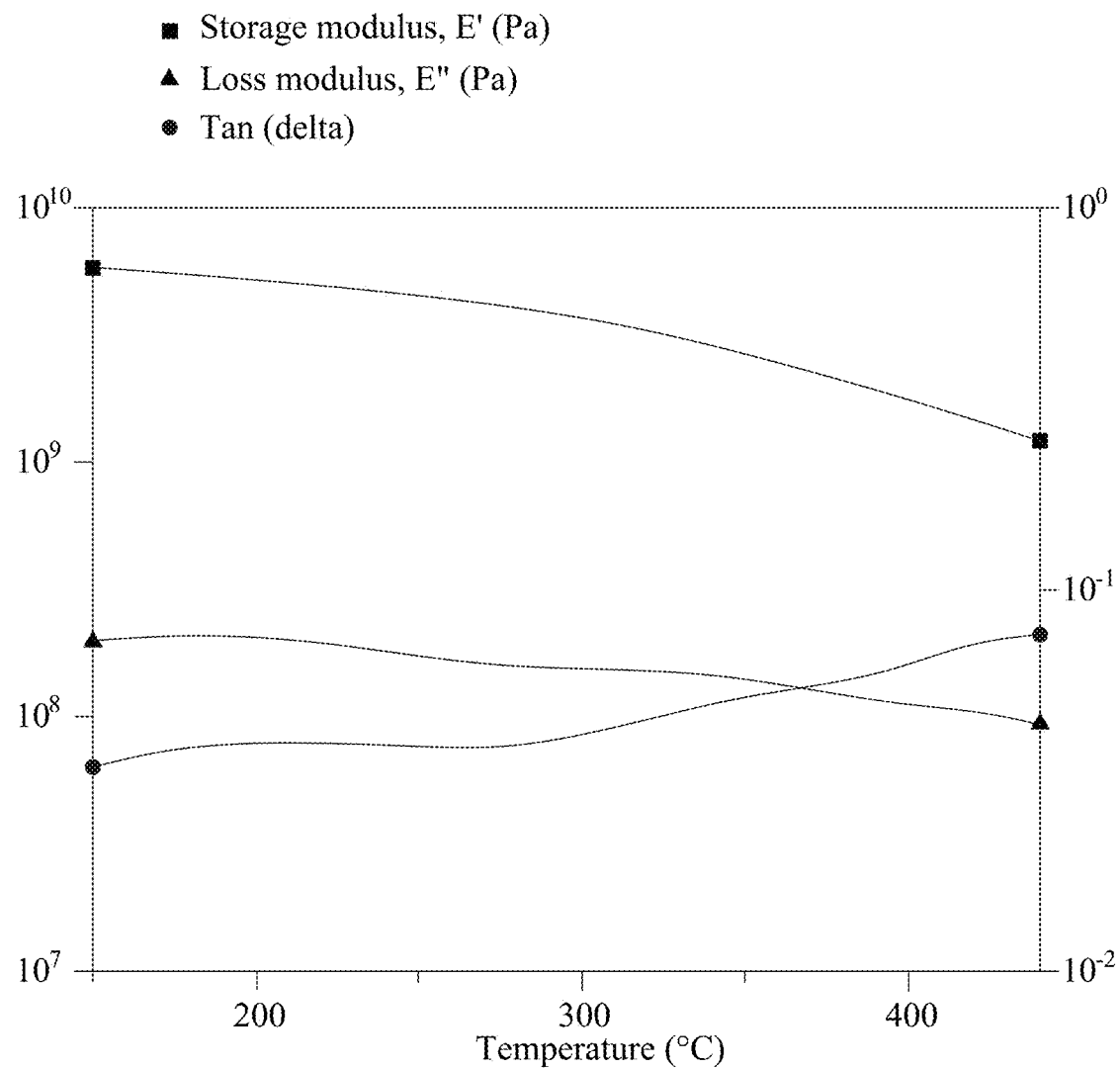
Figure 14G:
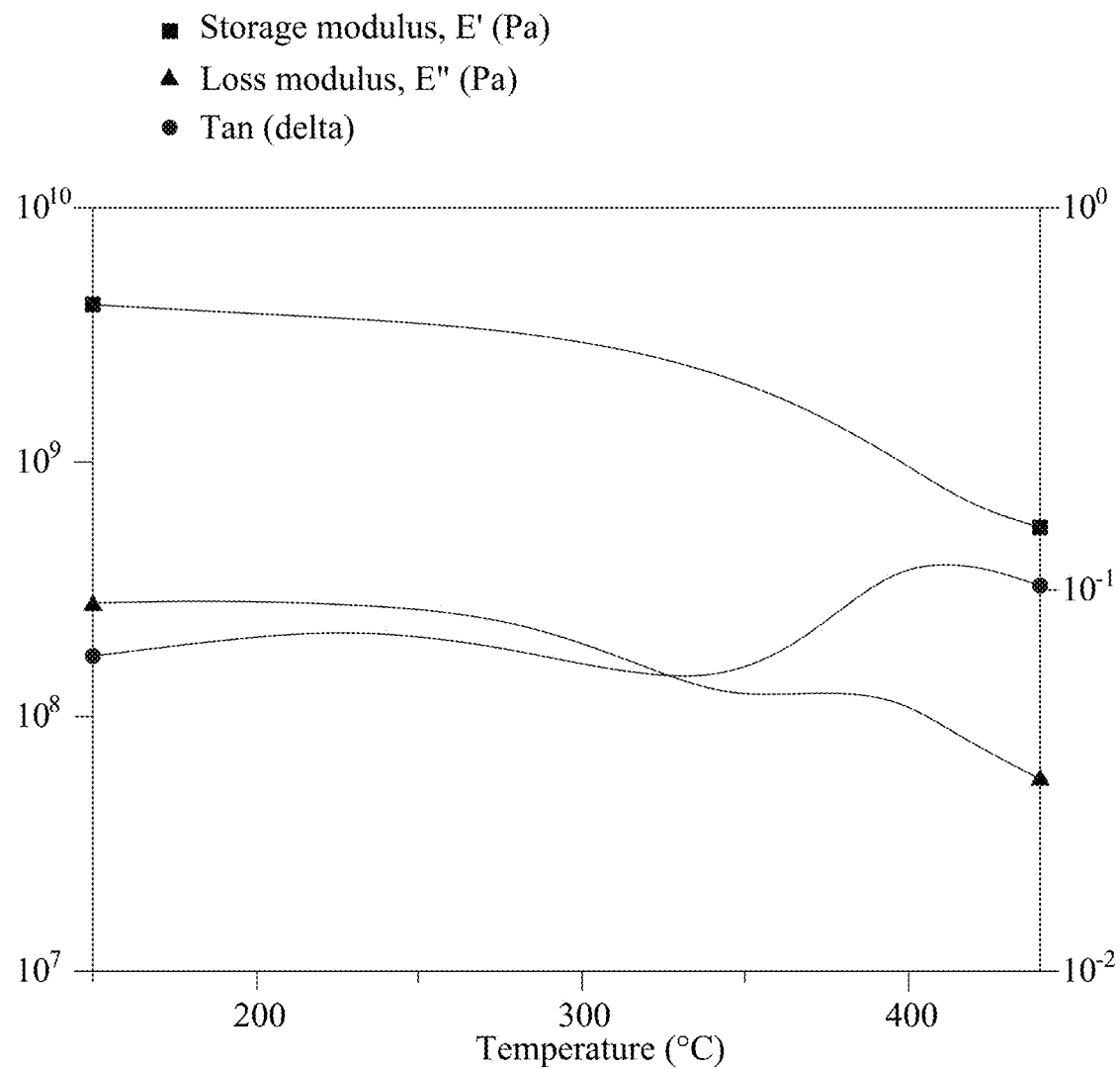
Figure 14H:
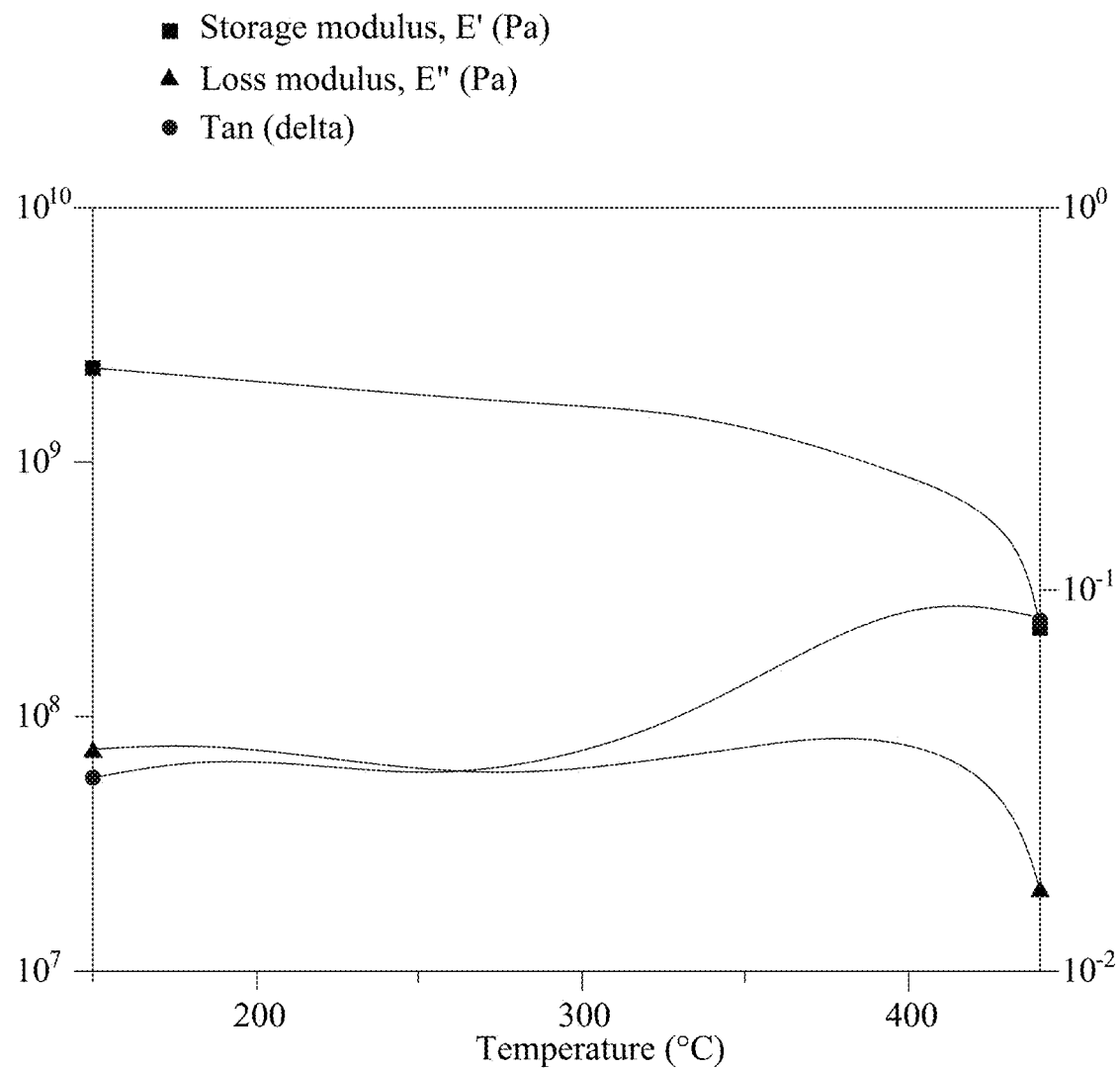
Figure 14I:
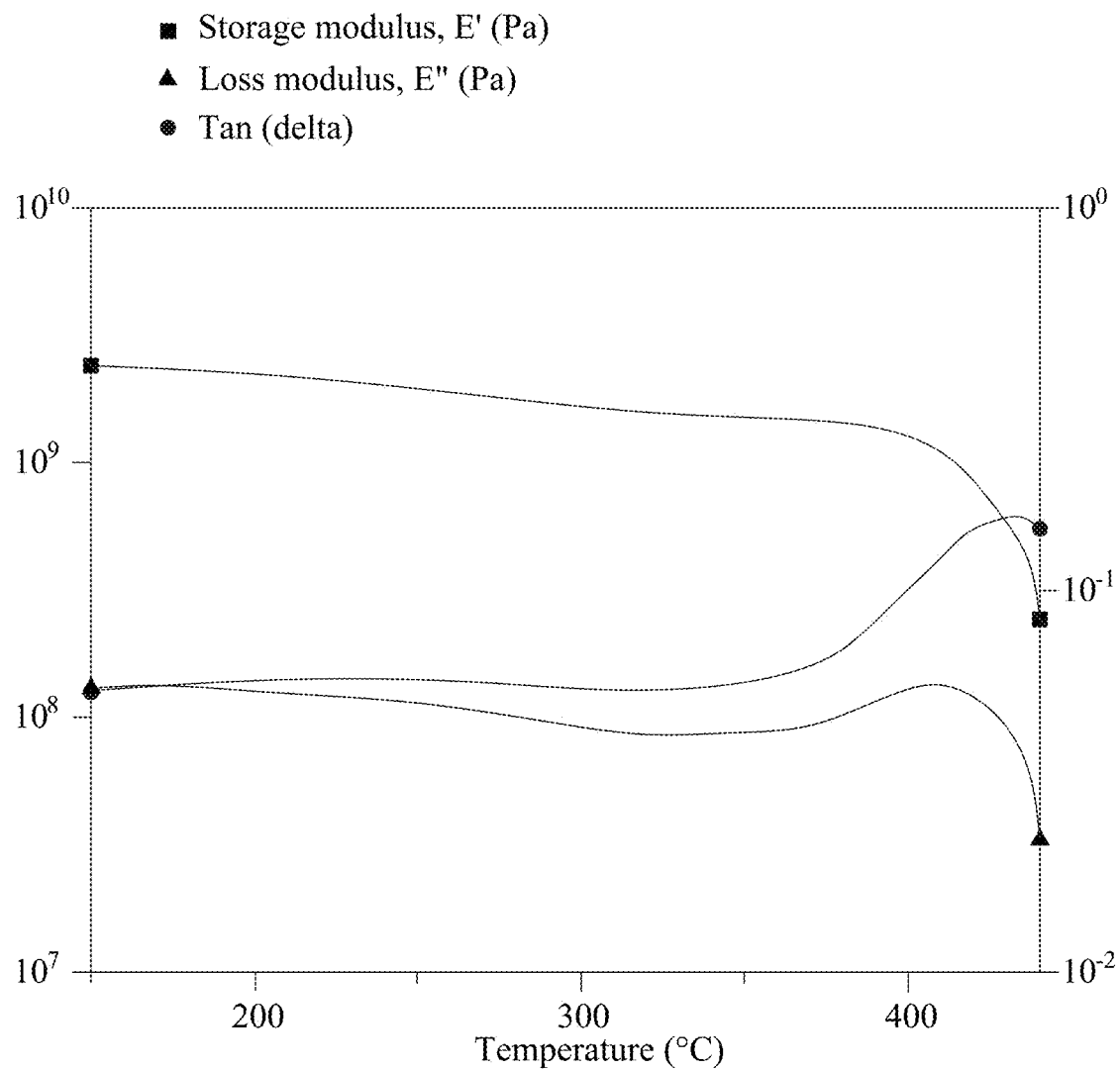

The $T_g$ values of the PIs of the embodiment were obtained by DSC (FIGS. 11b and 12c for co-PIs) and DMA (FIGS. 13b and 12d for co-PIs). From the DSC analysis, there is no inflection point in the curves below 400° C. From the DMA analysis, the peak points of tan delta (δ) curves in FIG. 14 are too broad to determine the α-$T_g$s. However, these results indicate that all the PIs of the embodiment possess extremely high $T_g$ values, which should be higher than 400° C.

Next, the crucial index for dimensional thermal stability, CTE, was examined from TMA. The CTE values of the PIs

TABLE 2

Thermal and mechanical properties of the polyimides of the embodiment.

| Nomenclature of the synthesized PI | $T_d^a$ (° C.) | $T_{d,air}^b$ (° C.) | $T_g^c$ (° C.) | α-$T_g^d$ (° C.) | CTE$^e$ (ppm/K) | $\varepsilon_b^f$ (%) | UTS$^f$ (MPa) | E$^f$ (GPa) |
|---|---|---|---|---|---|---|---|---|
| PI(SSDA-PMDA) | 531 | 507 | N.A. | N.A. | 19 | 3.4 | 96 | 2.8 |
| PI(SSDA-BPDA) | 525 | 505 | N.A. | N.A. | 30 | 3.9 | 129 | 3.3 |
| PI(SODA-PMDA) | 548 | 524 | N.A. | N.A. | 14 | 3.2 | 105 | 3.2 |
| PI(SODA-BPDA) | 538 | 519 | N.A. | N.A. | 24 | 3.8 | 144 | 3.7 |
| PI(OODA-PMDA) | 533 | 515 | N.A. | N.A. | 7.3 | 2.9 | 82 | 2.8 |
| PI(OODA-BPDA) | 546 | 522 | N.A. | N.A. | 11 | 3.8 | 116 | 3.0 |
| PI(OODA-P7B3) | 532 | 509 | N.A. | N.A. | 7.1 | 3.2 | 96 | 3.0 |
| PI(OODA-P5B5) | 538 | 513 | N.A. | N.A. | 5.5 | 3.8 | 131 | 3.5 |
| PI(OODA-P3B7) | 536 | 510 | N.A. | N.A. | 9.2 | 3.4 | 127 | 3.7 |

$^a$Determined by TGA with 5% weight loss under the nitrogen flow.
$^b$Determined by TGA with 5% weight loss under the air flow.
$^c$Determined by DSC.
$^d$Determined by DMA.
$^e$Determined by TMA.
$^f$Tensile modulus (E) is determined by UTM.

The $T_d$ values of the PIs of the embodiment, measured under a nitrogen flow (FIG. 13a), are correlated well with the strength of the weakest bonds along the backbone and the solid-state packing. Therefore, the PIs composed of BPDA with the flexible linkage show a lower $T_d$ than those from PMDA. For instance, the $T_d$ values of PI(SSDA-PMDA), PI(SSDA-BPDA), PI(SODA-PMDA) and PI(SODA-BPDA) are 531° C., 525° C., 548° C. and 538° C., respectively. However, PI(OODA-BPDA) possesses a higher $T_d$ (546° C.) than PI(OODA-PMDA) (533° C.), which is explainable by the denser chain packing ($K_p$=0.702) compared with PI(OODA-PMDA) having a highly stiff backbone ($K_p$=0.684). Furthermore, the $T_d$ values of the PIs derived from BPDA increased in the order of SSDA<SODA<OODA. It can be ascribed to two factors: (1) The planar conformation with the largest dihedral angle of OODA leading to dense chain packing, which can also be confirmed by the relatively high $K_p$ value (0.702). (2) The derived from FIGS. 13c and 12e (for co-PIs) are summarized in Table 2. As shown in the table, the CTE values of PI(SSDA-PMDA), PI(SSDA-BPDA), PI(SODA-PMDA), PI(SODA-BPDA), PI(OODA-PMDA) and PI(OODA-BPDA) are 19, 30, 14, 24, 7.3 and 11 ppm K$^{-1}$, respectively. Among the three series of PIs, PI(OODA-PMDA) and PI(OODA-BPDA) are the best substrate candidates for electronic devices/equipment because of their high $T_g$s over 400° C. and very low CTEs. The PIs derived from the OODA diamine show comparable thermal and mechanical properties to the reported PIs derived from benzimidazole and benzoxazole based diamines. The CTEs of the PIs derived from the same dianhydride decrease in the order of SSDA>SODA>OODA with increasing the dihedral angle in the diamine moiety. This can be ascribed to the structural stiffness and higher coplanarity of the backbone leading to constrained chain motion at a higher temperature. With increasing the degree on the in-plane orientation of the PI main chains, the in-plane CTE is decreased. And the PIs composed of BPDA may possess higher CTE values due to the rotatable linkage in BPDA. However, the difference on the CTE values between PI(OODA-PMDA) and PI(OODA-BPDA) (about 3 ppm K$^{-1}$) is not as obvious as other PIs. This would be caused by the poor chain packing and mechanical property of PI(OODA-PMDA), which lead to a higher CTE. However, the PI(OODA-PmBn) series show an improved dimensional stability upon heating. The CTE values of PI(OODA-P7B3), PI(OODA-P5B5) and PI(OODA-P3B7) are 7.1, 5.5 and 9.2 ppm K$^{-1}$, respectively. Nevertheless, PI(OODA-P5B5) exhibit the lowest CTE (5.5 ppm K$^{-1}$) among all the polyimide-based copolymers as shown in FIG. 15a. This can be readily attributed to the highest K$_p$ value of PI(OODA-P5B5) mentioned above, indicating the better polymer chain packing and arrangement. Therefore, the CTE of the polyimide-based copolymer of the embodiment reaches the minimum value in PI(OODA-P5B5) with the best balance between the rigid backbone and the better chain packing with copolymerization of PMDA and BPDA.

d). Mechanical Properties

The mechanical properties of polyimide-based copolymers retrieved from the stress-strain curve (FIGS. 13d and 12f for co-PIs) are summarized in Table 2. The PIs of the embodiment, except for the rod-like PI(OODA-PMDA), exhibit high mechanical properties (i.e., ultimate tensile strength (UTS)>100 MPa and elongation at break (b)>3%). As shown in FIG. 13d, the UTS (MPa) and eb (%) of PI(SSDA-PMDA), PI(SSDA-BPDA), PI(SODA-PMDA) and PI(SODA-BPDA) are (96, 2.8), (129, 3.3), (105, 3.2) and (144, 3.7). The BPDA based PIs possess higher UTS and eb values than that composed of PMDA. And the PIs composed of SODA with a medium dihedral angle achieve both higher UTS and c. This can be attributed to the balance between the stiffness and the flexibility of the polymer backbone. For the coPI PI(OODA-PmBn), the summary data of the stress-strain curves are presented in FIG. 15b. The UTS and eb reach a maximum value as the molar ratio of BPDA increased from 0% to 50%. The prepared PI films become ductile from brittle when the BPDA composition increases. The co-PI PI(OODA-P5B5) especially shows the highest UTS (131 MPa) and $\varepsilon_b$ (3.7%) values owing to the improved polymer arrangement and chain rigidity. The balance between the stiffness and the flexibility of the polymer backbone results in the high mechanical properties for PI(OODA-P5B5).

e). Dielectric Properties

In the Clausius-Mossotti equation described below, the chain polarizability and free volume of polymers are two important factors and evaluated by molar polarity (P) and molar volume (V) to determine the dielectric constant ($D_k$).

$$D_k = (1+2P/V)/(1-P/V)$$

From Table 1, the $D_{ks}$ of the PIs of the embodiment increase with the diamine in the following order: OODA, SODA and SSDA. The $D_k$ values of PI(SSDA-PMDA) and PI(SSDA-BPDA) are 3.66 and 3.59. Relatively, the $D_{ks}$ of PI(OODA-PMDA) and PI(OODA-BPDA) are 3.28 and 3.19. Because of the higher polarizability of the sulfur atom than that of the oxygen atom, the SSDA based PIs show a higher dielectric constant. Besides, the BPDA based PIs in the embodiment show a relatively lower $D_k$ compared with those from PMDA since the rotatable bridging units of the BPDA based PI backbone increases the free volume of the polymer. As a result, the increase of the molar volume accompanied with the decrease of $D_k$ can be seen and described with the Clausius-Mossotti equation. The PIs derived from SSDA and BPDA presents a relatively lower dissipation factor ($D_f$) than those derived from OODA and PMDA, that is, the $D_f$ values of PI(SSDA-PMDA), PI(SSDA-BPDA), PI(OODA-PMDA) and PI(OODA-BPDA) are 0.007, 0.006, 0.008 and 0.007, respectively. The low $D_f$ value of PI(SSDA-BPDA) is attributed to the low weight fraction of the imide groups in the repeating unit.

f). Fabrication and Characterization of Flexible OFET

To fully utilize the merits of PIs as the substrate, the all-polymer based flexible transistor device/equipment was fabricated and characterized, as shown in FIGS. 1 and 16. The architecture of the transistor device is illustrated in FIGS. 1a and 1b. It is an organic field effect transistor 100 having a BGTC configuration, including a flexible substrate 11, a gate 12, a dielectric 13, an active layer 14, a source 15 and a drain 16, wherein the active layer is PII2T (as in the above-mentioned formula (IV)), and the flexible substrate is the polyimide-based copolymer of the present invention having the above-mentioned formula (II). The synthesized copolymer PI(OODA-P5B5) were utilized as the substrate and dielectric of the flexible OFET devices since it possesses the highest thermal stability and mechanical durability compared with other synthesized PIs. The prepared PI(OODA-P5B5) film with a thickness of about 25 μm is tough enough to be applied as the substrate for OFET. PI(OODA-P5B5) dielectric was prepared by spin-coated its PAA solution on a PI substrate with a thickness of about 420 nm. Since PI(OODA-P5B5) has the lowest CTE value (5.5 ppm K$^{-1}$), the low dielectric constant (3.19), and the stable capacitance of 6.7 nF cm$^{-2}$ even heated up to 200° C. (FIG. 17), the excellent thermal stability and relatively low dielectric constant of the PI dielectric can prevent current leakage after thermal treatment to the devices. Besides, the hydrophilic carboxylic acid group on PAA can improve the film quality of the dielectric and decrease the surface roughness. For these reasons, PI(OODA-P5B5) was selected as the exemplary substrate and dielectric material for application in OFET devices in this embodiment. PII2T with asymmetric side-chain engineering possessed high mechanical durability and excellent semiconducting performance as an active layer, so it is suitable for use in the flexible OFET devices.

The PI-based OFET devices were fabricated with the substrate and dielectric of PI(OODA-P5B5). The p-channel transfer characteristics of the OFET devices were conducted with the drain voltage ($V_D$) of −30 V, and the transfer and output characteristics of PI-based OFET are shown in FIGS. 16a and 16b. The output characteristics represent a well-defined linear and saturation regime and there is no clockwise current hysteresis observed in the transfer characteristics. The hole mobility (Uh) determined from the linear fitting of the square root of the drain current (ID) and the gate voltage ($V_G$) from −2 to −12 V shows a high value of 0.35 cm$^2$ V$^{-1}$ s$^{-1}$. The $I_{on}/I_{off}$ and the $V_{TH}$ values of the PI-based OFET device are 2.4×10$^3$ and −2.4 V, respectively. The similar electrical characteristics can also be observed in the PI-based OFET with the substrate of PI(OODA-BPDA) (FIG. 18a), which shows the μh value of 0.32 cm$^2$ V$^{-1}$ s$^{-1}$, the $I_{on}/I_{off}$ of 3.8×10$^3$ and the $V_{TH}$ value of −1.3 V. In order to further study the performance of the device characteristics, a traditional FET was fabricated with a highly n-doped Si wafer as a substrate and 300 nm SiO$_2$ as a dielectric. The traditional FET showed the $\mu_h$ of 0.43 cm$^2$ V$^{-1}$ s$^{-1}$ with the drain voltage $V_D$=−100 V, the on/off current ratio of 2×10$^6$, and the relatively higher threshold voltage of −29 V (FIG. 18b). These results indicate that the flexible FET with both PI(OODA-BPDA) and PI(OODA-P5B5) substrate possesses comparable performance compared with silicon-based OFET. Moreover, the low $V_{TH}$ (<−3 V) derived from the polymeric dielectrics makes the FET practical in flexible electronics application.

Figure 19A:
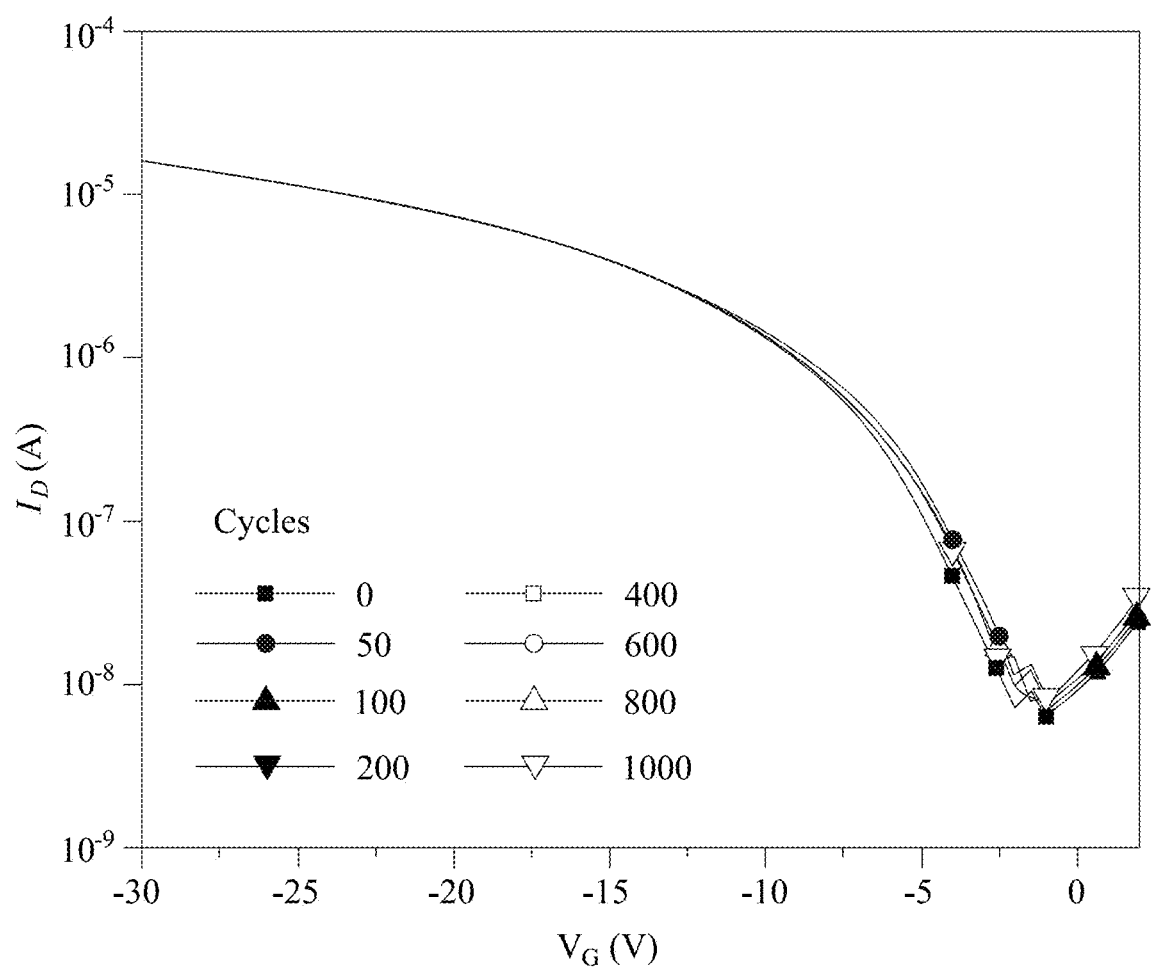
FIG. 19 shows (a) the FET transfer curves of all polymer-based transistor device after the mechanical endurance test conducted by cyclic bending and (b) the FET characteristics of $\mu_h$ and $I_{on}/I_{off}$ varied with different bending cycles according to a preferred embodiment of the present invention.
Figure 19B:
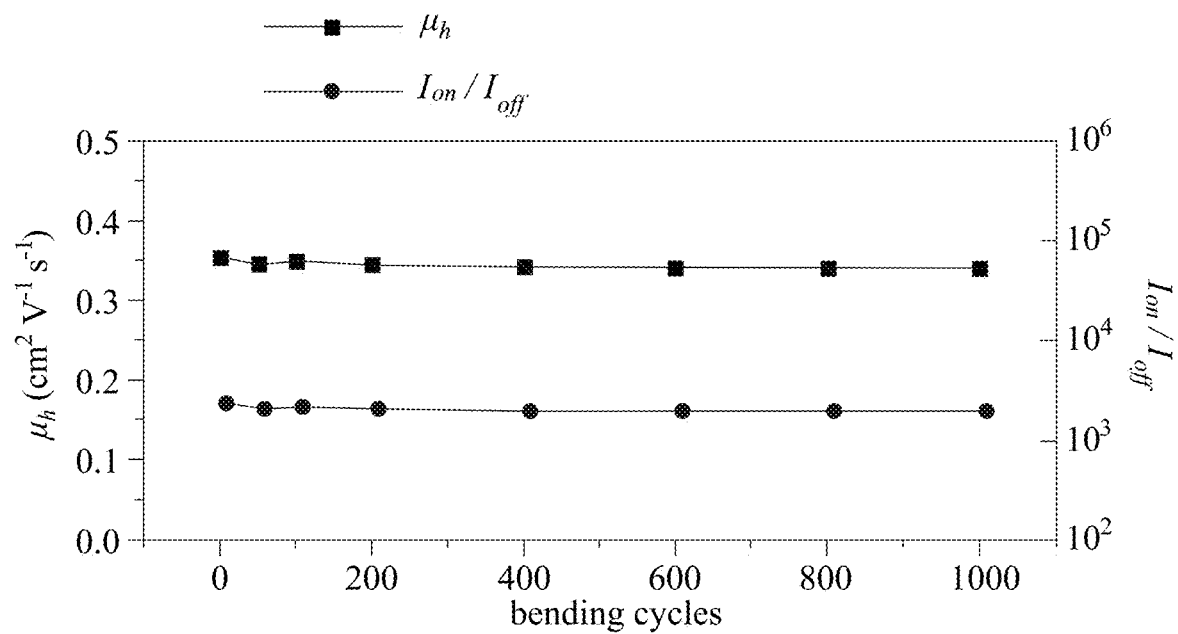
Figure 20A:
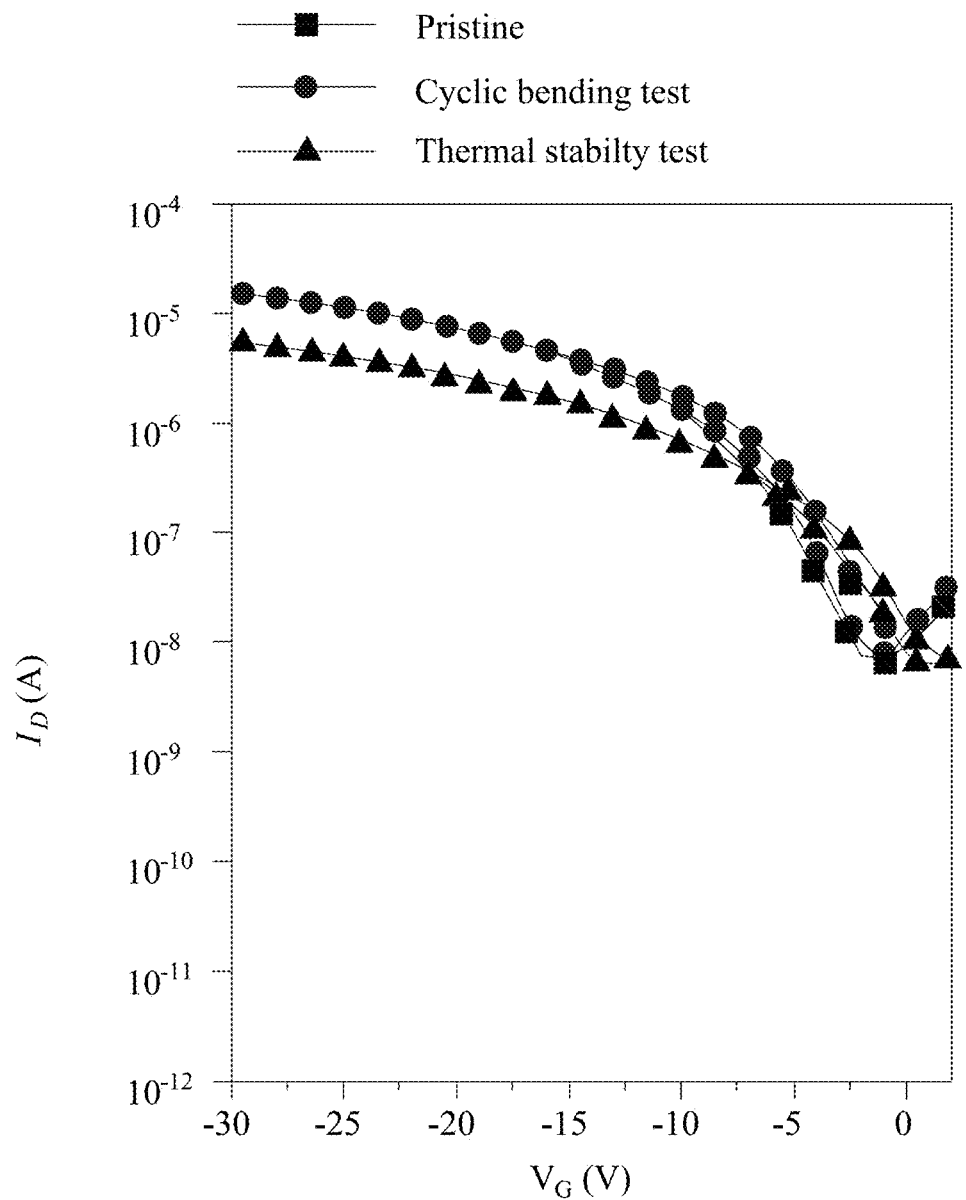
FIG. 20 shows (a) the FET transfer characteristics with forward and backward scan and (b) the gate current of the flexible OFETs fabricated by PI(OODA-P5B5) as substrate according to a preferred embodiment of the present invention.
Figure 20B:
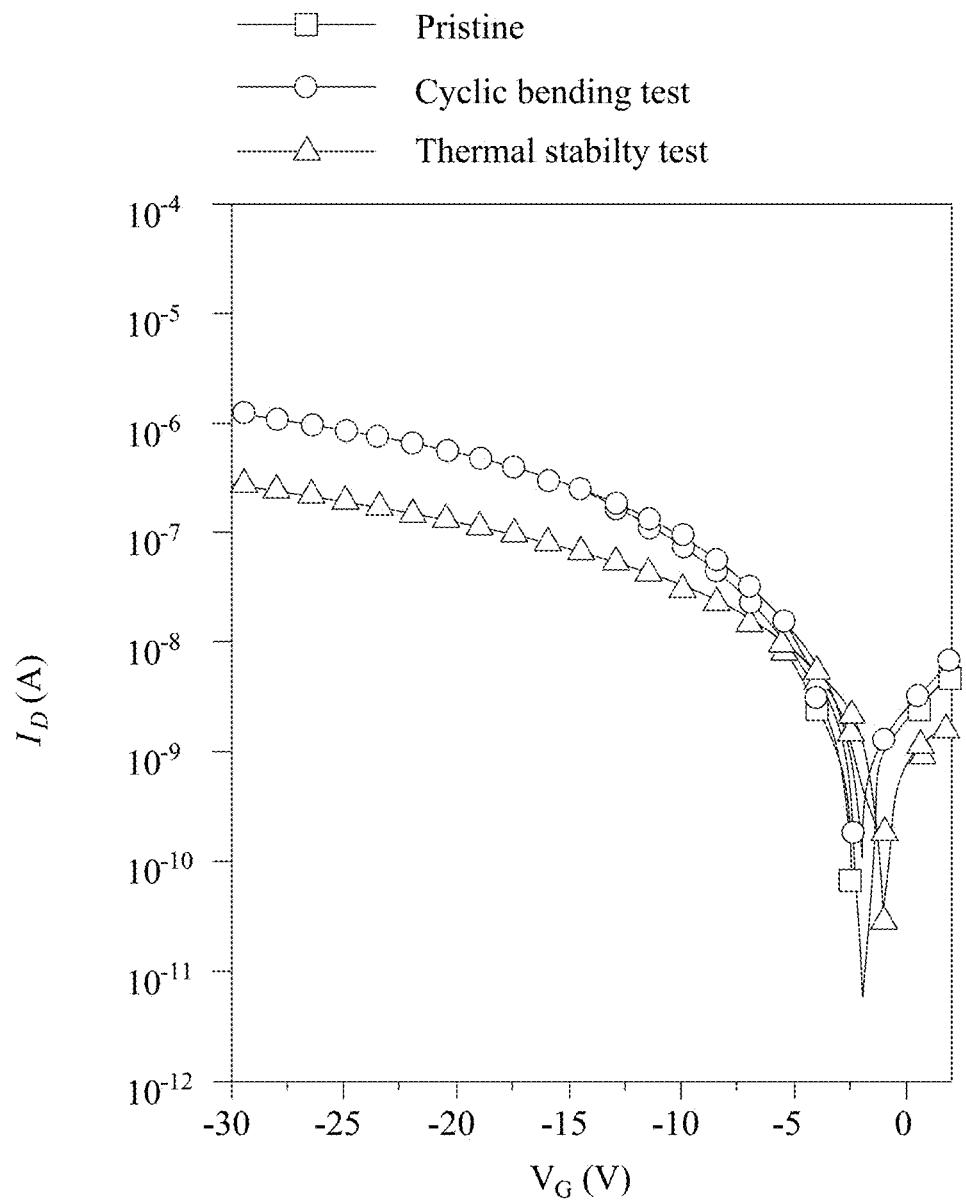

To evaluate the reliability of the flexible transistor, the OFET characterization was conducted under the mechanical endurance test by the cyclic bending. FIG. 19a shows the corresponding transfer curves under bending cycles, and the device characteristics are summarized in FIG. 19b and Table 3. The corresponding $\mu_{hS}$ (cm$^2$ V$^{-1}$ s$^{-1}$) and $V_{THs}$ (V) calculated from the transfer curves are (0.35, −2.4), (0.34, −2.1) and (0.34, −2.2) before and after 50 and 1000 bending cycles. Besides, there is no significant hysteresis observed after 1000 bending cycles (FIG. 20a). It indicates the stable OFET performance under a mechanical endurance test and the high feasibility for flexible electronics.

TABLE 3

The FET characteristics of fabricated devices under various bending cycles.

| Bending cycles | $\mu_h{}^a$ | $I_{on}/I_{off}{}^b$ | $V_{TH}{}^c$ |
|---|---|---|---|
| Cycle 0 | 0.35 | 2.4 × 10$^3$ | −2.4 |
| Cycle 50 | 0.34 | 2.1 × 10$^3$ | −2.1 |
| Cycle 100 | 0.35 | 2.2 × 10$^3$ | −2.2 |
| Cycle 200 | 0.35 | 2.1 × 10$^3$ | −2.2 |
| Cycle 400 | 0.34 | 2.4 × 10$^3$ | −2.1 |
| Cycle 600 | 0.34 | 2.0 × 10$^3$ | −2.2 |
| Cycle 800 | 0.34 | 2.0 × 10$^3$ | −2.1 |
| Cycle 1000 | 0.34 | 2.0 × 10$^3$ | −2.2 |

$^a$Unit of charge mobility, $\mu_h$, is cm$^2$ V$^{-1}$ s$^{-1}$.
$^b$Unit of on/off current ratio, $I_{on}/I_{off}$, is dimensionless.
$^c$Unit of threshold voltage, $V_{TH}$, is V.

Figure 21A:
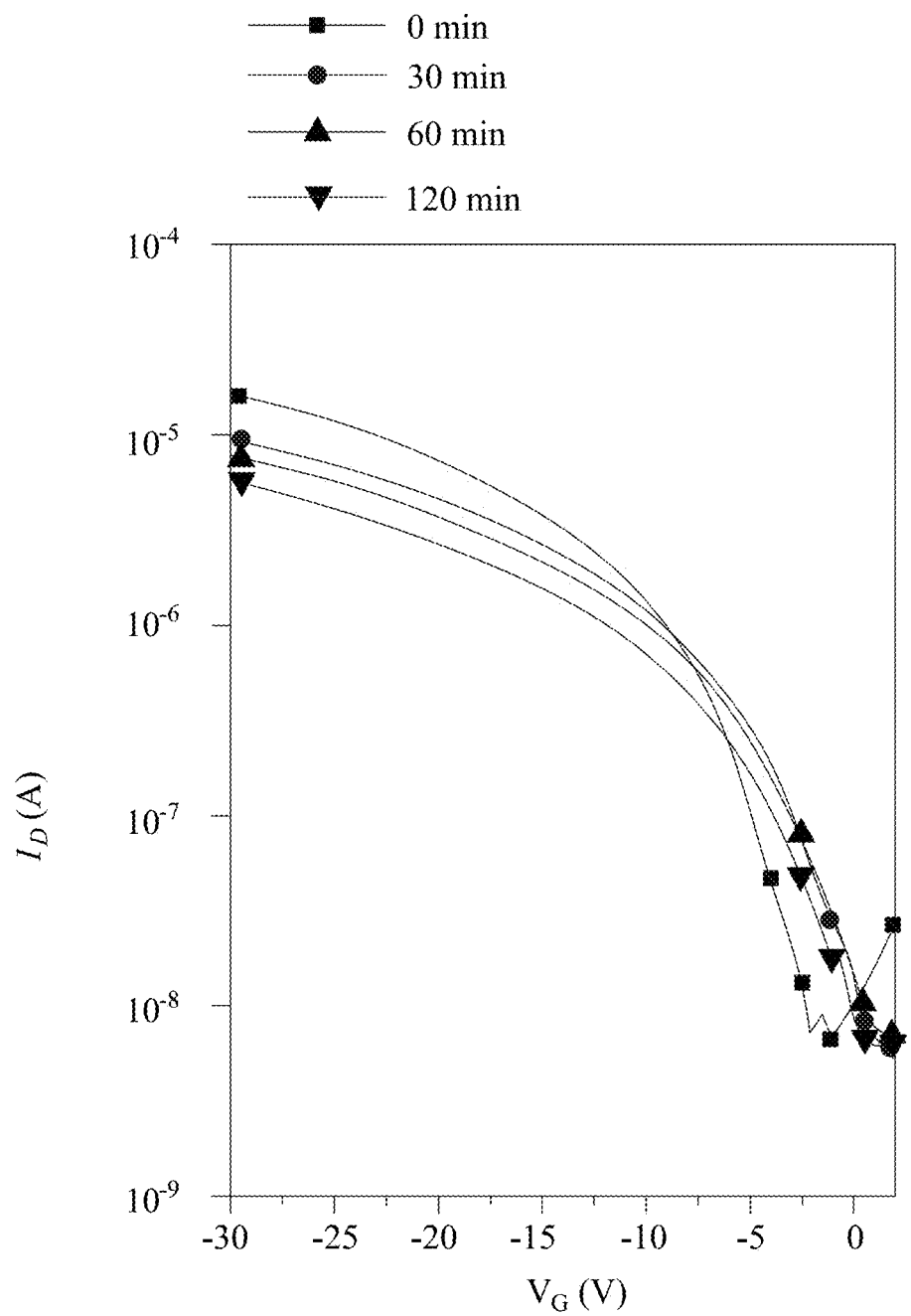
FIG. 21 shows (a) the FET transfer curves of all polymer-based transistor by the thermal treatment at 200° C. after different baking time, and the summarized FET (b) transfer curves and (c) characteristics after different baking temperature for 2 h according to a preferred embodiment of the present invention.
Figure 21B:
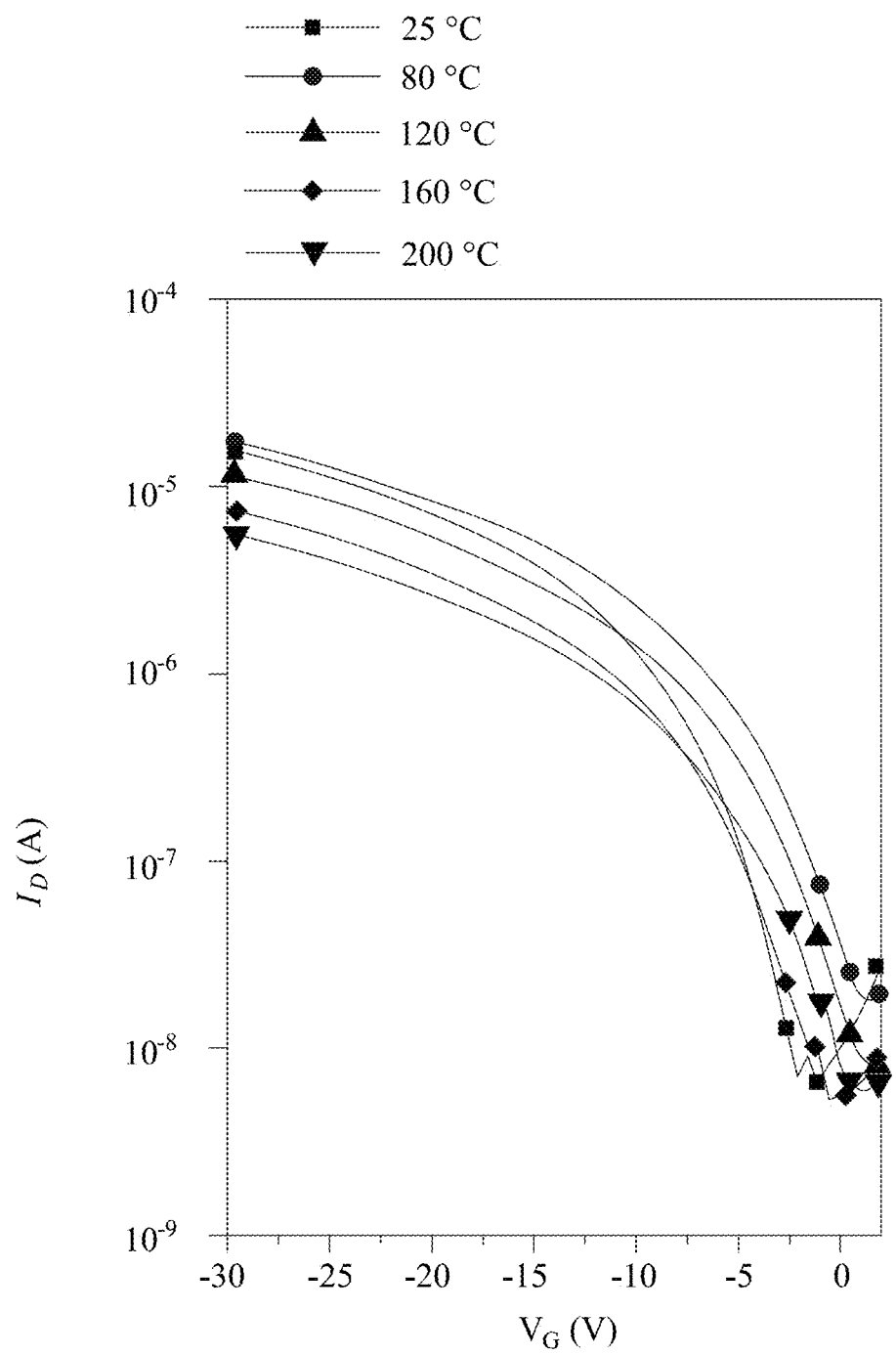
Figure 21C:
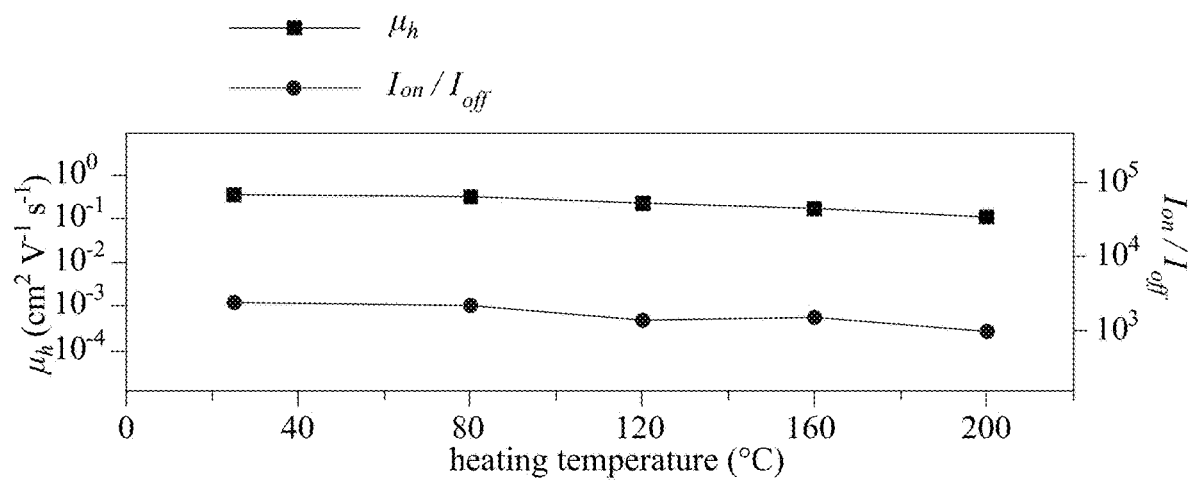
Figure 22A:
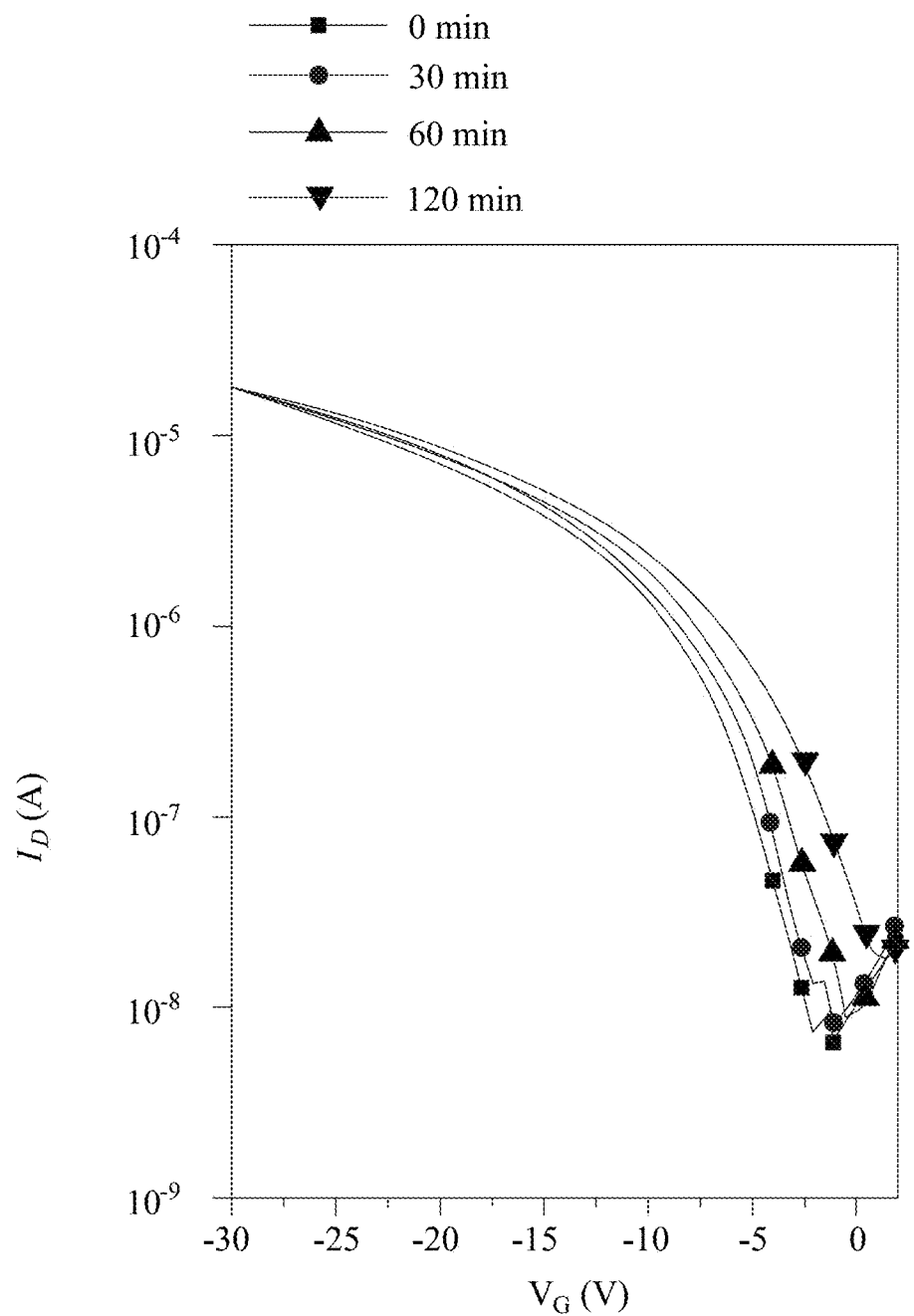
FIG. 22 shows the FET transfer characteristics of PI(OODA-P5B5) based OFETs with thermal treatment at (a) 80° C., (b) 120° C., and (c) 160° C. for 2 h according to a preferred embodiment of the present invention.
Figure 22B:
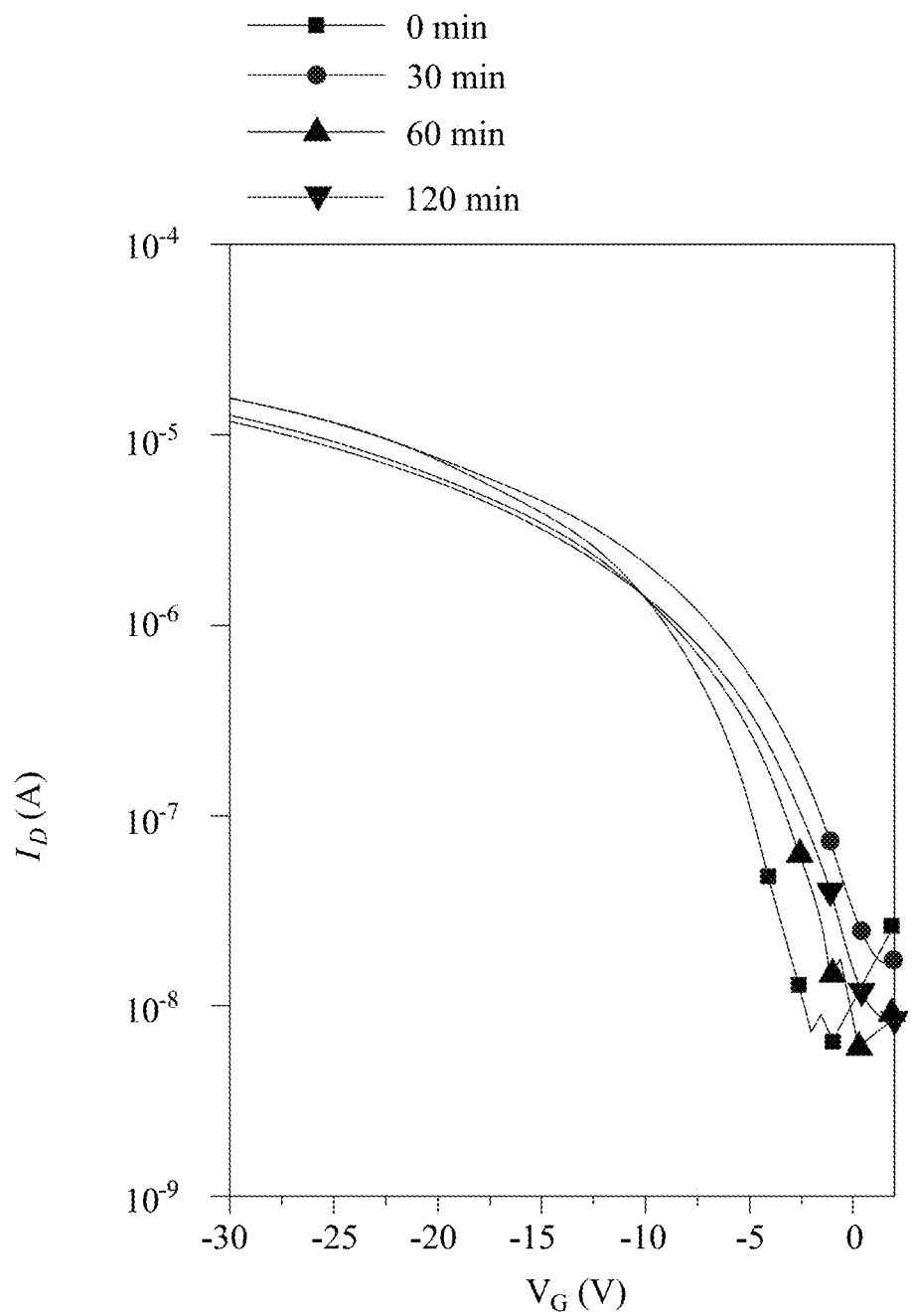
Figure 22C:
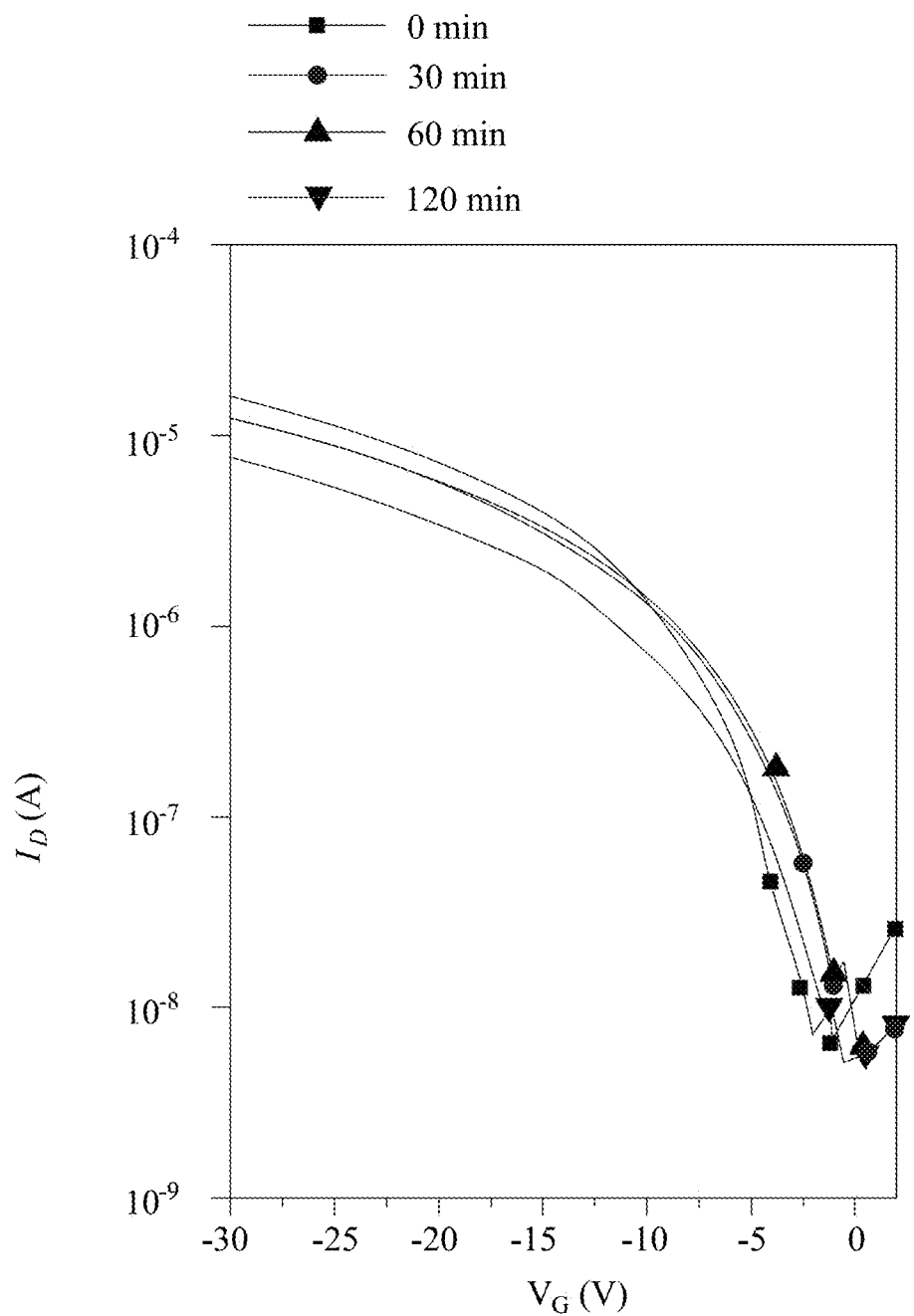

The thermal stability of the all-polymer based device was characterized and the corresponding FET transfer curves are in FIGS. 21 and 22. The device was baked at elevated temperature of 80° C., 120° C., 160° C., and 200° C., respectively. The FET characteristics are summarized in FIG. 21c and Table 4. As shown in the figure, the corresponding $\mu_{hs}$ are almost the same after heating at 80° C., 120° C. and 160° C. for 2 h, and the $\mu_h$ only slightly decreases after heating at 200° C. for 2 h. Besides, the device exhibits gradually increasing $\mu_h$ (from 0.35 to 0.36 cm$^2$ V$^{-1}$ s$^{-1}$) without performance decay after heating up to 80° C. for 1 h, which is probably attributed to the better solid-state stacking of the semiconducting layer after thermal annealing. Furthermore, the transfer characteristic showed no significant hysteresis after heating at 200° C. for 2 h (FIG. 18a), specifying the stable OFET performance under thermal stability test. The high dimensional stability of the prepared PI-based copolymer substrate plays an important role in preventing out-of-plane wrinkling and maintaining performance upon heating at 200° C. These results indicate that the fabricated flexible transistor with the PI-based copolymer substrate having low CTE exhibits excellent thermal stability and mechanical endurance for the practical application in flexible electronics.

TABLE 4

The FET characteristics measured under various thermal treatments to fabricated devices.

| Heating temperature | pristine | | | 30 min | | |
|---|---|---|---|---|---|---|
| | $\mu_h{}^a$ | $I_{on}/I_{off}{}^b$ | $V_{TH}{}^c$ | $\mu_h{}^a$ | $I_{on}/I_{off}{}^b$ | $V_{TH}{}^c$ |
| 80° C. | 0.35 | 2.4 × 10$^3$ | −2.4 | 0.36 | 2.2 × 10$^3$ | −1.9 |
| 120° C. | | | | 0.31 | 9.5 × 10$^2$ | −0.5 |
| 160° C. | | | | 0.25 | 2.1 × 10$^3$ | −0.7 |
| 200° C. | | | | 0.19 | 1.5 × 10$^3$ | 0.1 |
| Heating temperature | 60 min | | | 120 min | | |
| | $\mu_h{}^a$ | $I_{on}/I_{off}{}^b$ | $V_{TH}{}^c$ | $\mu_h{}^a$ | $I_{on}/I_{off}{}^b$ | $V_{TH}{}^c$ |
| 80° C. | 0.36 | 2.0 × 10$^3$ | −1.1 | 0.32 | 9.8 × 10$^2$ | 0.4 |
| 120° C. | 0.26 | 2.1 × 10$^3$ | −0.7 | 0.24 | 1.4 × 10$^3$ | 0.1 |
| 160° C. | 0.22 | 2.2 × 10$^3$ | −1.2 | 0.18 | 1.5 × 10$^3$ | −1.2 |
| 200° C. | 0.15 | 1.2 × 10$^3$ | 0.3 | 0.12 | 9.7 × 10$^2$ | 0.3 |

$^a$Unit of charge mobility, $\mu_h$, is cm$^2$ V$^{-1}$ s$^{-1}$.
$^b$Unit of on/off current ratio, $I_{on}/I_{off}$, is dimensionless.
$^c$Unit of threshold voltage, $V_{TH}$, is V.

C. Conclusion

The embodiment and various tests have verified that we have successfully developed three series of PI-based copolymers with high thermal-mechanical properties from aromatic dianhydrides and three kinds of diamines containing double-strand heterocyclic rings including ether (—O—) and/or thioether (—S—) linkages. These PI-based copolymers showed very high $T_d$ over 500° C. and $T_g$ higher than 400° C. The $T_g$ values of PIs increased with increasing in the dihedral angle of diamines, which was attributed to the increase in chain stiffness and densification in polymer chain arrangement. Furthermore, the CTEs of PI(OODA-PMDA) and PI(OODA-BPDA) were as low as 7.0 and 11 ppm K$^{-1}$, respectively, due to the higher coplanarity of the backbone leading to the constrained chain motion at a high temperature. Furthermore, because of the chemical structure that prevents hydrogen from bonding with water molecules, the PI-based copolymer of the present invention has a low water absorption around 0.9%. The co-PI of the embodiment (take PI(OODA-P5B5) as an example) exhibited a high glass transition temperature (not clearly observed until 400° C.) and a thermal decomposition temperature (538° C.), an extremely low CTE (5.5 ppm/K), and good mechanical durability (UTS of 131 MPa, $\varepsilon_h$ of 3.8%, and E of 3.48), to meet the requirements of flexible substrate for OFET. The all-polymer based transistor using the PI(OODA-P5B5) substrate exhibited the $\mu_h$ of 0.35 cm$^2$ V$^{-1}$ s$^{-1}$, high on/off current ratio of 2.4×10$^3$ and small $V_{TH}$ of −2.4 V, which was compatible to that using the silicon wafer. In addition, the performance of the electronic device of the embodiment was in a comparable level even after being baked at 200° C. for 2 h or after 1000 cycles of bending tests, which indicates that the flexible electronic device disclosed herein has high feasibility and potential in practical applications.

In summary, the present invention provides a novel polyimide-based material that can be used as a flexible substrate for electronic components/products and organic field effect transistors, which is prepared by the polycondensation of dianhydride and heterocyclic diamine. The polyimide-based material of the invention can be made into a flexible and tough polyimide film with a CTE as low as 7.3 ppm K$^{-1}$. In addition, the CTE of PI(OODA-PmBn) copolymer prepared by PMDA and BPDA and OODA is extremely low (for example, the CTE of PI(OODA-P5B5) is 5.5 ppm K$^{-1}$); and $T_g$ is not observed at temperatures up to 400° C., which is attributed to proper chain rigidity and polymer chain packing, thereby achieving better in-plane orientation. The organic field effect transistor of the invention exhibits compatible and stable device performance even after being baked at 200° C. for 2 h or 1000 bending cycles. In summary, the novel polyimide with excellent thermal-mechanical stability of the invention has potential application prospects and can be used as a substrate for flexible electronics.

The present invention is explained in more detail with preferred exemplary embodiments above. Although exemplary embodiments have been disclosed herein, it should be understood that other changes are also possible, and such changes should not be regarded as departing from the spirit and scope of the exemplary embodiments of the present application, and all modifications obvious to those skilled in the art are still included in the scope of the appended claims.

What is claimed is:

1. A polyimide-based copolymer, including a copolymer of dianhydride and heterocyclic diamine, wherein the heterocyclic diamine has two benzene rings, and there are two ether bonds, two thioether bonds, or one ether bond and one thioether bond between the two benzene rings, wherein the polyimide-based copolymer has a structure of formula (I):

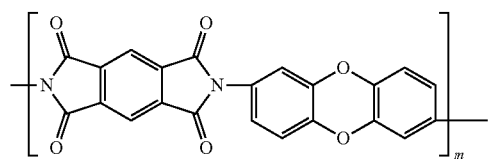

(I)

-continued

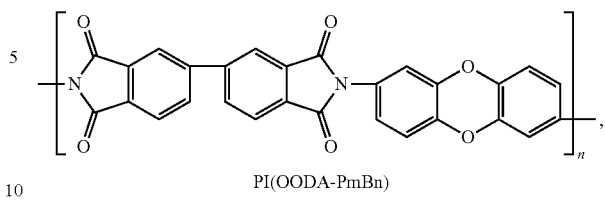

PI(OODA-PmBn)

wherein m and n each independently represent the number of moles, and the molar ratio of m:n is 7:3 to 3:7.

2. An electronic device comprising the polyimide-based copolymer according to claim 1 as a dielectric and/or a flexible substrate.

3. A field effect transistor, including the polyimide-based copolymer according to claim 1 as a dielectric and/or a flexible substrate.

4. The field effect transistor of claim 3, further comprising a source, a drain, an active layer, and a gate, and has a bottom-gate-top-contact (BGTC) configuration.

* * * * *